US008058639B2

(12) United States Patent
Inoue et al.

(10) Patent No.: US 8,058,639 B2
(45) Date of Patent: Nov. 15, 2011

(54) NITRIDE SEMICONDUCTOR ELEMENT AND METHOD FOR PRODUCTION THEREOF

(75) Inventors: Akira Inoue, Osaka (JP); Masaki Fujikane, Osaka (JP); Toshiya Yokogawa, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/125,367

(22) PCT Filed: Apr. 5, 2010

(86) PCT No.: PCT/JP2010/002465
§ 371 (c)(1),
(2), (4) Date: Apr. 21, 2011

(87) PCT Pub. No.: WO2010/116703
PCT Pub. Date: Oct. 14, 2010

(65) Prior Publication Data
US 2011/0198568 A1    Aug. 18, 2011

(30) Foreign Application Priority Data

Apr. 6, 2009 (JP) ................................. 2009-092001

(51) Int. Cl.
| H01L 29/06 | (2006.01) |
| H01L 31/0328 | (2006.01) |
| H01L 31/0336 | (2006.01) |
| H01L 31/072 | (2006.01) |
| H01L 31/109 | (2006.01) |
| H01L 27/15 | (2006.01) |
| H01L 29/26 | (2006.01) |
| H01L 31/12 | (2006.01) |
| H01L 33/00 | (2010.01) |
| H01L 29/22 | (2006.01) |
| H01L 29/24 | (2006.01) |
| H01L 23/48 | (2006.01) |
| H01L 23/52 | (2006.01) |
| H01L 29/40 | (2006.01) |
| H01L 21/00 | (2006.01) |

(52) U.S. Cl. ............... 257/13; 257/79; 257/94; 257/99; 257/103; 257/778; 257/E21.499; 257/E21.503; 257/E21.511; 257/E21.518; 257/E33.001; 257/E33.056; 257/E33.057; 438/51

(58) Field of Classification Search .................. 257/13, 257/79, 94, 99, 103, 778, E21.499, E21.503, 257/E21.511, E21.518, E33.001, E33.056, 257/E33.057; 438/51
See application file for complete search history.

(56) References Cited

U.S. PATENT DOCUMENTS
6,287,947 B1    9/2001    Ludowise et al. ............. 438/606
(Continued)

FOREIGN PATENT DOCUMENTS
EP    2 226 853 A1    9/2010
(Continued)

OTHER PUBLICATIONS

Notice of Reasons for Rejection mailed Oct. 12, 2010 for Japanese Patent Application No. 2010-532359 which is a national phase application of PCT/JP2010/002465 and a full English translation.

(Continued)

*Primary Examiner* — Ida M Soward
(74) *Attorney, Agent, or Firm* — Renner, Otto, Boisselle & Sklar, LLP

(57) ABSTRACT

A light-emitting apparatus of the present invention includes: a mounting base 260 which has a wire 265; and a nitride-based semiconductor light-emitting device flip-chip mounted on the mounting base 260. The nitride-based semiconductor light-emitting device 100 includes a GaN-based substrate 10 which has an m-plane surface 12, a semiconductor multilayer structure 20 provided on the m-plane surface 12 of the GaN-based substrate 10, and an electrode 30 provided on the semiconductor multilayer structure 20. The electrode 30 includes an Mg layer 32. The Mg layer 32 is in contact with the surface of the p-type semiconductor region of the semiconductor multilayer structure 20. The electrode 30 is coupled to the wire 265.

26 Claims, 29 Drawing Sheets

U.S. PATENT DOCUMENTS

| | | | |
|---|---|---|---|
| 7,026,663 B2* | 4/2006 | Krames et al. | 257/103 |
| 7,087,936 B2* | 8/2006 | Negley | 257/98 |
| 7,157,294 B2* | 1/2007 | Uemura et al. | 438/27 |
| 7,547,908 B2* | 6/2009 | Grillot et al. | 257/11 |
| 2004/0119077 A1* | 6/2004 | Misra et al. | 257/79 |
| 2006/0081869 A1* | 4/2006 | Lu et al. | 257/99 |
| 2006/0284205 A1* | 12/2006 | Liu | 257/98 |
| 2008/0230766 A1 | 9/2008 | Okamoto et al. | 257/13 |
| 2009/0045416 A1* | 2/2009 | Bierhuizen et al. | 257/88 |
| 2009/0085048 A1 | 4/2009 | Lee et al. | 257/89 |
| 2010/0108985 A1* | 5/2010 | Chung et al. | 257/13 |
| 2010/0109025 A1* | 5/2010 | Bhat | 257/88 |
| 2010/0275837 A1* | 11/2010 | Hashimoto et al. | 117/101 |
| 2010/0308357 A1* | 12/2010 | Horie et al. | 257/98 |
| 2011/0140125 A1* | 6/2011 | Lin et al. | 257/76 |

FOREIGN PATENT DOCUMENTS

| | | |
|---|---|---|
| JP | 07-283436 A | 10/1995 |
| JP | 08-064871 A | 3/1996 |
| JP | 10-084159 A | 3/1998 |
| JP | 11-040846 A | 2/1999 |
| JP | 11-191641 A | 7/1999 |
| JP | 2001-007398 A | 1/2001 |
| JP | 2001-160656 A | 6/2001 |
| JP | 2001-308462 A | 11/2001 |
| JP | 2003-332697 A | 11/2003 |
| JP | 2008-153285 A | 7/2008 |
| JP | 2008-235804 A | 10/2008 |
| JP | 2008-300638 A | 12/2008 |
| JP | 4486701 B | 4/2010 |

OTHER PUBLICATIONS

International Search Report for corresponding International Application No. PCT/JP2010/002465 mailed Jul. 13, 2010.

Form PCT/ISA/237 for International Application No. PCT/JP2010/002465 dated Jul. 13, 2010.

International Search Report for International Application No. PCT/JP2010/002013 mailed Apr. 20, 2010.

Form PCT/ISA/237 for International Application No. PCT/JP2010/002013 dated Apr. 20, 2010 and English translation.

* cited by examiner (a)

| | as-depo | 500°C | 600°C | 700°C |
|---|---|---|---|---|
| M-GaN (Mg/Pt) | | | | |
| M-GaN (Pd/Pt) | | | | |
| C-GaN (Pd/Pt) | | | | |

(a)

(b)

(c)

(a)

(b)

(c)

NITRIDE SEMICONDUCTOR ELEMENT AND METHOD FOR PRODUCTION THEREOF

TECHNICAL FIELD

The present invention relates to a nitride-based semiconductor device and a method for fabricating such a device. More particularly, the present invention relates to a GaN-based semiconductor light-emitting device such as a light-emitting diode or a laser diode that operates at wavelengths over the ultraviolet range and the entire visible radiation range, which covers blue, green, orange and white parts of the spectrum. Such a light-emitting device is expected to be applied to various fields of technologies including display, illumination and optical information processing in the near future. The present invention also relates to a method of making an electrode for use in such a nitride-based semiconductor device.

BACKGROUND ART

A nitride semiconductor including nitrogen (N) as a Group V element is a prime candidate for a material to make a short-wave light-emitting device because its bandgap is sufficiently wide. Among other things, gallium nitride-based compound semiconductors (which will be referred to herein as "GaN-based semiconductors" and which are represented by the formula $Al_xGa_yIn_zN$ (where $0 \leq x, y, z \leq 1$ and $x+y+z=1$)) have been researched and developed particularly extensively. As a result, blue light-emitting diodes (LEDs), green LEDs, and semiconductor laser diodes made of GaN-based semiconductors have already been used in actual products (see Patent Documents 1 and 2, for example).

A GaN-based semiconductor has a wurtzite crystal structure. FIG. 1 schematically illustrates a unit cell of GaN. In an $Al_xGa_yIn_zN$ (where $0 \leq x, y, z \leq 1$ and $x+y+z=1$) semiconductor crystal, some of the Ga atoms shown in FIG. 1 may be replaced with Al and/or In atoms.

FIG. 2 shows four primitive vectors $a_1$, $a_2$, $a_3$ and c, which are generally used to represent planes of a wurtzite crystal structure with four indices (i.e., hexagonal indices). The primitive vector c runs in the [0001] direction, which is called a "c-axis". A plane that intersects with the c-axis at right angles is called either a "c-plane" or a "(0001) plane". It should be noted that the "c-axis" and the "c-plane" are sometimes referred to as "C-axis" and "C-plane".

In fabricating a semiconductor device using GaN-based semiconductors, a c-plane substrate, i.e., a substrate of which the principal surface is a (0001) plane, is used as a substrate on which GaN semiconductor crystals will be grown. In a c-plane, however, there is a slight shift in the c-axis direction between a Ga atom layer and a nitrogen atom layer, thus producing electrical polarization there. That is why the c-plane is also called a "polar plane". As a result of the electrical polarization, a piezoelectric field is generated in the InGaN quantum well of the active layer in the c-axis direction. Once such a piezoelectric field has been generated in the active layer, some positional deviation occurs in the distributions of electrons and holes in the active layer due to the quantum confinement Stark effect of carriers. Consequently, the internal quantum yield decreases. Thus, in the case of a semiconductor laser diode, the threshold current increases. In the case of an LED, the power dissipation increases, and the luminous efficacy decreases. Meanwhile, as the density of injected carriers increases, the piezoelectric field is screened, thus varying the emission wavelength, too.

Thus, to overcome these problems, it has been proposed that a substrate of which the principal surface is a non-polar plane such as a (10-10) plane that is perpendicular to the [10-10] direction and that is called an "m-plane" (m-plane GaN-based substrate) be used. As used herein, "-" attached on the left-hand side of a Miller-Bravais index in the parentheses means a "bar" (a negative direction index). As shown in FIG. 2, the m-plane is parallel to the c-axis (i.e., the primitive translation vector $a_3$) and intersects with the c-plane at right angles. On the m-plane, Ga atoms and nitrogen atoms are on the same atomic-plane. For that reason, no electrical polarization will be produced perpendicularly to the m-plane. That is why if a semiconductor multilayer structure is formed perpendicularly to the m-plane, no piezoelectric field will be generated in the active layer, thus overcoming the problems described above.

The "m-plane" is a generic term that collectively refers to a family of planes including (10-10), (-1010), (1-100), (-1100), (01-10) and (0-110) planes. As used herein, the "X-plane growth" means epitaxial growth that is produced perpendicularly to the X plane (where X=c or m) of a hexagonal wurtzite structure. As for the X-plane growth, the X plane will be sometimes referred to herein as a "growing plane". A layer of semiconductor crystals that have been formed as a result of the X-plane growth will be sometimes referred to herein as an "X-plane semiconductor layer".

CITATION LIST

Patent Literature

Patent Document 1: Japanese Laid-Open Patent Publication No. 2001-308462
Patent Document 2: Japanese Laid-Open Patent Publication No. 2003-332697
Patent Document 3: Japanese Laid-Open Patent Publication No. 8-64871
Patent Document 4: Japanese Laid-Open Patent Publication No. 11-40846

SUMMARY OF INVENTION

Technical Problem

As described above, a GaN-based semiconductor device that has been grown on an m-plane substrate would achieve far more beneficial effects than what has been grown on a c-plane substrate but still has the following drawback. Specifically, a GaN-based semiconductor device that has been grown on an m-plane substrate has higher contact resistance than what has been grown on a c-plane substrate, which constitutes a serious technical obstacle to using such a GaN-based semiconductor device that has been grown on an m-plane substrate.

When a nitride semiconductor light-emitting device is flip-chip mounted, there is a problem of occurrence of emission unevenness due to mounting stress. As will be described later, the present inventors conducted researches and found that a GaN-based semiconductor device grown on an m-plane substrate is particularly susceptible to mounting stress.

Under the circumstances such as these, the present inventors wholeheartedly carried out extensive research to overcome such a problem with the prior art that a GaN-based semiconductor device, grown on an m-plane as a non-polar plane, would have high contact resistance. As a result, we found an effective means for reducing the contact resistance and the mounting stress.

The present invention was conceived in view of the above circumstances. The major objects of the present invention are to reduce the contact resistance in a nitride-based semiconductor light-emitting device fabricated by means of m-plane growth and to provide a light-emitting apparatus in which degradation by flip-chip mounting is prevented.

Solution to Problem

The first light-emitting apparatus of the present invention includes: a mounting base which has a wire; and a nitride-based semiconductor light-emitting device flip-chip mounted on the mounting base, wherein the nitride-based semiconductor light-emitting device includes a nitride-based semiconductor multilayer structure which has a p-type semiconductor region having an m-plane surface, and an electrode provided on the p-type semiconductor region, the p-type semiconductor region is made of an $Al_xIn_yGa_zN$ semiconductor ($x+y+z=1$, $x \geq 0$, $y \geq 0$, $z \geq 0$), the electrode includes an Mg layer which is in contact with the surface of the p-type semiconductor region, and the electrode is coupled to the wire.

In one embodiment, the electrode includes a metal layer provided on the Mg layer.

In one embodiment, the metal layer is made of at least one metal selected from the group consisting of Pt, Mo, Pd, and Ag.

In one embodiment, an Mg alloy layer is provided between the Mg layer and the metal layer.

In one embodiment, the Mg layer has a thickness of 15 nm to 45 nm.

In one embodiment, the electrode includes a first metal layer provided on the Mg layer, a second Mg layer provided on the first metal layer, and a second metal layer provided on the second Mg layer.

In one embodiment, the first metal layer is made of at least one metal selected from the group consisting of Pt, Mo, Pd, and Ag, and the second metal layer is made of at least one metal selected from the group consisting of Pt, Mo, Pd, and Ag.

In one embodiment, the second Mg layer has a thickness of 15 nm or greater.

In one embodiment, the Mg layer has a thickness of 2 nm to 15 nm.

A nitride-based semiconductor light-emitting device of the present invention is a nitride-based semiconductor light-emitting device for use in the light-emitting apparatus of the present invention, including: a nitride-based semiconductor multilayer structure which has a p-type semiconductor region having an m-plane surface, and an electrode provided on the p-type semiconductor region, wherein the p-type semiconductor region is made of an $Al_xIn_yGa_zN$ semiconductor ($x+y+z=1$, $x \geq 0$, $y \geq 0$, $z \geq 0$), and the electrode includes an Mg layer which is in contact with the surface of the p-type semiconductor region, the Mg layer having a thickness of 15 nm or greater.

In one embodiment, the electrode includes a metal layer provided on the Mg layer.

In one embodiment, the electrode includes a first metal layer provided on the Mg layer, a second Mg layer provided on the first metal layer, and a second metal layer provided on the second Mg layer.

A light-emitting apparatus fabrication method of the present invention includes the steps of: (A) preparing a mounting base which has a wire; and (B) mounting a nitride-based semiconductor light-emitting device on the mounting base, wherein the nitride-based semiconductor light-emitting device includes a nitride-based semiconductor multilayer structure which has a p-type semiconductor region having an m-plane surface, and an electrode provided on the p-type semiconductor region, the p-type semiconductor region is made of an $Al_xIn_yGa_zN$ semiconductor ($x+y+z=1$, $x \geq 0$, $y \geq 0$, $z \geq 0$), the electrode includes an Mg layer which is in contact with the surface of the p-type semiconductor region, and step (B) includes pressing the electrode of the nitride-based semiconductor light-emitting device against the wire of the mounting base while applying an ultrasonic wave to the nitride-based semiconductor light-emitting device such that the nitride-based semiconductor light-emitting device is secured onto the mounting base.

The second light-emitting apparatus of the present invention includes: a mounting base which has a wire; and a nitride-based semiconductor light-emitting device flip-chip mounted on the mounting base, wherein the nitride-based semiconductor light-emitting device includes a nitride-based semiconductor multilayer structure which has a p-type semiconductor region having an m-plane surface, and an electrode provided on the p-type semiconductor region, the p-type semiconductor region is made of an $Al_xIn_yGa_zN$ semiconductor ($x+y+z=1$, $x \geq 0$, $y \geq 0$, $z \geq 0$), the electrode includes an Mg alloy layer which is in contact with the surface of the p-type semiconductor region, and the electrode is coupled to the wire.

In one embodiment, the electrode includes a metal layer provided on the Mg alloy layer.

In one embodiment, the metal layer is made of at least one metal selected from the group consisting of Pt, Mo, Pd, and Ag.

In one embodiment, the electrode is formed only by an Mg alloy layer.

In one embodiment, the Mg alloy layer is made of an alloy of Mg and at least one metal selected from the group consisting of Pt, Mo, Pd, and Ag.

The third light-emitting apparatus of the present invention includes: a mounting base which has a wire; and a nitride-based semiconductor light-emitting device flip-chip mounted on the mounting base, wherein the nitride-based semiconductor light-emitting device includes a nitride-based semiconductor multilayer structure which has a p-type semiconductor region, and an electrode provided on the p-type semiconductor region, the p-type semiconductor region is made of an $Al_xIn_yGa_zN$ semiconductor ($x+y+z=1$, $x \geq 0$, $y \geq 0$, $z \geq 0$), an angle between a normal to a principal surface of the p-type semiconductor region and a normal to an m-plane is from 1° to 5°, the electrode includes an Mg layer which is in contact with the surface of the p-type semiconductor region, and the electrode is coupled to the wire.

In one embodiment, the electrode includes a metal layer provided on the Mg layer.

In one embodiment, the metal layer is made of at least one metal selected from the group consisting of Pt, Mo, Pd, and Ag.

The fourth light-emitting apparatus of the present invention includes: a mounting base which has a wire; and a nitride-based semiconductor light-emitting device flip-chip mounted on the mounting base, wherein the nitride-based semiconductor light-emitting device includes a nitride-based semiconductor multilayer structure which has a p-type semiconductor region, and an electrode provided on the p-type semiconductor region, the p-type semiconductor region is made of an $Al_xIn_yGa_zN$ semiconductor ($x+y+z=1$, $x \geq 0$, $y \geq 0$, $z \geq 0$), an angle between a normal to a principal surface of the p-type semiconductor region and a normal to an m-plane is from 1° to 5°, the electrode includes an Mg alloy layer which is in contact with the surface of the p-type semiconductor region, and the electrode is coupled to the wire.

In one embodiment, the electrode includes a metal layer provided on the Mg alloy layer.

In one embodiment, the metal layer is made of at least one metal selected from the group consisting of Pt, Mo, Pd, and Ag.

In one embodiment, the electrode is formed only by an Mg alloy layer.

In one embodiment, the Mg alloy layer is made of an alloy of Mg and at least one metal selected from the group consisting of Pt, Mo, Pd, and Ag.

Advantageous Effects of Invention

In a light-emitting apparatus according to the present invention, an electrode on a semiconductor multilayer structure included in a nitride-based semiconductor device that is to be mounted on a mounting base includes an Mg layer, and the Mg layer is in contact with a surface (m-plane) of a p-type semiconductor region, so that the contact resistance can be reduced.

The present invention is capable of solving a problem of mounting stress which may occur when a nitride-based semiconductor light-emitting device is flip-chip mounted. Thus, a light-emitting device with reduced emission unevenness and variations can be realized.

According to the present invention, even when the electrode on the semiconductor multilayer structure includes an Mg alloy layer and the Mg alloy layer is in contact with the surface (m-plane) of the p-type semiconductor region, the same effects as those obtained when the Mg layer is in contact with the surface of the p-type semiconductor region can be provided.

According to the present invention, even when using a p-type gallium nitride-based compound semiconductor layer whose principal surface is inclined from the m-plane by an angle of 1° to 5°, the same effects as those obtained when an m-plane p-type gallium nitride-based compound semiconductor layer (a p-type gallium nitride-based compound semiconductor layer whose principal surface is inclined from the m-plane by an angle smaller than 1°) can be provided.

BRIEF DESCRIPTION OF DRAWINGS

FIG. 9 shows optical microscope photographs representing the surface states of an electrode that was thermally treated at respective temperatures as a substitute for a drawing.

FIG. 21($b$) is a perspective view illustrating the relationship among the normal to the m-plane, the +c-axis direction, and the a-axis direction.

DESCRIPTION OF EMBODIMENTS

Figure 1:
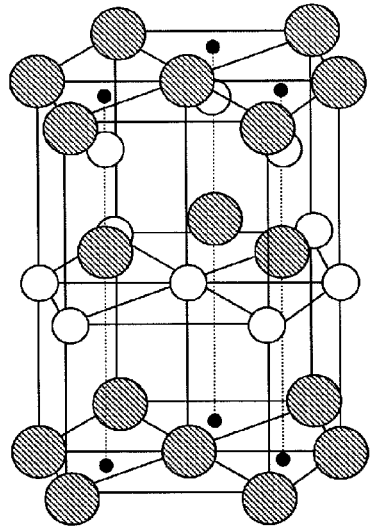
FIG. 1 is a perspective view schematically illustrating a unit cell of GaN.
Figure 1:
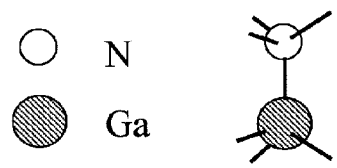

In this specification, a nitride semiconductor light-emitting device which is to be mounted on a mounting base is first described in detail, and then, a light-emitting apparatus which includes a mounted nitride semiconductor light-emitting device is described.

Hereinafter, preferred embodiments of the present invention will be described with reference to the accompanying drawings. In the drawings, any elements shown in multiple drawings and having substantially the same function will be identified by the same reference numeral for the sake of simplicity. It should be noted, however, that the present invention is in no way limited to the specific preferred embodiments to be described below.

FIG. 3(a) schematically illustrates the cross-sectional structure of a nitride-based semiconductor light-emitting device 100 as a preferred embodiment of the present invention. What is illustrated in FIG. 3(a) is a semiconductor device made of GaN semiconductors and has a nitride-based semiconductor multilayer structure.

The nitride-based semiconductor light-emitting device 100 of this preferred embodiment includes a GaN-based substrate 10, of which the principal surface 12 is an m-plane, a semiconductor multilayer structure 20 that has been formed on the GaN-based substrate 10, and an electrode 30 arranged on the semiconductor multilayer structure 20. In this preferred embodiment, the semiconductor multilayer structure 20 is an m-plane semiconductor multilayer structure that has been formed through an m-plane crystal growth and its principal surface is an m-plane. It should be noted, however, that a-plane GaN could grow on an r-plane sapphire substrate in some instances. That is why according to the growth conditions, the principal surface of the GaN-based substrate 10 does not always have to be an m-plane. In the semiconductor multilayer structure 20 of the present invention, at least the surface of its p-type semiconductor region that is in contact with an electrode needs to be an m-plane.

The nitride-based semiconductor light-emitting device 100 of this preferred embodiment includes the GaN-based substrate 10 to support the semiconductor multilayer structure 20. However, the device 100 may have any other substrate instead of the GaN-based substrate 10 and could also be used without the substrate.

FIG. 3(b) schematically illustrates the crystal structure of a nitride-based semiconductor, of which the principal surface is an m-plane, as viewed on a cross section thereof that intersects with the principal surface of the substrate at right angles. Since Ga atoms and nitrogen atoms are present on the same atomic-plane that is parallel to the m-plane, no electrical polarization will be produced perpendicularly to the m-plane. That is to say, the m-plane is a non-polar plane and no piezo-elecrtric field will be produced in an active layer that grows perpendicularly to the m-plane. It should be noted that In and Al atoms that have been added will be located at Ga sites and will replace the Ga atoms. Even if at least some of the Ga atoms are replaced with those In or Al atoms, no electrical polarization will still be produced perpendicularly to the m-plane.

Such a GaN-based substrate, of which the principal surface is an m-plane, will be referred to herein as an "m-plane GaN-based substrate". To obtain an m-plane nitride-based semiconductor multilayer structure that has grown perpendicularly to the m-plane, typically such an m-plane GaN-based substrate may be used and semiconductors may be grown on the m-plane of that substrate. This is because the crystallographic-plane orientation of the semiconductor multilayer structure should be identical with that of the principal surface of the GaN-based substrate. However, the principal surface of the substrate does not always have to be an m-plane as described above, and the device as a final product could already have its substrate removed.

The crystal structure of a nitride-based semiconductor, of which the principal surface is a c-plane, as viewed on a cross section thereof that intersects with the principal surface of the substrate at right angles is illustrated schematically in FIG. 3(c) just for a reference. In this case, Ga atoms and nitrogen atoms are not present on the same atomic-plane, and therefore, electrical polarization will be produced perpendicularly to the c-plane. Such a GaN-based substrate, of which the principal surface is a c-plane, will be referred to herein as a "c-plane GaN-based substrate".

A c-plane GaN-based substrate is generally used to grow GaN-based semiconductor crystals thereon. In such a substrate, a Ga atom layer and a nitrogen atom layer that extend parallel to the c-plane are slightly misaligned from each other in the c-axis direction, and therefore, electrical polarization will be produced in the c-axis direction.

Referring to FIG. 3(a) again, on the principal surface (that is an m-plane) 12 of the m-plane GaN-based substrate 10, the semiconductor multilayer structure 20 is formed. The semiconductor multilayer structure 20 includes an active layer 24 including an $Al_aIn_bGa_cN$ layer (where a+b+c=1, a≧0, b≧0 and c≧0), and an $Al_dGa_eN$ layer (where d+e=1, d≧0 and e≧0) 26, which is located on the other side of the active layer 24 opposite to the m-plane 12. In this embodiment, the active layer 24 is an electron injection region of the nitride-based semiconductor light-emitting device 100.

The semiconductor multilayer structure 20 of this preferred embodiment has other layers, one of which is an $Al_uGa_vIn_wN$ layer (where u+v+w=1, u≧0, v≧0 and w≧0) 22 that is arranged between the active layer 24 and the substrate 10. The $Al_uGa_vIn_wN$ layer 22 of this preferred embodiment has first conductivity type, which may be n-type, for example. Optionally, an undoped GaN layer could be inserted between the active layer 24 and the $Al_dGa_eN$ layer 26.

In the $Al_dGa_eN$ layer 26, the mole fraction d of Al does not have to be uniform, but could vary either continuously or stepwise, in the thickness direction. In other words, the $Al_dGa_eN$ layer 26 could have a multilayer structure in which a number of layers with mutually different Al mole fractions d are stacked one upon the other, or could have its dopant concentration varied in the thickness direction. To reduce the contact resistance, the uppermost portion of the $Al_dGa_eN$ layer 26 (i.e., the upper surface region of the semiconductor multilayer structure 20) is preferably a layer that has an Al mole fraction d of zero (i.e., a GaN layer). In that case, the Mg layer 32 to be described later will be in contact with the GaN layer. However, the Al mole fraction d does not have to be zero. Alternatively, an $Al_{0.05}Ga_{0.95}N$ layer, of which the Al mole fraction d is approximately 0.05, could also be used. Then, the Mg layer 32 to be described later will be in contact with that $Al_{0.05}Ga_{0.95}N$ layer.

An electrode 30 has been formed on the semiconductor multilayer structure 20. The electrode 30 of this preferred embodiment includes an Mg layer 32 consisting essentially of Mg, on which stacked is a Pt layer consisting essentially of Pt. In the electrode 30, the Mg layer 32 is in contact with the p-type semiconductor region of the semiconductor multilayer structure 20 and functions as a portion of a p-(or p-side) electrode. In this preferred embodiment, the Mg layer 32 is in contact with the $Al_dGa_eN$ layer 26 that is doped with a dopant of a second conductivity type (e.g., p-type), which may be Mg. Examples of other preferred p-type dopants include Zn and Be.

The metal layer 34 that is in contact with the surface of the Mg layer 32 does not have to be a Pt layer but may also be a layer of a metal that would make an alloy with Mg less easily than Au. For example, at least one metal selected from the group consisting of Pt, Mo, Pd, and Ag may be used. Stated otherwise, the metal layer 34 to be in contact with the Mg layer 32 should not be made of Au (gold) that would make an alloy with Mg easily. The Mg layer 32 does not make an alloy with Pt or any other suitable metal that constitutes the metal layer 34. It should be noted, however, that "does not make an alloy with Pt or any other suitable metal" could also refer to a situation where Mg includes a metal such as Pt at a concentration of less than a few percent (which may be less than one percent). In other words, "make an alloy with a metal such as Pt" refers to a situation where Mg includes a metal such as Pt at a concentration of at least a few percent (which may be equal to or greater than one percent). The Mg layer 32 and the metal layer 34 could also contain some impurities to be inevitably included during the process steps of forming those layers.

Optionally, there could be a metal alloy layer containing Mg between the Mg layer 32 and the metal layer 34. Pt, Mo, Pd, and Ag are metals that would make an alloy with Mg less easily than Au. But a metal alloy layer could still be produced through a reaction to a portion of the Mg layer 32 as a result of the heat treatment to be described later.

If a relatively thin metal layer has been deposited on the Mg layer 32, then all of that thin metal layer could make an alloy with some of Mg atoms in the Mg layer. In that case, there would be only that metal alloy layer on the Mg layer.

In any case, on the electrode with any of various combinations of metals described above, not just the metal layer 34 or the metal alloy layer but also an electrode layer or an interconnect layer made of a different metal or metal alloy could be stacked.

In this preferred embodiment, the electrode 30 may have a thickness of 10 nm to 200 nm, for example. In the electrode 30, the Mg layer 32 may have a smaller thickness than the metal layer 34. The Mg layer 32 may have a thickness of, for example, 2 nm to 45 nm. It should be noted that in this case, the thickness of the Mg layer 32 is supposed to be that of the Mg layer that has already been thermally treated.

On the other hand, the metal layer 34, which is made of at least one metal selected from the group consisting of Pt, Mo, Pd, and Ag and which has been stacked on the Mg layer 32, may have a thickness of 200 nm or less (or fall within the range of 10 nm to 200 nm). It should be noted that the Mg layer 32 is preferably thinner than the metal layer 34. The reason why the Mg layer 32 is thinner than the metal layer 34 is that, if the strain balance were lost between the Mg layer 32 and the metal layer 34, the Mg layer 32 could peel off from the $Al_dGa_eN$ layer 26.

Meanwhile, the GaN-based substrate 10, of which the principal surface 12 is an m-plane, may have a thickness of 100 µm to 400 µm, for example. This is because if the wafer has a thickness of at least approximately 100 µm, then there will be no trouble handling such a wafer. It should be noted that as long as the substrate 10 of this preferred embodiment has an m-plane principal surface 12 made of a GaN-based material, the substrate 10 could have a multilayer structure. That is to say, the GaN-based substrate 10 of this preferred embodiment could also refer to a substrate, at least the principal surface 12 of which is an m-plane. That is why the entire substrate could be made of a GaN-based material. Or the substrate may also be made of the GaN-based material and another material in any combination.

In the structure of this preferred embodiment, an electrode 40 has been formed as an n-side electrode on a portion of an n-type $Al_uGa_vIn_wN$ layer 22 (with a thickness of 0.2 µm to 2 µm, for example). In the example illustrated in FIG. 3(a), in the region of the semiconductor multilayer structure 20 where the electrode 40 is arranged, a recess 42 has been cut so as to expose a portion of the n-type $Al_uGa_vIn_wN$ layer 22. And the electrode 40 has been formed on the exposed surface of the n-type $Al_uGa_vIn_wN$ layer 22 at the bottom of the recess 42. The electrode 40 may have a multilayer structure consisting of Ti, Al and Ti layers and may have a thickness of 100 nm to 200 nm, for example.

In this preferred embodiment, the active layer 24 has a GaInN/GaN multi-quantum well (MQW) structure (with a thickness of 81 nm, for example) in which $Ga_{0.9}In_{0.1}N$ well layers (each having a thickness of 9 nm, for example) and GaN barrier layers (each having a thickness of 9 nm, for example) are alternately stacked one upon the other.

On the active layer 24, stacked is the p-type $Al_dGa_eN$ layer 26, which may have a thickness of 0.2 µm to 2 µm. Optionally, an undoped GaN layer could be inserted between the active layer 24 and the $Al_dGa_eN$ layer 26 as described above.

In addition, a GaN layer of the second conductivity type (which may be p-type, for example) could be formed on the $Al_dGa_eN$ layer 26. Furthermore, a contact layer of $p^+$-GaN and the Mg layer 32 could be stacked in this order on that GaN layer. In that case, the GaN contact layer could also be regarded as forming part of the $Al_dGa_eN$ layer 26, not a layer that has been stacked separately from the $Al_dGa_eN$ layer 26.

Hereinafter, the features of this preferred embodiment will be described in further detail with reference to FIGS. 4 through 15.

First of all, FIGS. 4(a) and 4(b) are graphs showing how the specific contact resistance (Ω·cm$^2$) changes with the work function of the metal that is in contact with m-plane GaN. More specifically, the results shown in FIGS. 4(a) and 4(b) were obtained by forming various metal layers (consisting of an Mg layer with a thickness of 2 nm and the other metal layers with a thickness of 200 nm) on an Mg-doped p-type GaN layer (with an Mg concentration of approximately $1\times10^{19}$ cm$^{-3}$) and then estimating their contact resistances by TLM (transmission line method). It should be noted that the ordinates "1.0E-01" and "1.0E-02" mean "$1.0\times10^{-1}$" and "$1.0\times10^{-2}$", respectively. That is to say, "1.0E+X" means "$1.0\times10^X$".

Generally speaking, the contact resistance is inversely proportional to the area S (cm$^2$) of the contact. In this case, supposing R (Ω) is contact resistance, the equation R=Rc/S should be satisfied. The constant of proportionality Rc is called "specific contact resistance" and corresponds to contact resistance R when the contact area S is 1 cm$^2$. That is to say, the magnitude of the specific contact resistance does not depend on the contact area S and can be used as an index to evaluating the characteristics of a contact. In the following description, the "specific contact resistance" will sometimes be referred to herein as just "contact resistance".

Specifically, FIG. 4(a) shows the results that were obtained in a situation where the metal layer was just deposited and subjected to no heat treatment at all (i.e., in the case of "as-deposited"). On the other hand, FIG. 4(b) shows the results that were obtained in a situation where an Mg layer deposited was thermally treated at 600° C. for 10 minutes within a nitrogen ambient and in a situation where an Al, Au, Pd, Ni or Pt layer deposited was thermally treated at 500° C. for 10 minutes within the nitrogen ambient. This difference in temperature was caused because a non-Mg metal, having a different best heat treatment temperature from Mg, had the lowest contact resistance at 500° C.

As can be seen from FIG. 4(a), the greater the work function of the metal deposited, the lower the contact resistance tended to be. This result coincides with the fact that in a situation where a GaN-based semiconductor device is fabricated on a c-plane substrate, a metal with a large work function (such as Au) is generally used as a material to make a p-electrode.

On the other hand, as for results that were obtained by thermally treating the metal deposited, it can be seen from FIG. 4(b) that with Al, Au, Pd, Ni and Pt, the greater the work function of the metal deposited, the lower the contact resistance. Nevertheless, the present inventors also discovered that despite being a metal with a small work function, Mg still caused a steep decrease in contact resistance. FIG. 4(c) draws a dotted line on the graph shown in FIG. 4(b) to indicate the tendency of various metals other than Mg. In the prior art, people took it for granted that in a situation where no heat treatment was carried out, Mg, having the smallest work function among the metals tested, would have increased contact resistance. Contrary to such a popular misconception, the present inventors discovered that Mg did cause a steep decrease in contact resistance as a result of the heat treatment.

FIG. 5(a) is a graph showing the relationship between the specific contact resistance and the thickness of an Mg layer in an Mg/Pt electrode (in which a Pt layer was stacked on the Mg layer). In this case, the thickness of the Pt layer yet to be thermally treated was fixed at 75 nm. On the other hand, FIG. 5(b) is a graph showing the specific contact resistance of a Pd/Pt electrode (of which the Pd layer has a thickness of 40 nm and the Pt layer has a thickness of 35 nm) as a comparative example. In this graph, the ordinate represents the heat treatment temperature. The thicknesses of the metal layers other than the Mg layer were measured before the heat treatment.

The data shown in FIG. 5(a) were collected from samples in which the Mg layer was deposited by pulse evaporation process (to be described in detail later). On the other hand, the data shown in FIG. 5(b) were collected from samples in which the Pd or Pt layer was deposited by normal electron beam evaporation process. In every specific example of the present invention to be described herein later, the Mg layer was deposited by the pulse evaporation process. In this description, an Mg layer is also deposited on a c-plane GaN layer by the pulse evaporation process. However, every other non-Mg metal layer (such as a Pd, Pt, Au, or Ag layer) was deposited by normal electron beam evaporation process.

The Mg/Pt electrode and the Pd/Pt electrode are both in contact with the Mg-doped m-plane GaN layer. The m-plane GaN layer that is in contact with these electrodes is doped with $7\times10^{19}$ cm$^{-3}$ Mg to a depth of 20 nm as measured from the surface (i.e., the uppermost surface region with a thickness of 20 nm). On the other hand, the rest of the m-plane GaN layer, of which the depth exceeds 20 nm as measured from the surface, is doped with $1\times10^{19}$ cm$^{-3}$ Mg. If the concentration of the p-type dopant is locally increased in this manner in the uppermost surface region of the GaN layer that is in contact with the p-electrode, the contact resistance can be reduced to the lowest possible level. On top of that, by adopting such a doping scheme, the in-plane non-uniformity of the current-voltage characteristic can also be reduced. As a result, the variation in drive voltage between respective chips can also be reduced. That is why in every experimental example disclosed in this application, the surface region of the p-type GaN layer that is in contact with the electrode is doped with $7\times10^{19}$ cm$^{-3}$ Mg to a depth of 20 nm as measured from the surface, while the other deeper region is doped with $1\times10^{19}$ cm$^{-3}$ Mg. It should be noted that the contact resistance of Mg shown in FIG. 4(b) is higher than that of Mg shown in FIG. 5(a) because in the example shown in FIG. 4(b), the process of locally increasing the doping level of Mg in the surface region was not carried out.

In the graph shown in FIG. 5(a), the abscissa represents the thickness of the thermally treated Mg layer. As will be described later, according to the results of transmission electron microscopy, the thermally treated Mg layer had a decreased thickness compared to the Mg layer yet to be thermally treated. Specifically, an Mg layer that had had a thickness of 7 nm before being subjected to a heat treatment at 600° C. for 10 minutes had its thickness decreased to 2 nm after having been subjected to the heat treatment. In the same way, Mg layers that had had a thickness of 50 nm and a thickness of 20 nm before being subjected to the heat treatment at 600° C. for 10 minutes had their thickness decreased to 45 nm and 15 nm, respectively, after having been subjected to the heat treatment.

The graph of FIG. 5(a) shows the results of experiments that were carried out on samples that had been thermally treated at 600° C. for 10 minutes to show the correlation between the measured value of the contact resistance and the thickness of the Mg layer. The present inventors confirmed via experiments that the contact resistance tended to have a similar Mg layer thickness dependence even under any other heat treatment condition.

The results of experiments the present inventors carried out revealed that once the thickness of the Mg layer exceeded 45 nm, the contact resistance of the Mg/Pt electrode was approximately equal to that of the Pd/Pt electrode with respect to the m-plane GaN layer (shown in FIG. 5(b)). That is to say, no advantages over the prior art were achieved in that case. On the other hand, if the thickness of the Mg layer was equal to or smaller than 45 nm, the contact resistance of the Mg/Pt electrode on the m-plane GaN layer was lower that of the Pd/Pt electrode on the m-plane GaN layer as shown in FIG. 5(a), thus proving the superiority of the present invention over the prior art.

The present inventors confirmed that in a range where the Mg layer had a thickness of 45 nm or less, the thinner the Mg layer, the lower the contact resistance. When the Mg layer thickness decreased to the vicinity of 15 nm, the contact resistance started to drop steeply with the decrease in the thickness of the Mg layer. And when the Mg layer thickness was around 2 nm, the lowest possible contact resistance was achieved.

In view of these considerations, in the semiconductor device to be obtained as a final product by going through every manufacturing process step including the heat treatment, the Mg layer 32 preferably has a thickness of 45 nm or less, and more preferably falls within the range of 2 nm to 15 nm.

FIGS. 6(a) through 6(c) are photographs showing the surface states of a thermally treated electrode in situations where the Mg layer had thicknesses of 2 nm, 15 nm and 45 nm, respectively. In this case, the thickness of the Mg layer was measured after having been thermally treated at 600° C. for 10 minutes.

As shown in FIG. 6(c), in the sample of which the Mg layer had a thickness of 45 nm, some roughening (or unevenness) was observed on the surface of the electrode. Such roughening of the electrode's surface would be one of the factors that will cause an increase in contact resistance when the thickness of the Mg layer exceeds 45 nm. In addition, once the thickness of the Mg layer exceeded 45 nm, the Mg layer was seen to have locally raised portions. According to the results of transmission electron microscopy, such a phenomenon would have been brought about due to the creation of a gap between the Mg layer and the GaN layer. This is probably because once the thickness of the Mg layer exceeded 45 nm, the Mg layer got strained so much as to peel off from the interface between the Mg and GaN layers. For these reasons, the thickness of the Mg layer is preferably set to be 45 nm or less.

It should be noted that if the Mg layer had a thickness of approximately 15 nm or less, the surface of the electrode had an extremely high degree of planarity. That is why the Mg layer more preferably has a thickness of 15 nm or less.

Figure 7:
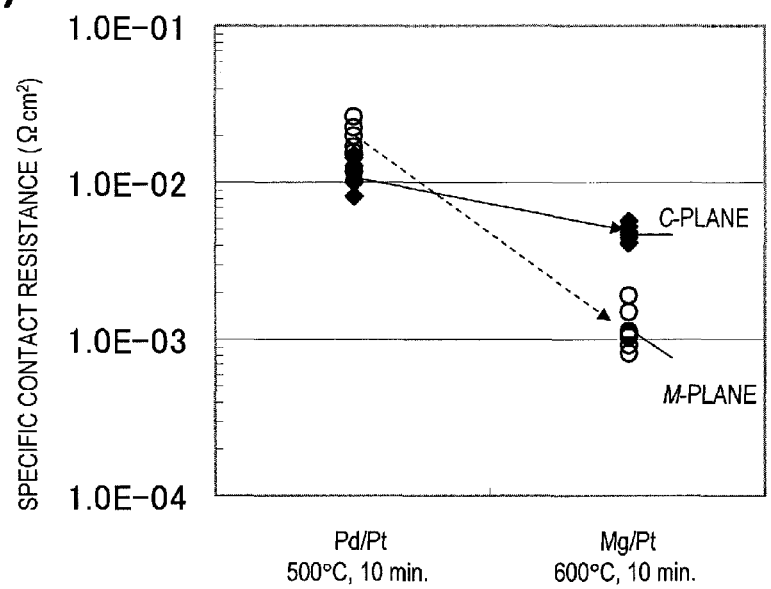
FIG. 7 is a graph showing how the contact resistances of the Mg/Pt electrode and the Pd/Pt electrode changed depending on whether the contact surface was an m-plane or a c-plane.

FIG. 7 is a graph showing how the (measured values of) contact resistances of the Mg/Pt electrode and the Pd/Pt electrode changed depending on whether the contact surface was an m-plane or a c-plane. In each of these samples, the electrode was in contact with the p-type GaN layer, which had been doped with Mg having the concentration profile described above.

Before being subjected to the heat treatment, the respective layers had thicknesses shown in the following Table 1:

TABLE 1

| Plane orientation | p-electrode | Thickness (before heat treatment) |
|---|---|---|
| m-plane | Mg/Pt | 7 nm/75 nm |
| m-plane | Pd/Pt | 40 nm/35 nm |
| c-plane | Mg/Pt | 7 nm/75 nm |
| c-plane | Pd/Pt | 40 nm/35 nm |

Their heat treatment temperatures and durations are as shown in the following Table 2:

TABLE 2

| Plane orientation | p-electrode | Heat treatment temperature and duration |
|---|---|---|
| m-plane | Mg/Pt | 600° C./10 minutes |
| m-plane | Pd/Pt | 500° C./10 minutes |
| c-plane | Mg/Pt | 600° C./10 minutes |
| c-plane | Pd/Pt | 500° C./10 minutes |

As is clear from FIG. 7, even when the contact surface was a c-plane, the contact resistance of the Mg/Pt electrode slightly decreased compared to the Pd/Pt electrode. Nonetheless, the present inventors discovered that the contact resistance of the Mg/Pt electrode had still decreased significantly.

Figure 8:
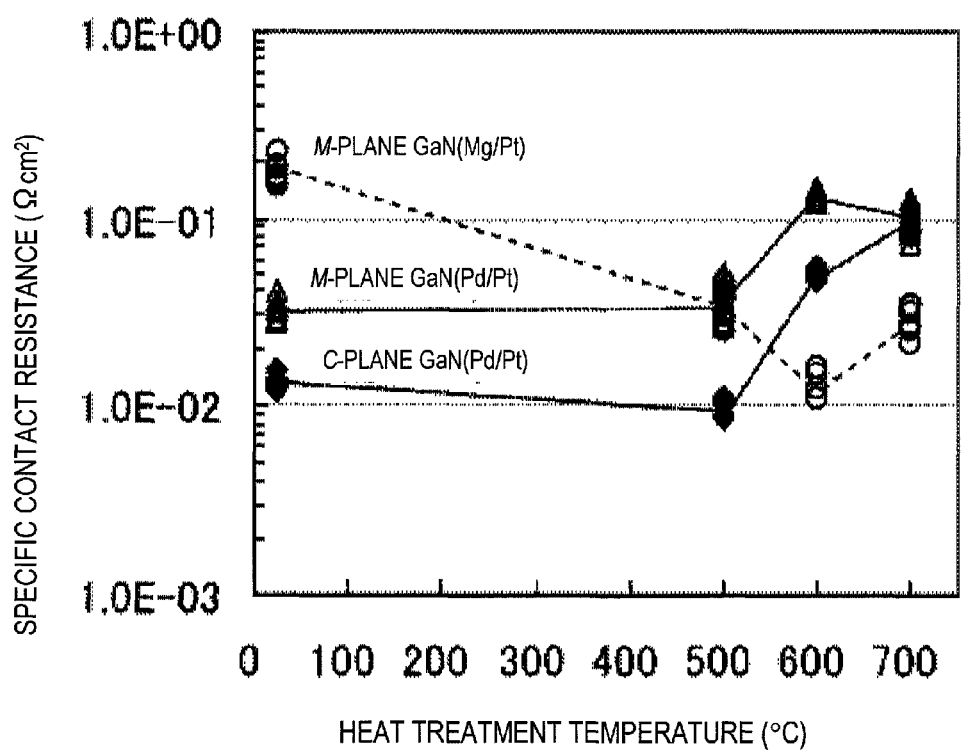
FIG. 8 is a graph showing how the contact resistance depends on the heat treatment temperature.

Next, it will be described with reference to FIG. 8 how the contact resistance depends on the heat treatment temperature. FIG. 8 shows the results that were obtained in a situation where an Mg layer and then a Pt layer were stacked in this order on the m-plane of a p-type GaN layer (which will be referred to herein as an "m-plane GaN layer"). Those results are identified by m-plane GaN (Mg/Pt) in FIG. 8. For the purpose of comparison, FIG. 8 also shows the results that were obtained in a situation where a Pd layer and then a Pt layer were stacked in this order on the p-type m-plane GaN layer. Those results are identified by m-plane GaN (Pd/Pt) in FIG. 8. FIG. 8 further shows the results that were obtained in a situation where a Pd layer and then a Pt layer were stacked in this order on the c-plane of a p-type GaN layer (which will be referred to herein as a "c-plane GaN"). Those results are identified by c-plane GaN (Pd/Pt) in FIG. 8. In any case, the p-type GaN layer was doped with Mg so as to have the concentration profile described above.

Before being subjected to the heat treatment, the respective layers had the thicknesses shown in the following Table 3:

TABLE 3

| Plane orientation | p-electrode | Thickness |
|---|---|---|
| m-plane | Mg/Pt | 7 nm/75 nm |
| m-plane | Pd/Pt | 40 nm/35 nm |
| c-plane | Pd/Pt | 40 nm/35 nm |

First of all, in the electrode consisting of Pd/Pt layers, the m-plane GaN had higher contact resistance than the c-plane GaN. Also, in both of the m- and c-plane GaN, the contact resistance increased at a heat treatment temperature exceeding 500° C.

On the other hand, before subjected to the heat treatment, the electrode of the m-plane GaN (Mg/Pt) had higher contact resistance than the electrode consisting of the Pd/Pt layers. This result conforms to a technical commonplace that the smaller the work function of a metal is, the higher its contact resistance will be. However, in the electrode of the m-plane GaN (Mg/Pt), the higher the heat treatment temperature, the lower the contact resistance. And at a heat treatment temperature of 500° C., the contact resistance of the m-plane GaN (Mg/Pt) was equal to or lower than that of the m-plane GaN (Pd/Pt).

Besides, at a temperature exceeding 500° C. (e.g., at 600° C.), the contact resistance of the m-plane GaN (Mg/Pt) further decreased to get equal to, or even lower than, that of the c-plane GaN (Mg/Pt). According to the graph shown in FIG. 8, when the heat treatment temperature was approximately 550° C. or more, the contact resistance of the m-plane GaN (Mg/Pt) was equal to, or even lower than, that of the c-plane GaN (Mg/Pt).

At a heat treatment temperature of 600° C., the contact resistance of the m-plane GaN (Mg/Pt) was lower than those of the m- and c-plane GaN (Mg/Pt) at 600° C. and more specifically decreased to approximately 1.0E-02 Ωcm$^{-2}$ or the vicinity thereof. Furthermore, at a heat treatment temperature of 700° C., the contact resistance of the m-plane GaN (Mg/Pt) had increased from its resistance at 600° C. but was still lower than the contact resistances of the m- and c-plane GaN (Mg/Pt) at 700° C.

Consequently, the heat treatment temperature of the m-plane GaN (Mg/Pt) is preferably equal to or higher than 500° C., for example. However, if the heat treatment temperature exceeded 700° C. to reach a predetermined temperature of 800° C., for example, then the film quality of the electrode and the GaN layer would start to deteriorate noticeably. The upper limit is preferably 800° C. or less. More preferably, it is in the temperature range of 550° C. to 700° C. As for the m-plane GaN (Mg/Pt), the contact resistance is smaller at 600° C. than at 500° C. If the heat treatment temperature is further increased to 700° C., the contact resistance increases. Thus, the heat treatment temperature is, more preferably, around 600° C. (e.g., 600° C.±50° C.).

Figure 9:
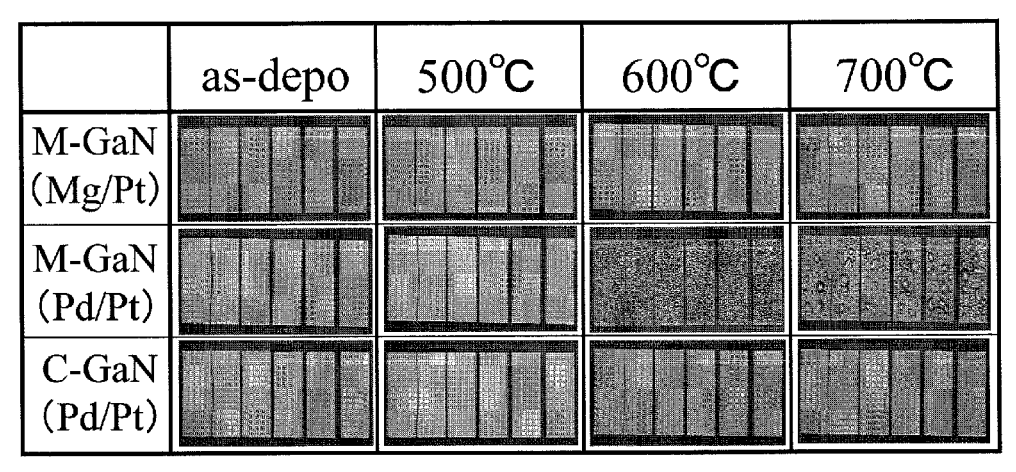

FIG. 9 shows photographs representing the surface states of the electrode that had been thermally treated at respective temperatures. Specifically, the results that were obtained in the as-deposited state (without being subjected to the heat treatment) and at heat treatment temperatures of 500° C., 600° C. and 700° C. are shown in FIG. 9.

As can be seen from FIG. 9, if Pd and Pt layers were stacked in this order on a p-type c-plane GaN layer (i.e., in the case of C—GaN (Pd/Pt)), no deterioration was seen on the surface of the metal at any of these heat treatment temperatures of 500° C., 600° C. and 700° C. According to the results of AFM measurements, the surface had arithmetic average roughness values Ra of about 2 nm, about 2 nm and about 4 nm at 500° C., 600° C. and 700° C., respectively.

On the other hand, if Pd and Pt layers were stacked in this order on a p-type m-plane GaN layer (i.e., in the case of M-GaN (Pd/Pt)), some degree of deterioration such as surface roughening was seen on the surface of the metal at heat treatment temperatures of 600° C. and 700° C. According to the results of AFM measurements, the surface had an Ra of about 30 nm and an Ra of about 77 nm at 600° C. and 700° C., respectively. That is to say, it can be seen that such deterioration of the electrode that has gone through a heat treatment is a problem peculiar to the m-plane GaN electrode.

However, if Mg and Pt layers were stacked in this order on a p-type m-plane GaN layer (i.e., in the case of M-GaN (Mg/Pt)), the present inventors confirmed that a very small degree of unevenness was seen at the heat treatment temperature of 700° C. but that the electrode never deteriorated at any of these heat treatment temperatures of 500° C., 600° C. and 700° C. According to the results of AFM measurements, the surface had Ra of about 1.5 nm, about 1.5 nm and about 4.5 nm at 500° C., 600° C. and 700° C., respectively. Thus, good surface states were achieved. And in the structure of this preferred embodiment, the electrode surface preferably has an Ra of about 4.5 nm or less, more preferably about 1.5 nm or less.

Figure 10:
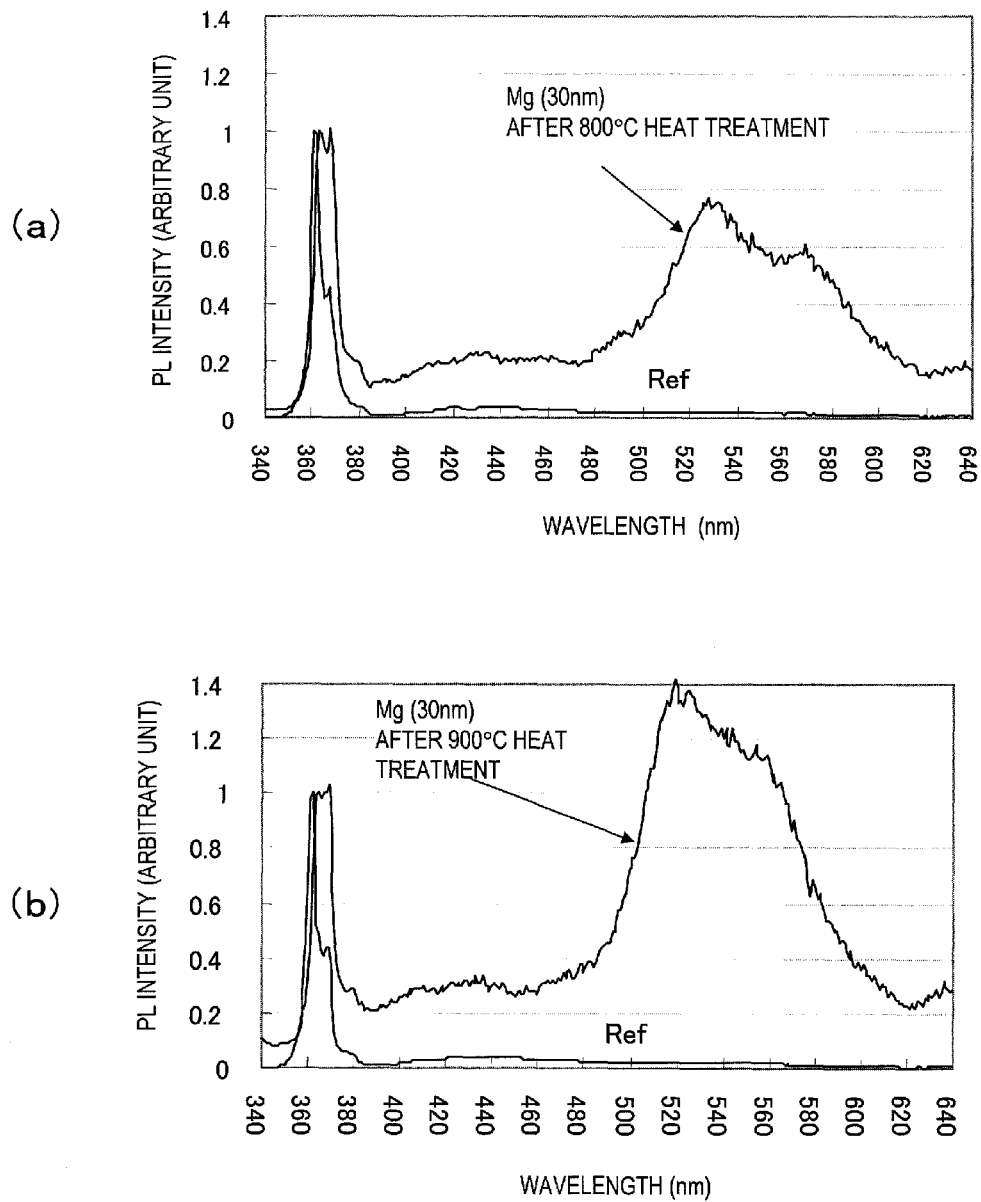
FIGS. 10($a$) and 10($b$) are graphs showing the photoluminescence intensities of a GaN layer that was thermally treated at 800° C. and 900° C., respectively.

The present inventors deposited an Mg layer to a thickness of 30 nm on a GaN layer, thermally treated it at 800° C. and at 900° C. for 10 minutes, and then measured the photoluminescence of the GaN layer. The results are shown in FIG. 10. Specifically, FIG. 10(a) shows the results of a heat treatment that was carried out at 800° C., while FIG. 10(b) shows the results of a heat treatment that was carried out at 900° C. In FIGS. 10(a) and 10(b), the ordinate represents the PL intensity, which stands for "photoluminescence intensity". In each of these graphs shown in FIGS. 10(a) and 10(b), the curve identified by Ref represents the PL intensity that was obtained before the heat treatment.

First of all, the present inventors discovered and confirmed via experiments that if the heat treatment was carried out at 700° C. or less, the photoluminescence spectrum after the heat treatment remained virtually the same as the one before the heat treatment. On the other hand, if the heat treatment was carried out at 800° C., a photoluminescence called "yellow band", which would have been caused due to the presence of vacancy defects, appeared around 530 nm as shown in FIG. 10(a). And if the heat treatment temperature was further raised, the photoluminescence around 530 nm further increased its intensity as shown in FIG. 10(b), which indicates that the density of such vacancy defects increased. These results reveal that to keep the quality of GaN good enough, the electrode including the Mg layer is preferably thermally treated at 700° C. or less.

Figure 11:
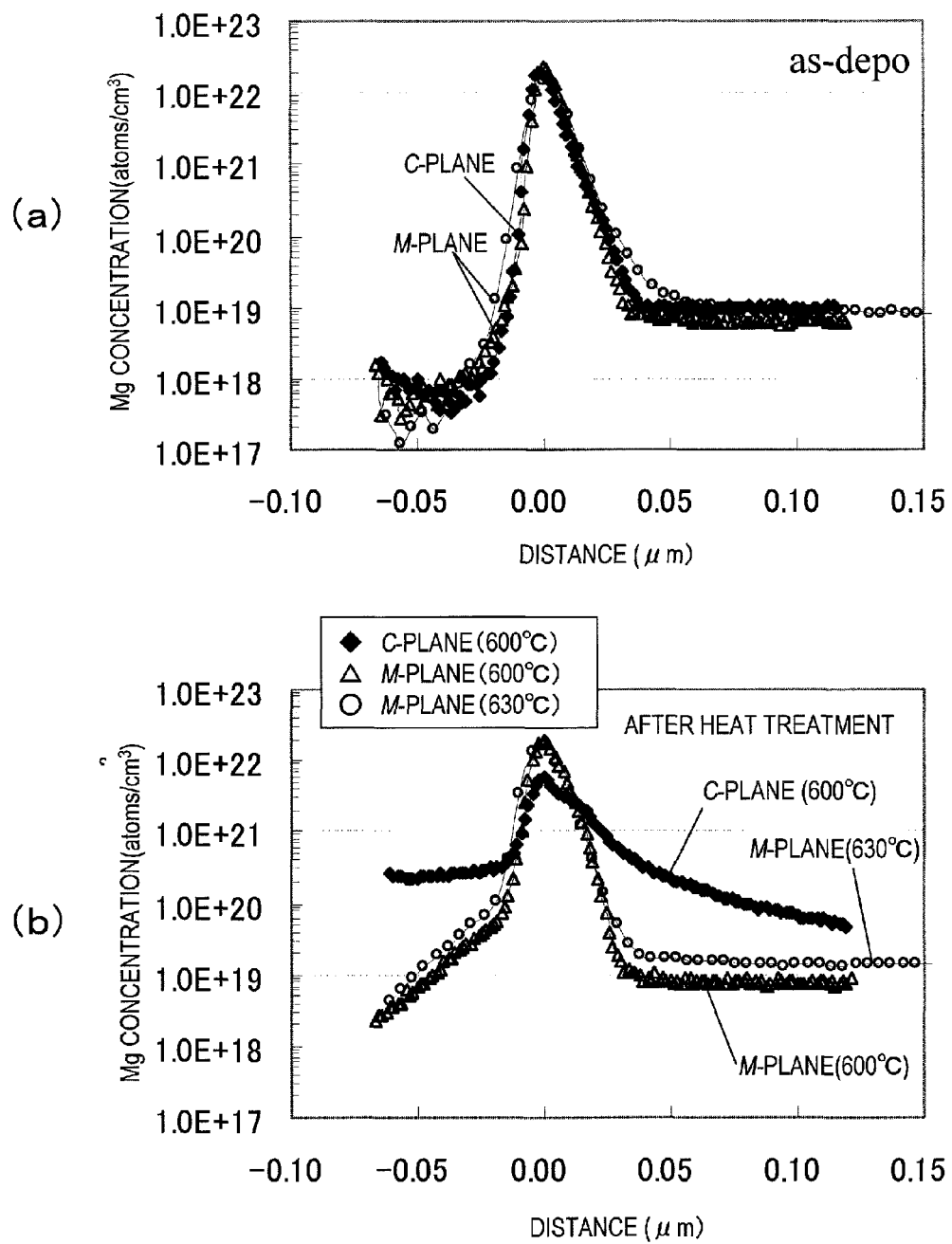
FIGS. 11($a$) and 11($b$) are profiles of Mg that were obtained in the depth direction of an (Mg/Pt) electrode structure by SIMS analysis.

FIG. 11 shows the profile of Mg atoms in the depth direction, which was measured in an electrode structure (Mg/Pt) with an SIMS (Secondary Ion-microprobe Mass Spectrometer). Specifically, FIG. 11(a) shows the results that were obtained in a situation where an Mg/Pt electrode, in which an Mg layer was stacked on the GaN layer, was not subjected to heat treatment (i.e., in the as-deposited state). On the other hand, FIG. 11(b) shows the results that were obtained after a heat treatment. The heat treatment was carried out on c-plane GaN at 600° C. for 10 minutes and on m-plane GaN at 600° C. for 10 minutes and at 630° C. for 10 minutes.

In any of these electrodes, before the heat treatment, the Mg layer had a thickness of 7 nm and the Pt layer had a thickness of 75 nm.

In the graphs shown in FIGS. 11(a) and 11(b), the ordinate represents the Mg concentration and the abscissa represents the distance in the depth direction. In this case, negative abscissas represent sites closer to the electrode, while positive ones represent sites closer to the p-type GaN. The origin (of 0 μm) on the axis of abscissas represents a site where Mg has a peak concentration and substantially corresponds to the interface between the p-type GaN layer and the Mg layer. The same statement will also apply to the graphs shown in FIGS. 12, 13 and 15 to be referred to later.

In the graphs shown in FIGS. 11(a) and 11(b), the solid diamonds ♦ represent data about samples that were formed on the c-plane GaN and that were thermally treated at 600° C., the open triangles Δ represent data about samples that were formed on the c-plane GaN and that were thermally treated at 600° C., and the open circles ○ represent data about samples that were formed on the m-plane GaN and that were thermally treated at 630° C. The same statement will also apply to the graphs shown in FIGS. 12, 13 and 15 to be referred to later. In any of these cases, the p-type GaN layer yet to be thermally treated had been doped with 7×10$^{19}$ cm$^{-3}$ Mg to a depth of 20 nm as measured from the surface that was in contact with the electrode and had been doped with 1×10$^{19}$ cm$^{-3}$ Mg in deeper regions as described above.

As shown in FIG. 11(a), in the as-deposited state, the Mg profiles were no different, no matter whether the underlying layer was m-plane GaN or c-plane GaN. On the other hand, if an Mg layer was deposited on the GaN layer and then thermally treated, the resultant Mg profiles were quite different as shown in FIG. 11(b).

If the heat treatment was carried out, Mg on the c-plane GaN was seen to have diffused into the p-type GaN layer at rather high concentrations as shown in FIG. 11(b), and was also seen to have diffused into the Pt layer. On the other hand, it was confirmed that Mg on the m-plane GaN hardly diffused into the p-type GaN layer or the Pt layer. More specifically, in the case of the c-plane GaN, Mg diffused deep into not only the Pt layer but also the GaN itself as a result of the heat treatment. On the other hand, in the case of the m-plane GaN, Mg slightly diffused toward the Pt layer but hardly diffused toward the GaN as a result of the heat treatment. The results were almost no different, no matter whether the heat treatment temperature was 600° C. or 630° C. In this manner, a significant difference arose between the diffusion of Mg on the c-plane GaN and that of Mg on the m-plane GaN before and after the heat treatment. The adequate reason has not been quite clear yet but that would have been probably because of a difference in the ordering of uppermost atoms between the c-plane and the m-plane, a difference in their polarity, and a difference in the density of atoms.

Figure 12:
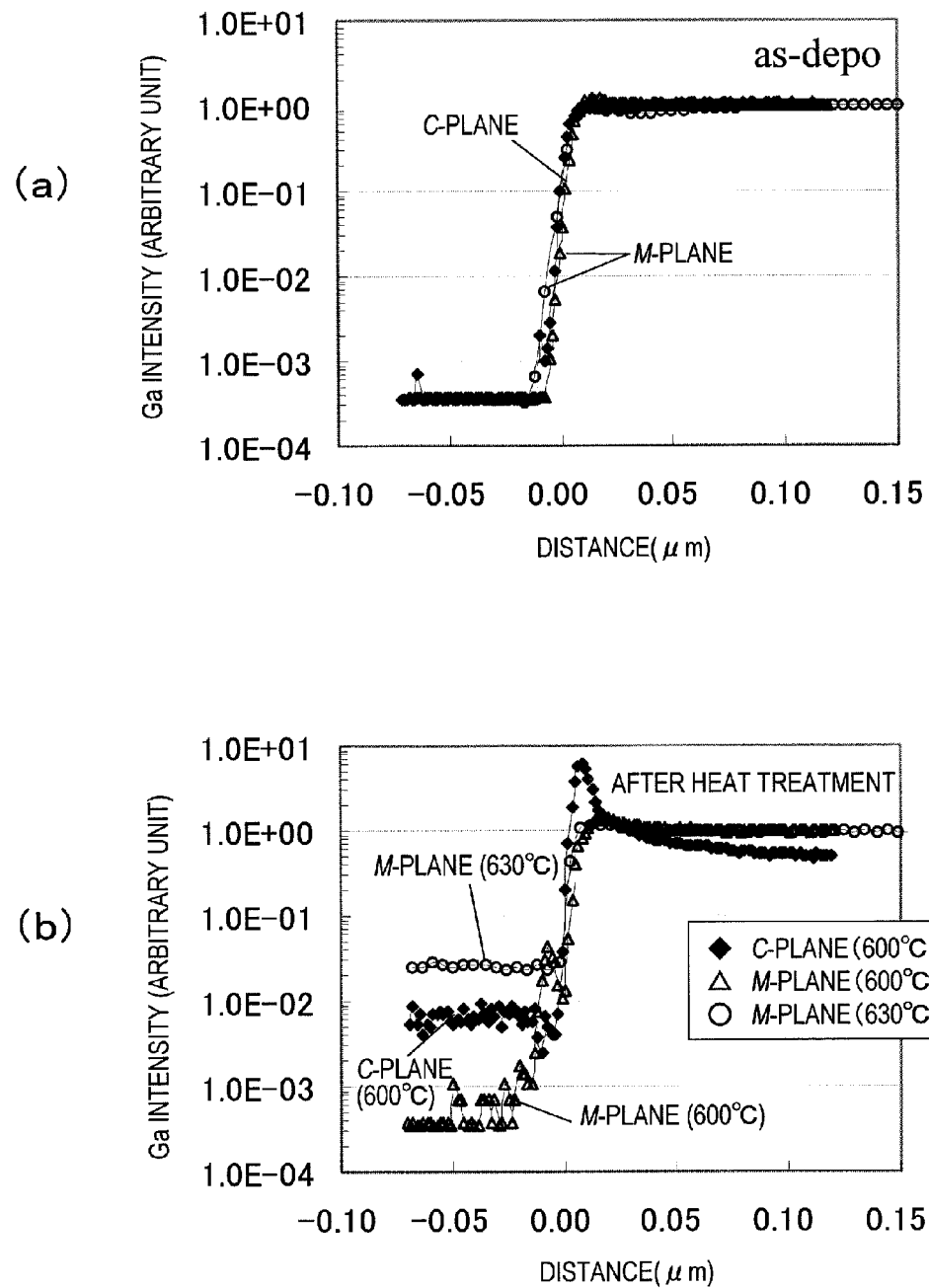
FIGS. 12($a$) and 12($b$) are profiles of Ga that were obtained in the depth direction of the (Mg/Pt) electrode structure by SIMS analysis.

FIG. 12 shows the profile of Ga atoms in the depth direction, which was measured in the electrode structure (Mg/Pt) with an SIMS. Before the heat treatment, the Mg layer had a thickness of 7 nm and the Pt layer had a thickness of 75 nm. The ordinate of this graph represents the signal intensity of the SIMS's detector, which is proportional to the atomic concentration. In FIG. 12, the abscissa representing a distance of 0 μm substantially corresponds to the interface between the p-type GaN layer and the Mg layer. It should be noted that the origin (of 0 μm) on the axis of abscissas represents a site where Ga has a peak concentration. In this case, negative abscissas represent sites closer to the electrode, while positive ones represent sites closer to the p-type GaN. The ordinate is normalized with respect to the concentration of Ga in as-deposited GaN crystals as a unity. Also, if calculations are made based on the atomic density of the base, an ordinate representing an intensity of $1\times10^{-3}$ substantially corresponds to a concentration of $1\times10^{19}$ cm$^{-3}$.

FIG. 12(a) shows the results that were obtained in a situation where an Mg/Pt electrode, in which an Mg layer was stacked on the GaN layer, was not subjected to heat treatment (i.e., in the as-deposited state). On the other hand, FIG. 12(b) shows the results that were obtained after a heat treatment that had been carried out at temperatures of 600° C. and 630° C. Specifically, the heat treatment was carried out on c-plane GaN at 600° C. for 10 minutes and on m-plane GaN at 600° C. for 10 minutes and at 630° C. for 10 minutes.

As shown in FIG. 12(a), in the as-deposited state, the Ga profiles were no different, no matter whether the underlying layer was m-plane GaN or c-plane GaN. On the other hand, if an Mg layer was deposited on the GaN layer and then thermally treated, the resultant Ga profiles were quite different as shown in FIG. 12(b).

Specifically, the present inventors confirmed that if the heat treatment was carried out, Ga diffused into the Mg layer as shown in FIG. 12(b). In a sample in which an Mg layer was deposited on the m-plane GaN and then thermally treated at 600° C., Ga was seen to have diffused into the Mg layer and the contact resistance decreased. The reason has not been quite clear yet but the present inventors did confirm that there was a correlation between the number of Ga atoms diffused into the Mg layer and the contact resistance.

More specifically, in the case of the c-plane GaN, Ga diffused into both the Mg and Pt layers and moved into the electrode even from deep inside GaN crystals. In other words, in the c-plane GaN, Ga atoms diffused significantly almost everywhere from the GaN layer into the electrode. In the m-plane GaN, on the other hand, when the heat treatment temperature was 600° C., it seems that Ga atoms moved only in the vicinity of the interface unlike the c-plane GaN. Compared to a c-plane, it would be less easy for the atoms to move freely from an m-plane. Even in the m-plane GaN, however, if the heat treatment temperature was 630° C., Ga atoms diffused into the entire Mg and Pt layers. It should be noted that the m-plane contact resistance was lower at a heat treatment temperature of 600° C. than at 630° C. This is probably because at a heat treatment temperature of 600° C., it would be hard for nitrogen atoms to diffuse from the m-plane as will be described later, and therefore, Ga vacancies would act as acceptors as a result. On the other hand, at a heat treatment temperature of 630° C., a greater number of nitrogen atoms would diffuse toward the electrode than at 600° C.

Figure 13:
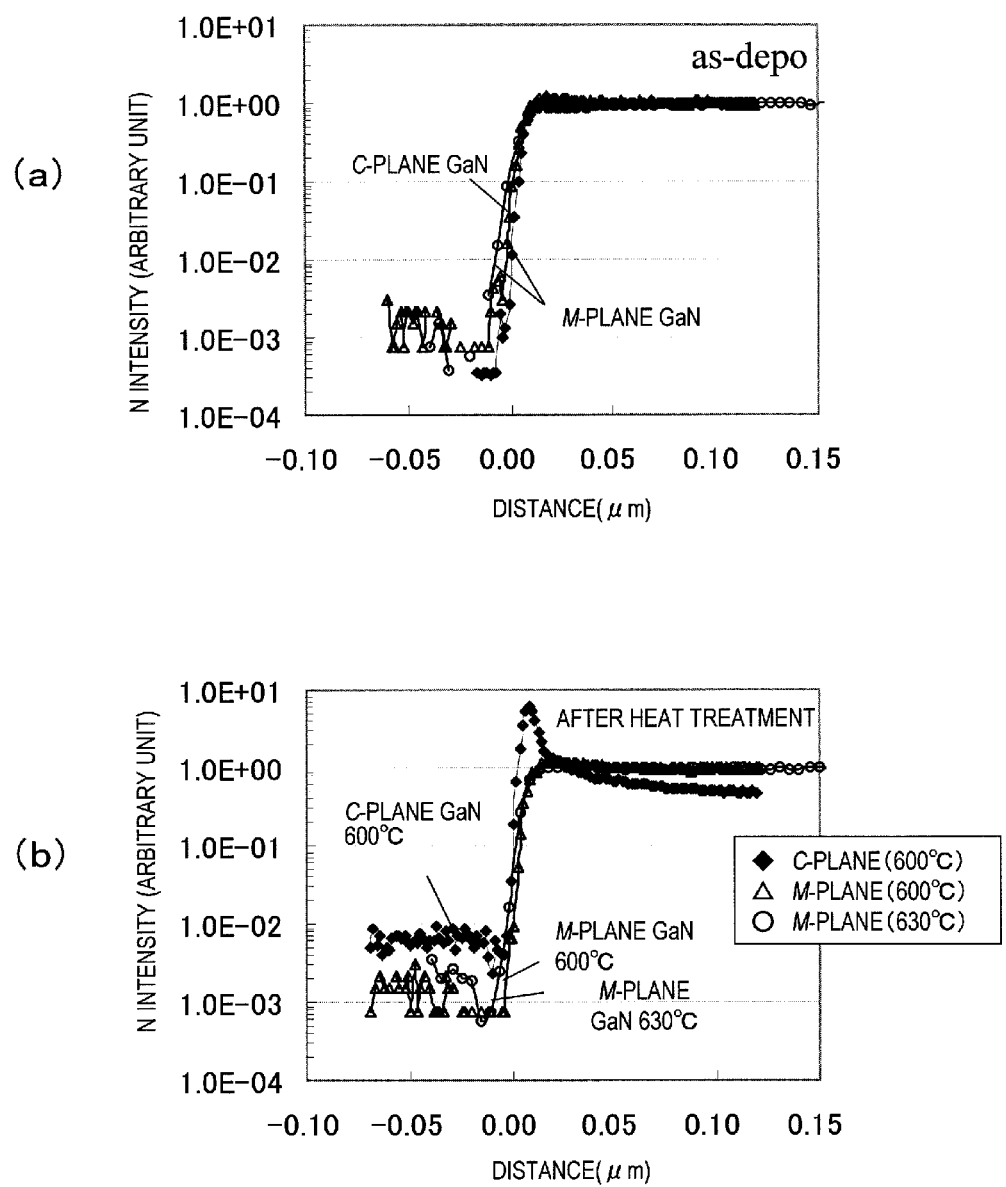
FIGS. 13($a$) and 13($b$) are profiles of N that were obtained in the depth direction of the (Mg/Pt) electrode structure by SIMS analysis.

FIG. 13(a) is a graph showing the profile of nitrogen atoms in the depth direction in an Mg/Pt electrode yet to be subjected to a heat treatment, while FIG. 13(b) is a graph showing the profile of nitrogen atoms in the depth direction in the Mg/Pt electrode that has been subjected to the heat treatment. Before the heat treatment, the Mg layer had a thickness of 7 nm and the Pt layer had a thickness of 75 nm. In the graphs shown in FIGS. 13(a) and 13(b), the ordinate represents the N intensity, while the abscissa represents the distance in the depth direction. Specifically, an N intensity of $1\times10^{-3}$ substantially corresponds to an N concentration of $1\times10^{19}$ cm$^{-3}$. In this case, negative abscissas represent sites closer to the electrode, while positive ones represent sites closer to the p-type GaN. In FIG. 13, the origin of the axis of abscissas (0 μm) substantially corresponds to the interface between the p-type GaN layer and the Mg layer. The electrode structure and the p-type GaN doping conditions are the same as what has already been described for the samples with reference to FIG. 11.

It can be seen from FIG. 13(a) that in samples in which no heat treatment was carried out after the evaporation process, nitrogen atoms did not diffuse toward the electrode, no matter whether the electrode had been formed on the c-plane GaN or the m-plane GaN.

On the other hand, it was confirmed that in the electrode on the c-plane GaN that had been thermally treated, nitrogen atoms diffused toward the electrode as shown in FIG. 13(b). In the electrode on the m-plane GaN, however, the nitrogen atoms hardly diffused toward the electrode even after the heat treatment. Therefore, the N concentration in the Mg layer on the m-plane GaN is lower than the Ga concentration. On the other hand, the N concentration in the Mg layer on the c-plane GaN is approximately equal to the Ga concentration. That is to say, as for the m-plane GaN, only Ga atoms diffused toward the electrode but nitrogen atoms didn't. Meanwhile, as for the c-plane GaN, both Ga atoms and nitrogen atoms did diffuse toward the electrode. If Ga atoms diffuse toward the electrode from p-type GaN, then the number of Ga atoms will be insufficient on the uppermost surface of p-type GaN, thus producing Ga vacancies there. Such Ga vacancies will act as a sort of acceptors. That is why if the number of Ga vacancies increases in the vicinity of the interface between the electrode and the p-type GaN, then holes will pass through the Schottky barrier of that interface more easily due to a so-called "tunneling" phenomenon. If not only those Ga atoms but also nitrogen atoms diffuse toward the electrode, however, the number of nitrogen atoms will also be insufficient on the uppermost surface of the p-type GaN. That is to say, nitrogen vacancies will also be produced there. Those nitrogen vacancies will act like donors and will produce charge compensation with respect to the Ga vacancies. That is why if not just Ga atoms but also nitrogen atoms diffuse toward the electrode as in the c-plane GaN, the contact resistance will no longer decrease.

These elements (namely, Mg, Ga, N and Pt) would behave in a similar manner even if part of Ga is replaced with Al or In in the GaN layer that is in contact with the Mg layer. Their behavior would also be the same even if the GaN-based semiconductor layer that is in contact with the Mg layer is doped with a non-Mg element as a dopant.

Figure 14:
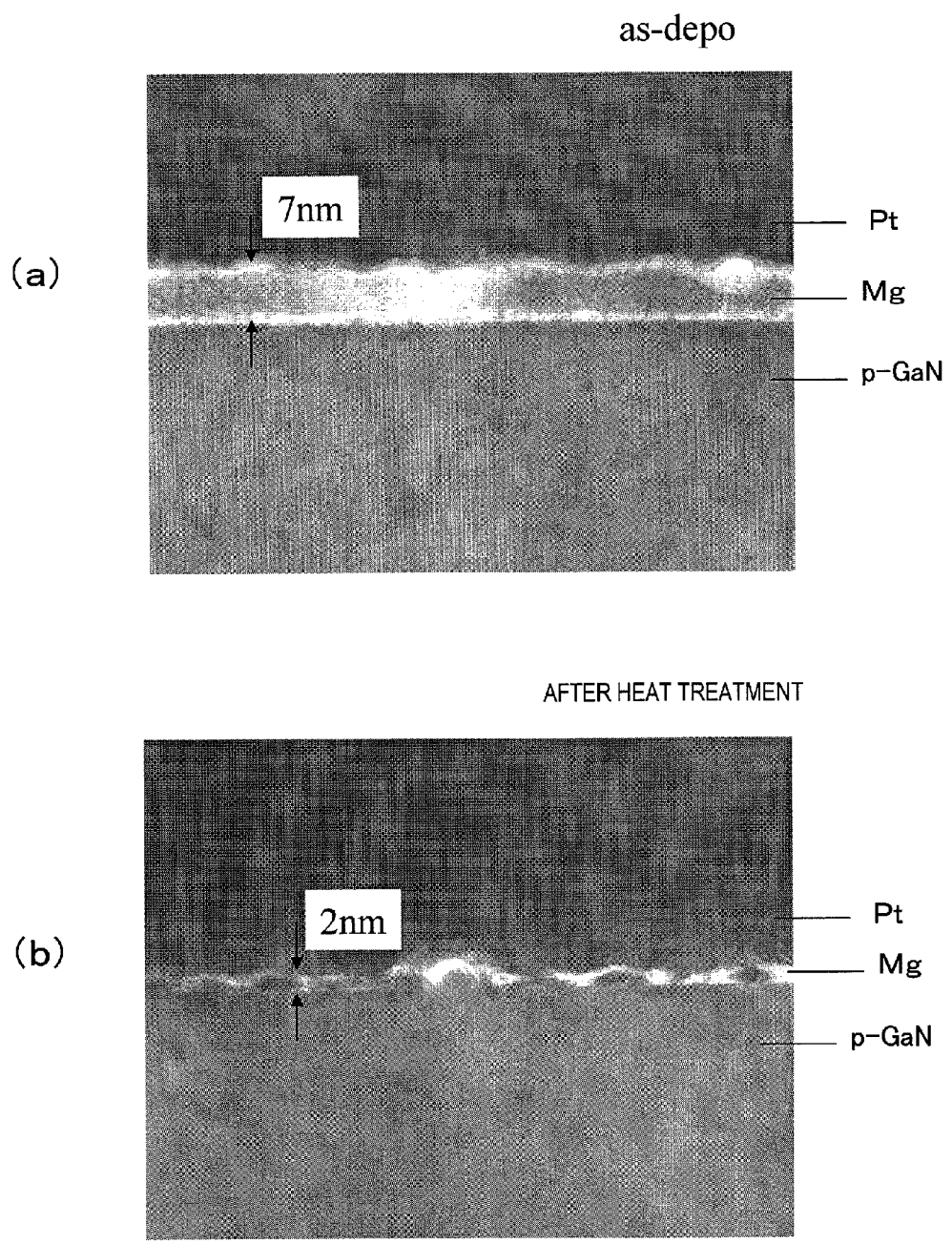
FIGS. 14($a$) and 14($b$) show cross-sectional transmission electron microscope (TEM) photographs of an (Mg/Pt) electrode structure in which an Mg layer was deposited on an m-plane GaN layer as substitutes for drawings.

Next, look at FIG. 14, which shows cross-sectional transmission electron microscope (TEM) photographs of an (Mg/Pt) electrode structure in which an Mg layer was deposited on an m-plane GaN layer. Specifically, FIG. 14(a) shows the result that was obtained without conducting a heat treatment (i.e., in the as-deposited state), while FIG. 14(b) shows the result that was obtained after a heat treatment had been carried out at 600° C. for 10 minutes.

In this example, the Mg layer was deposited to a thickness of 7 nm on GaN crystals as shown in FIG. 14(a). After the heat treatment, the Pt layer corroded the Mg layer, thus reducing the thickness of the Mg layer to 2 nm as shown in FIG. 14(b).

As can be seen from FIG. 14(b), although the Mg layer (i.e., the layer 32 shown in FIG. 3(a)) had a small thickness (of 2 nm, for example), the presence of the Mg layer (i.e., the layer 32 shown in FIG. 3(a)), consisting essentially of Mg that had neither been alloyed nor absorbed by the Pt layer (i.e., the layer 34 shown in FIG. 3(a)), was still confirmed.

Figure 15:
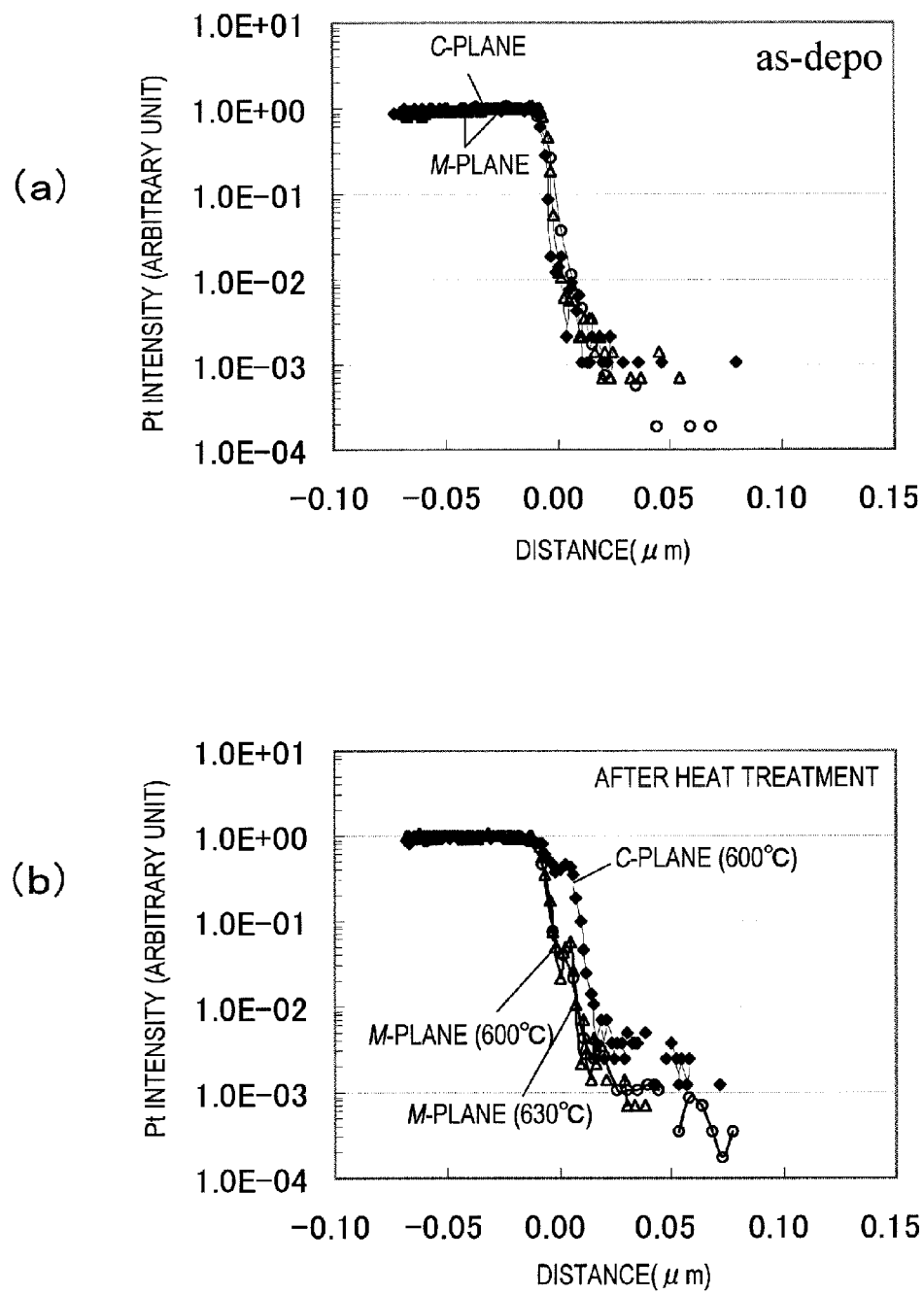
FIGS. 15($a$) and 15($b$) are profiles of Pt that were obtained in the depth direction of the (Mg/Pt) electrode structure by SIMS analysis.

FIG. 15 shows the profile of Pt atoms in the depth direction, which was measured in an electrode structure (Mg/Pt) with an SIMS. Just the SIMS results described above, FIGS. 15(a) and 15(b) show the results that were obtained without conducting a heat treatment (i.e., in the as-deposited state) and the results that were obtained after a heat treatment. Before the heat treatment, the Mg layer had a thickness of 7 nm and the Pt layer had a thickness of 75 nm. In the graphs shown in FIGS. 15(a) and 15(b), the ordinate represents the Pt intensity, while the abscissa represents the distance in the depth direction. Specifically, a Pt intensity of $1\times10^{-3}$ substantially corresponds to a Pt concentration of $1\times10^{19}$ cm$^{-3}$. In this case, negative abscissas represent sites closer to the electrode, while positive ones represent sites closer to the p-type GaN. In FIG. 15, the origin of the axis of abscissas (0 µm) substantially corresponds to the interface between the p-type GaN layer and the Mg layer. The electrode structure and the p-type GaN doping conditions are the same as what has already been described for the samples with reference to FIG. 11.

As shown in FIG. 15(a), in the as-deposited state, the Pt profiles were no different, no matter whether the underlying layer was m-plane GaN or c-plane GaN. On the other hand, it can be seen from FIG. 15(b) that on the c-plane GaN, Pt diffused toward GaN after the heat treatment. Nevertheless, it was confirmed that as for the m-plane GaN, the Pt profiles hardly changed even after the heat treatment and Pt hardly diffused into the GaN layer. More specifically, as for the c-plane GaN, a lot of Pt diffused toward the Mg layer as a result of the heat treatment. As for the m-plane GaN, on the other hand, just a small number of Pt (which was approximately only a tenth compared to the c-plane GaN) diffused toward the Mg layer as a result of the heat treatment. The results were almost the same, no matter whether the heat treatment temperature was 600° C. or 630° C.

These results reveal that according to the structure (Mg/Pt) of this preferred embodiment, in a region where Mg was in contact with the GaN layer, their alloy was produced much less than in the case of Au.

Figure 16:
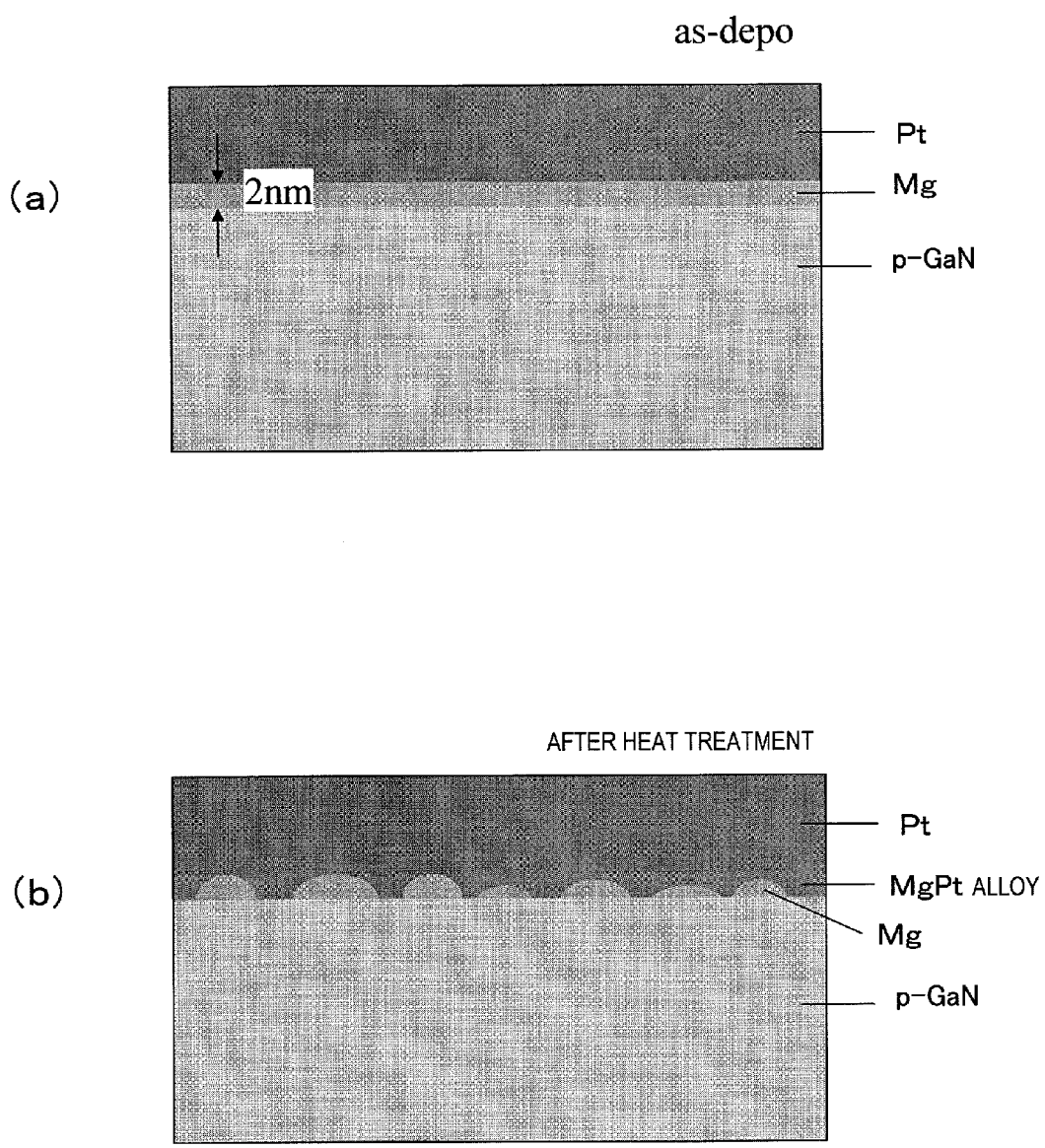
FIG. 16($a$) illustrates a cross-sectional structure of an Mg/Pt electrode (in which an Mg layer was deposited on an m-plane GaN layer) yet to be subjected to a heat treatment, and FIG. 16($b$) illustrates a cross-sectional structure of the Mg/Pt electrode thermally treated.

The present inventors made a sample in which an Mg layer was deposited to a thickness of 2 nm on an m-plane GaN and then thermally treated at 600° C. for 10 minutes. And we observed cross sections of that sample with a transmission electron microscope (TEM). FIG. 16(a) is a schematic representation illustrating the structure of an Mg/Pt electrode yet to be subjected to a heat treatment, while FIG. 16(b) is a schematic representation illustrating the structure of the Mg/Pt electrode thermally treated. Each of these drawings was drawn based on a cross-sectional TEM photograph.

If the Mg layer as deposited was thicker than 5 nm, the thickness of the Mg decreased after having been thermally treated at 600° C. for 10 minutes. However, the Mg layer was still present as a substantially continuous film even after the heat treatment. On the other hand, it was confirmed that if the Mg layer as deposited had a thickness of approximately 2 nm, sometimes there were islands of Mg, which had not been absorbed into an Mg—Pt alloy, after the heat treatment had been carried out at 600° C. for 10 minutes as shown in FIG. 16(b). Also, if the thickness of the Mg layer as-deposited is as small as approximately 2 nm, the Mg layer eventually obtained could have any of various morphologies according to the conditions of the heat treatment conducted.

It should be noted that the "Mg layer" could also refer herein to a group of such a huge number of islands of Mg on the surface of a p-type semiconductor region. Alternatively, the "Mg layer" could even be a film with a lot of openings (such as a porous film). In this manner, as long as Mg that has not been corroded by Pt contacts with the surface of a p-type semiconductor region (that is an m-plane), the contact resistance can be reduced sufficiently effectively.

It is estimated that, even if an Mo layer, a Pd layer, or an Ag layer is deposited in place of the Pt layer on the Mg layer, substantially the same effect (contact resistance reducing effect) could also be obtained.

Hereinafter, the configuration of this preferred embodiment will be described in further detail with reference to FIG. 3(a) again.

As shown in FIG. 3(a), the light-emitting device 100 of this preferred embodiment includes an m-plane GaN substrate 10 and an Al$_u$Ga$_v$In$_w$N layer (where u+v+w=1, u$\geq$0, v$\geq$0 and w$\geq$0) 22 that has been formed on the substrate 10. In this specific example, the m-plane GaN substrate 10 is an n-type GaN substrate with a thickness of 100 µm, for example, and the Al$_u$Ga$_v$In$_w$N layer 22 is an n-type GaN layer with a thickness of 2 µm, for example. On the Al$_u$Ga$_v$In$_w$N layer 22, stacked is an active layer 24. In other words, a semiconductor multilayer structure 20 including at least the active layer 24 has been formed on the m-plane GaN substrate 10.

In the semiconductor multilayer structure 20, an active layer 24 including an Al$_a$In$_b$Ga$_c$N layer (where a+b+c=1, a$\geq$0, b$\geq$0 and c$\geq$0) has been formed on the Al$_x$Ga$_y$In$_z$N layer 22. The active layer 24 consists of InGaN well layers with an In mole fraction of approximately 25% and GaN barrier layers, both the well layers and the barrier layers may have a thickness of 9 nm each, and the well layers may have a well layer period of three. On the active layer 24, stacked is an Al$_d$Ga$_e$N layer (where d+e=1, d$\geq$0 and e$\geq$0) 26 of the second conductivity type (which may be p-type, for example), which may be an AlGaN layer with an Al mole fraction of 10% and may have a thickness of 0.2 µm. In this preferred embodiment, the Al$_d$Ga$_e$N layer 26 is doped with Mg as a p-type dopant to a level of approximately $10^{18}$ cm$^{-3}$, for example. Also, in this example, an undoped GaN layer (not shown) is interposed between the active layer 24 and the Al$_d$Ga$_e$N layer 26.

Furthermore, in this example, on the Al$_d$Ga$_e$N layer 26, stacked is a GaN layer (not shown) of the second conductivity type (which may be p-type, for example). In addition, on the contact layer of p$^+$-GaN, stacked in this order are an Mg layer 32 and a Pt layer 34. And this stack of the Mg layer 32 and the Pt layer 34 is used as an electrode (i.e., a p-electrode) 30.

This semiconductor multilayer structure 20 further has a recess 42 that exposes the surface of the Al$_u$Ga$_v$In$_w$N layer 22.

And an electrode 40 (n-electrode) has been formed on the $Al_uGa_vIn_wN$ layer 22 at the bottom of the recess 42, which may have a width (or diameter) of 20 μm and a depth of 1 μm, for example. The electrode 40 may have a multilayer structure consisting of Ti, Al and Pt layers, which may have thicknesses of 5 nm, 100 nm and 10 nm, respectively.

The present inventors discovered that the nitride-based semiconductor light-emitting device 100 of this preferred embodiment could have an operating voltage Vop that was approximately 1.5 V lower than that of a conventional m-plane LED with a Pd/Pt electrode, and therefore, could cut down the power dissipation as a result.

Hereinafter, it will be described with reference to FIG. 3(a) once again how to fabricate the nitride-based semiconductor light-emitting device of this preferred embodiment.

First of all, an m-plane substrate 10 is prepared. In this preferred embodiment, a GaN substrate is used as the substrate 10. The GaN substrate of this preferred embodiment is obtained by HVPE (hydride vapor phase epitaxy).

For example, a thick GaN film is grown to a thickness of several nanometers on a c-plane sapphire substrate, and then diced perpendicularly to the c-plane (i.e., parallel to the m-plane), thereby obtaining m-plane GaN substrates. However, the GaN substrate does not have to be prepared by this particular method. Alternatively, an ingot of bulk GaN may be made by a liquid phase growth process such as a sodium flux process or a melt-growth method such as an ammonothermal process and then diced parallel to the m-plane.

The substrate 10 does not have to be a GaN substrate but may also be a gallium oxide substrate, an SiC substrate, an Si substrate or a sapphire substrate, for example. To grow an m-plane GaN-based semiconductor on the substrate by epitaxy, the principal surface of the SiC or sapphire substrate is preferably also an m-plane. However, in some instances, a-plane GaN could grow on an r-plane sapphire substrate. That is why according to the growth conditions, the surface on which the crystal growth should take place does not always have to be an m-plane. In any case, at least the surface of the semiconductor multilayer structure 20 should be an m-plane. In this preferred embodiment, crystal layers are formed one after another on the substrate 10 by MOCVD (metalorganic chemical vapor deposition) process.

Next, an $Al_uGa_vIn_wN$ layer 22 is formed on the m-plane GaN substrate 10. As the $Al_uGa_vIn_wN$ layer 22, AlGaN may be deposited to a thickness of 3 μm, for example. A GaN layer may be deposited by supplying $TMG(Ga(CH_3)_3)$, $TMA(Al(CH_3)_3)$ and $NH_3$ gases onto the m-plane GaN substrate 10 at 1,100° C., for example.

Subsequently, an active layer 24 is formed on the $Al_uGa_vIn_wN$ layer 22. In this example, the active layer 24 has a GaInN/GaN multi-quantum well (MQW) structure in which $Ga_{0.9}In_{0.1}N$ well layers and GaN barrier layers, each having a thickness of 9 nm, have been stacked alternately to have an overall thickness of 81 nm. When the $Ga_{0.9}In_{0.1}N$ well layers are formed, the growth temperature is preferably lowered to 800° C. to introduce In.

Thereafter, an undoped GaN layer is deposited to a thickness of 30 nm, for example, on the active layer 24, and then an $Al_dGa_eN$ layer 26 is formed on the undoped GaN layer. As the $Al_dGa_eN$ layer 26, p-$Al_{0.14}Ga_{0.86}N$ is deposited to a thickness of 70 nm by supplying TMG, $NH_3$, TMA, TMI gases and $Cp_2Mg$ (cyclopentadienyl magnesium) gas as a p-type dopant.

Next, a p-GaN contact layer is deposited to a thickness of 0.5 μm, for example, on the $Al_dGa_eN$ layer 26. In forming the p-GaN contact layer, $Cp_2Mg$ is supplied as a p-type dopant.

Thereafter, respective portions of the p-GaN contact layer, the $Al_dGa_eN$ layer 26, the undoped GaN layer, and the active layer 24 are removed by performing a chlorine-based dry etching process, thereby making a recess 42 and exposing a region of the $Al_xGa_yIn_zN$ layer 22 where an n-electrode will be formed. Then, Ti/Pt layers are deposited as an n-electrode 40 on the region reserved for an n-type electrode at the bottom of the recess 42.

Subsequently, an Mg layer 32 is formed on the p-GaN contact layer and then a Pt layer 34 is stacked on the Mg layer 32, thereby forming a p-electrode 40. In this preferred embodiment, a technique for performing an evaporation process while evaporating the material metal in pulses (i.e., a so-called "pulse evaporation process") is used to form the Mg layer 32. More specifically, metal Mg contained in a crucible in a vacuum is irradiated with pulses of electron beam, thereby evaporating the material metal in pulses. Some of the molecules or atoms of that material metal are deposited on the p-GaN contact layer, thereby forming an Mg layer 32. Those pulses may have a pulse width of 0.5 seconds and may be applied repeatedly at a frequency of 1 Hz. By adopting such a technique, a dense film of quality could be formed as the Mg layer 32. The Mg layer had such high density probably because by performing such a pulse evaporation, Mg atoms or a cluster of Mg atoms that collided against the p-GaN contact layer would have their kinetic energy increased.

Generally speaking, Mg is an element which is susceptible to oxidation when exposed to water or air. However, an Mg layer obtained by using the pulse evaporation process of the present embodiment is resistant to oxidation and exhibits excellent water resistance and oxygen resistance. The thus-formed Mg layer is stable even after being subjected to a heat treatment at 600° C. or higher.

This preferred embodiment uses a technique for depositing an Mg layer 32 while evaporating the material metal (i.e., metal Mg) in pulses. However, as long as the Mg layer 32 can be formed, any other technique can also be adopted. As an alternative method for forming such a dense Mg layer of quality, a thermal CVD process or a molecular beam epitaxy (MBE) could also be used.

Optionally, the substrate 10 and a portion of the $Al_uGa_vIn_wN$ layer 22 could be removed after that by some technique such as laser lift-off, etching or polishing. In that case, either only the substrate 10 or the substrate 10 and a portion of the $Al_uGa_vIn_wN$ layer 22 could be removed selectively. It is naturally possible to leave the substrate 10 and the $Al_uGa_vIn_wN$ layer 22 as they are without removing them. By performing these process steps, the nitride-based semiconductor light-emitting device 100 of this preferred embodiment is completed.

In the nitride-based semiconductor light-emitting device 100 of this preferred embodiment, when a voltage is applied to between the n- and p-electrodes 40 and 30, holes are injected from the p-electrode 30 into the active layer 24 and electrons are injected from the n-electrode 40 into the active layer 24, thus producing photoluminescence with a wavelength of about 450 nm.

Figure 17:
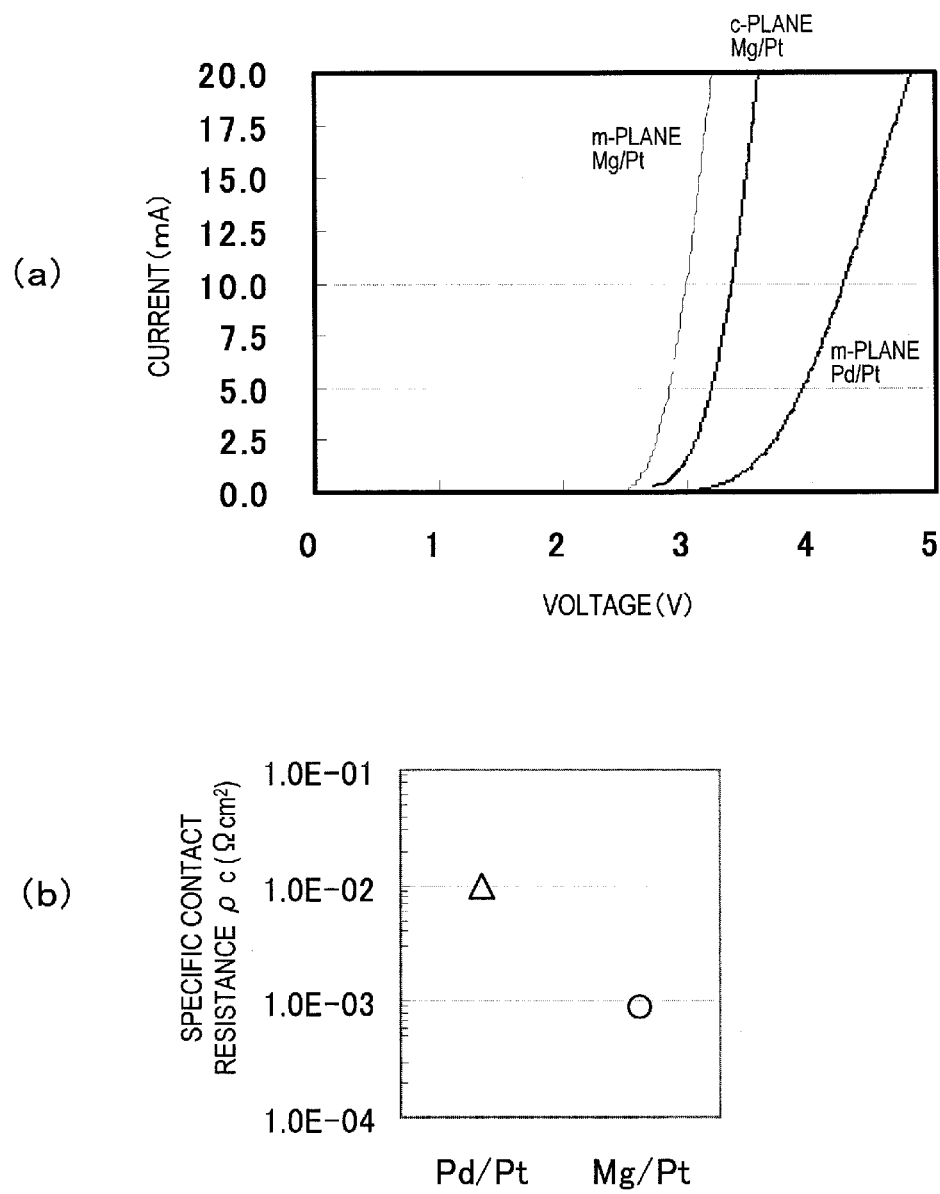
FIG. 17($a$) is a graph showing the current-voltage characteristic of a light-emitting diode that uses an electrode consisting of Mg/Pt layers and FIG. 17($b$) is a graph showing the contact resistance value of the light-emitting diode.

FIG. 17(a) shows the current-voltage characteristic of a light-emitting diode that uses an electrode consisting of Mg/Pt layers on m-plane GaN. For your reference, the characteristics of comparative light-emitting diodes that have the same LED nitride-based semiconductor structure but that use an electrode consisting of Pd/Pt layers and an electrode consisting of Mg/Pt layers on a c-plane GaN, respectively, are also shown in FIG. 17(a). The electrode structures and heat treatment conditions for these three types of light-emitting diodes are summarized in the following Table 4:

TABLE 4

| Plane orientation | p-electrode | Thickness (before heat treatment) | Heat treatment temperature and duration |
|---|---|---|---|
| m-plane | Mg/Pt | 7 nm/75 nm | 600° C., 10 min. |
| m-plane | Pd/Pt | 40 nm/35 nm | 500° C., 10 min. |
| c-plane | Mg/Pt | 7 nm/75 nm | 600° C., 10 min. |

In each of these light-emitting diodes, an n-type GaN layer, an active layer in which three InGaN well layers and two GaN barrier layers are alternately stacked one upon the other, and a p-type GaN layer are stacked in this order on either an m-plane GaN substrate or a c-plane GaN substrate. In addition, on the p-type GaN layer, arranged as a p-electrode is either an Mg/Pt electrode or a Pd/Pt electrode. On the other hand, an n-electrode is formed on the n-type GaN layer by etching the p-type GaN layer and the active layer and exposing the n-type GaN layer.

As can be seen easily from FIG. 17(a), even if the voltage is increased from zero volts, the current value will still remain substantially zero for a while. However, once the applied voltage exceeds a certain level (which will be referred to herein as a "rise voltage"), the current value increases with the voltage. The electrode consisting of Pd/Pt layers (on the m-plane GaN) has a rise voltage of approximately 3.1 V. On the other hand, the electrode consisting of Mg/Pt layers (on the m-plane GaN) has a rise voltage of approximately 2.5 V, which is lower than the former one. It can be seen that the operating voltage for a current value of 20 mA was lower in the electrode consisting of the Mg/Pt layers by 1.5 volts or more than in the electrode consisting of the Pd/Pt layers.

Next, a light-emitting diode that uses an electrode consisting of Mg/Pt layers on m-plane GaN (which will be referred to herein as an "m-plane light-emitting diode") and a light-emitting diode that uses an electrode consisting of Mg/Pt layers on c-plane GaN (which will be referred to herein as a "c-plane light-emitting diode") will be compared to each other. The m-plane light-emitting diode had a lower rise voltage than the c-plane light-emitting diode, which allowed us to confirm that the contact resistance was certainly reduced. In the m-plane light-emitting diode, for example, a current value of 20 mA could be obtained for a drive voltage of 3.2 V. As for the c-plane light-emitting diode, on the other hand, a current value of 4.8 mA was achieved for the same drive voltage. Since the optical power of a light-emitting diode will depend on the current value, it can be seen that the optical power produced by the m-plane light-emitting diode was approximately four times as much as the one produced by the c-plane light-emitting diode at a drive voltage of 3.2 V.

Also, the gradient of the curve representing the current-voltage characteristic is steeper in the device with the Mg/Pt electrode than in the device with the Pd/Pt electrode. Generally speaking, a light-emitting diode is a diode that has a p-n junction inside. And a curve representing the current-voltage characteristic of a p-n junction diode is generally approximated by the following equation:

$$I = I_0 \exp(V/n \cdot KT).$$

Here, I is the value of current flowing through the p-n junction diode, $I_0$ is the current constant, V is the applied voltage, K is the Boltzmann constant, T is the temperature, n is a value representing the degree of idealness of the diode. Since the experiments were carried out at room temperature, $KT=0.25$ V.

The n value of a p-n junction diode is determined by the gradient of a curve representing the current-voltage characteristic. In an ideal p-n junction diode, n=1. In an actual p-n junction diode, however, the n value is different from one. But the closer to one the n value, the better. According to the results of experiments the present inventors carried out, n=1.4 in the device with the Mg/Pt electrode and n=2.2 in the device with the Pd/Pt electrode. As can be seen from these results, a good diode characteristic is realized by using the Mg/Pt electrode.

As shown in FIG. 17(b), the light-emitting diode with the electrode consisting of Mg/Pt layers had a contact resistance of $3.8 \times 10^{-4}$ $\Omega \text{cm}^2$. Such a contact resistance value on the order of $10^{-4}$ means a particularly outstanding effect. The present inventors discovered that the power dissipation could be reduced significantly as a result. On the other hand, an electrode consisting of Pd/Pt layers had a contact resistance of approximately $1 \times 10^{-2}$ $\Omega \text{cm}^2$.

Figure 18:
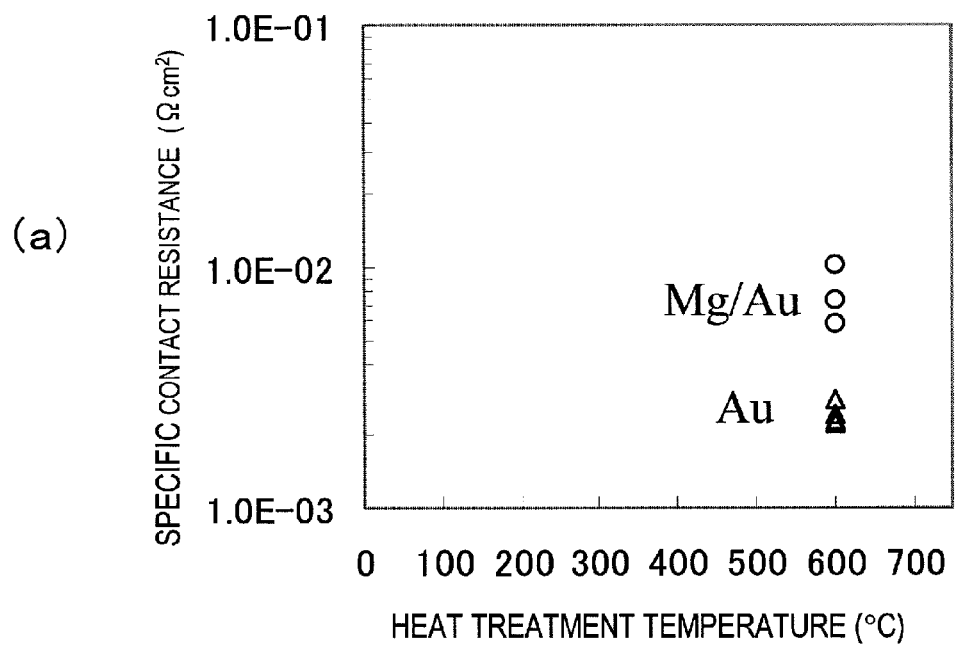
FIG. 18($a$) is a graph showing the specific contact resistances of an electrode consisting of an Au layer and an electrode consisting of Mg/Au layers and FIGS. 18($b$) and 18($c$) are optical microscope photographs representing the surface of the electrode consisting of Mg/Au layers and that of the electrode consisting of an Au layer, respectively, as substitutes for drawings.
Figure 18:
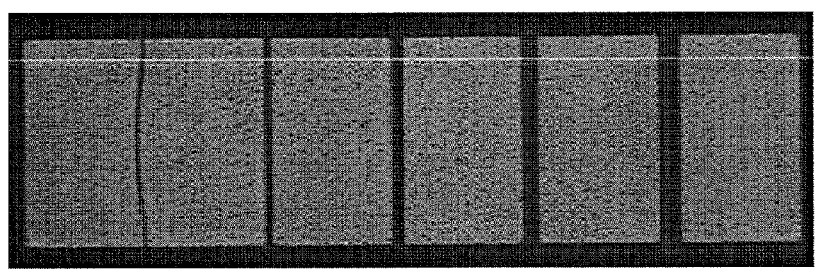
Figure 18:
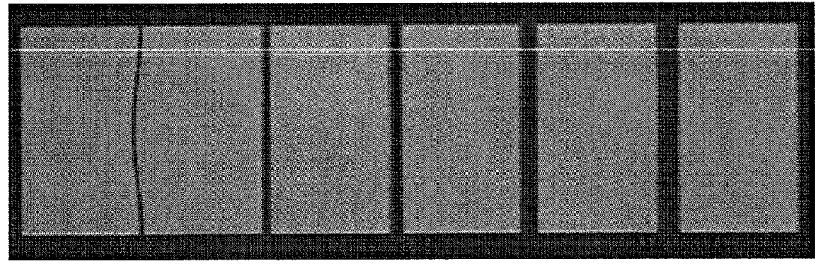

Next, examples that used an electrode consisting of an Au layer and an electrode consisting of Mg/Au layers will be described as comparative examples with reference to FIG. 18. Specifically, FIG. 18(a) shows the specific contact resistances ($\Omega \cdot \text{cm}^2$) of such an electrode consisting of an Au layer and such an electrode consisting of Mg/Au layers that were formed on an m-plane GaN layer. It should be noted that these specific contact resistances were measured after the electrode had been formed and thermally treated.

As can be seen from the results shown in FIG. 18(a), the specific contact resistance characteristic deteriorated with the electrode consisting of the Mg/Au layers compared to a situation where the electrode consisting of the Au layer was used. These results sharply disagree with the performance improvement achieved by an electrode with the structure of this preferred embodiment (consisting of Mg/Pt layers, for example). As described above, Mg is an electrode that gets easily oxidized when exposed to water or the air. That is why not an electrode consisting of only an Mg layer but an electrode as a stack of Mg/Au layers is one of the structures that could be used. Actually, however, the contact resistance of the Mg/Au layers was higher than that of the Au layer, and therefore, the contact characteristic of the former structure was worse than that of the latter. In other words, considering that the results achieved by the stack of Mg and Au layers were unsatisfactory, the good contact resistance characteristic realized by the structure of this preferred embodiment (consisting of Mg/Pt layers, for example) would have been a totally unexpected effect for those skilled in the art.

FIG. 18(b) is a photograph representing the surface of a thermally treated electrode consisting of Mg/Au layers as a substitute for a drawing, while FIG. 18(c) is a photograph representing the surface of a thermally treated electrode consisting of an Au layer as a substitute for a drawing. Comparing these photographs to each other, the present inventors discovered that the electrode consisting of the Mg/Au layers had inferior film quality to the electrode consisting of only the Au layer.

Figure 19:
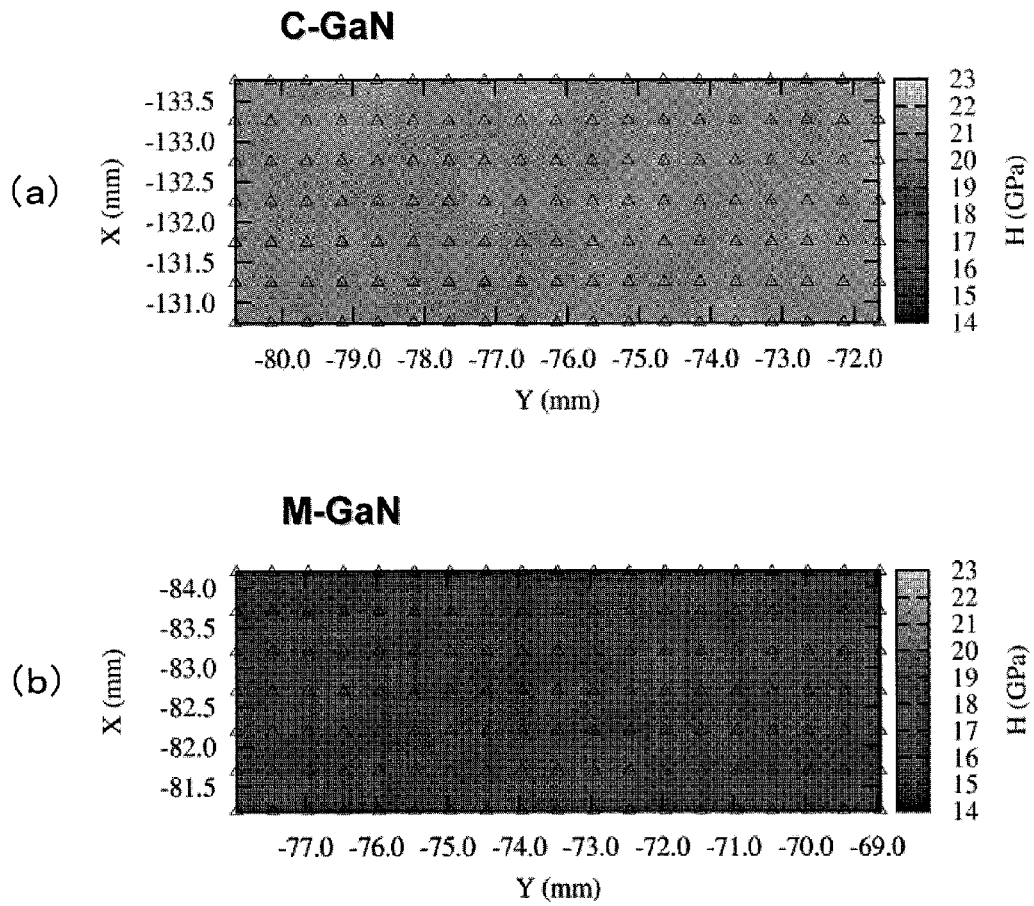
FIGS. 19($a$) and 19($b$) are graphs showing the results of hardness mapping that was carried out on a c-plane GaN substrate and an m-plane GaN substrate, respectively.

Next, look at FIG. 19, which illustrates the results of hardness mapping by a conical chip (5 mN, 1 μm conical). Specifically, FIG. 19(a) shows the results that were obtained on a c-plane GaN substrate (C—GaN), while FIG. 19(b) shows the results that were obtained on an m-plane GaN substrate (M-GaN). Comparing these results to each other, the present inventors discovered that the m-plane GaN substrate had the lower hardness than the c-plane GaN substrate. Such a difference in physical property between the m- and c-plane GaN substrates could have affected the characteristic of the electrode structure (consisting of Mg/Pt layers, for example) of this preferred embodiment.

While the present invention has been described with respect to preferred embodiments thereof, this invention is in no way limited to those specific preferred embodiments but could be modified in numerous ways and may assume many embodiments other than those specifically described above.

Even though its structure is essentially different from the preferred embodiment of the present invention, related structures are also disclosed in Patent Documents 3 and 4. However, those Patent Documents 3 and 4 do not mention at all that the crystallographic-plane of their gallium nitride-based semiconductor layer is an m-plane but just disclose a technique for forming an electrode on a c-plane gallium nitride-based semiconductor layer. More specifically, Patent Document 3 discloses a structure in which an Au layer is stacked on an Mg layer. And even if an electrode with such a multilayer structure were formed on an m-plane, the effect of the electrode of this preferred embodiment would never be achieved. Meanwhile, Patent Document 4 mentions metal layers of Ni, Cr and Mg but discloses only a specific example about an electrode structure that uses an Ni layer as the lower layer. Both of these Patent Documents 3 and 4 relate to an electrode structure that has been formed on a c-plane gallium nitride-based semiconductor layer and teach neither a problem nor a solution about the contact resistance with respect to an m-plane gallium nitride-based semiconductor layer.

An actual surface (principal surface) of the m-plane semiconductor layer does not need to be perfectly parallel to the m-plane but may be inclined from the m-plane by a small angle (which is greater than 0° and smaller than) ±1°. Forming a substrate or semiconductor layer which has a surface perfectly parallel to the m-plane is difficult in view of the manufacturing techniques. Thus, when an m-plane substrate or m-plane semiconductor layer is formed using the existing manufacturing techniques, a surface actually formed would inevitably be inclined from the ideal m-plane. The angle and azimuth of the inclination varies depending on the manufacturing process, and therefore, precisely controlling the inclination angle and inclination azimuth of the surface is difficult. Note that the surface (principal surface) of the substrate or semiconductor is sometimes intentionally inclined from the m-plane by an angle of 1° or greater. A gallium nitride-based compound semiconductor light-emitting device in an embodiment which will be described below has a p-type semiconductor region whose principal surface is inclined from the m-plane by an angle of 1° or greater.

Another Embodiment

Figure 20:
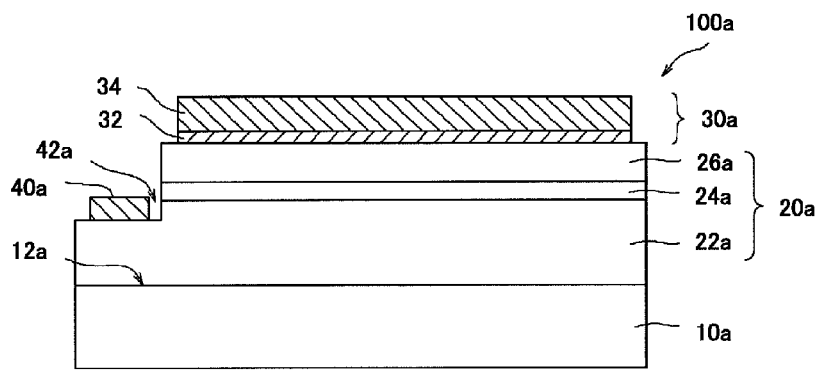
FIG. 20 is a cross-sectional view showing a gallium nitride-based compound semiconductor light-emitting device 100$a$ according to another embodiment of the present invention.

FIG. 20 is a cross-sectional view showing a gallium nitride-based compound semiconductor light-emitting device 100a of the present embodiment. To form a p-type semiconductor region whose principal surface is inclined from the m-plane by an angle of 1° or greater, the gallium nitride-based compound semiconductor light-emitting device 100a of the present embodiment includes a GaN substrate 10a whose principal surface is inclined from the m-plane by an angle of 1° or greater. A substrate whose principal surface is inclined from the m-plane by an angle of 1° or greater is commonly called "off-substrate". The off-substrate can be formed by performing the step of slicing off a substrate from a monocrystalline ingot and polishing the surface of the substrate such that the surface intentionally inclined in a specific azimuth from the m-plane is used as the principal surface. On the GaN substrate 10a, a semiconductor multilayer structure 20a is formed. The semiconductor layers 22a, 24a, 26a shown in FIG. 20 have a principal surface which is inclined from the m-plane by an angle of 1° or greater. This is because, when respective semiconductor layers are stacked on the inclined principal surface of the substrate, the surfaces (principal surfaces) of these semiconductor layers are also inclined from the m-plane. The GaN substrate 10a may be replaced by, for example, a sapphire substrate or SiC substrate whose surface is inclined in a specific direction from the m-plane. However, the configuration of the present invention only requires that at least the surface of the p-type semiconductor region should be inclined from the m-plane by an angle of 1° or greater.

Next, details of the inclination of the p-type semiconductor region in the present embodiment are described with reference to FIGS. 21 to 25.

Figure 2:
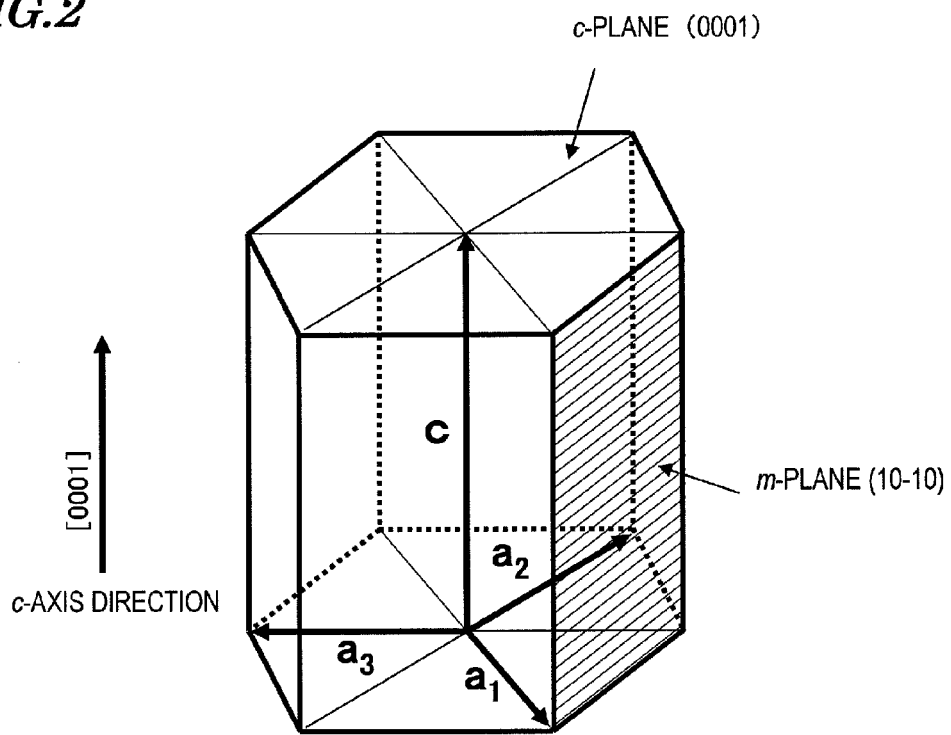
FIG. 2 is a perspective view showing four primitive vectors $a_1$, $a_2$, $a_3$ and c representing a wurtzite crystal structure.
Figure 21:
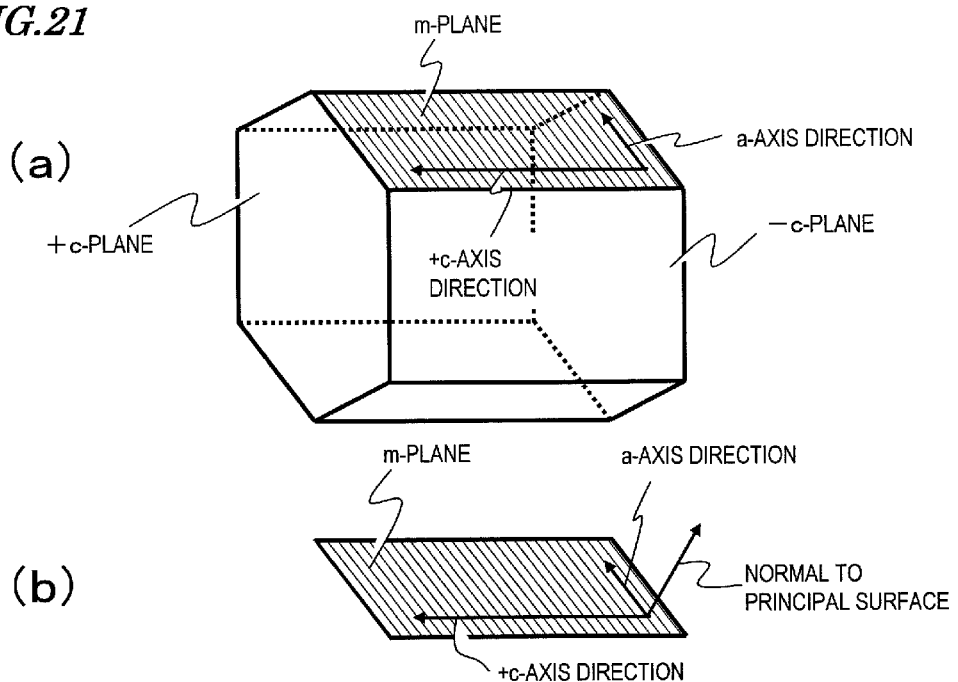
FIG. 21($a$) schematically shows the crystalline structure of the GaN-based compound semiconductor (wurtzite crystal structure).

FIG. 21(*a*) schematically shows the crystalline structure of the GaN-based compound semiconductor (wurtzite crystal structure), corresponding to 90° rotation of the crystalline structure of FIG. 2. The c-planes of the GaN crystal include a +c-plane and a −c-plane. The +c-plane is a (0001) plane over which Ga atoms are exposed and is referred to as "Ga plane". On the other hand, the −c-plane is a (000-1) plane over which N (nitrogen) atoms are exposed and is referred to as "N plane". The +c-plane and the −c-plane are parallel to each other. Both of these planes are perpendicular to the m-plane. The c-planes have polarity and therefore can be classified into the +c-plane and the −c-plane. Classifying the a-plane that is a non-polar plane into the +a-plane and the −a-plane is nonsensical.

The +c-axis direction shown in FIG. 21(*a*) is a direction perpendicularly extending from the −c-plane to the +c-plane. On the other hand, the a-axis direction corresponds to the unit vector $a_2$ of FIG. 2 and is oriented in [−12-10] direction that is parallel to the m-plane. FIG. 21(*b*) is a perspective view illustrating the relationship among the normal to the m-plane, the +c-axis direction, and the a-axis direction. The normal to the m-plane is parallel to the [10-10] direction. As shown in FIG. 21(*b*), the normal to the m-plane is perpendicular to both the +c-axis direction and the a-axis direction.

The inclination of the principal surface of the GaN-based compound semiconductor layer from the m-plane by an angle of 1° or greater means that the normal to the principal surface of the semiconductor layer is inclined from the normal to the m-plane by an angle of 1° or greater.

Figure 22:
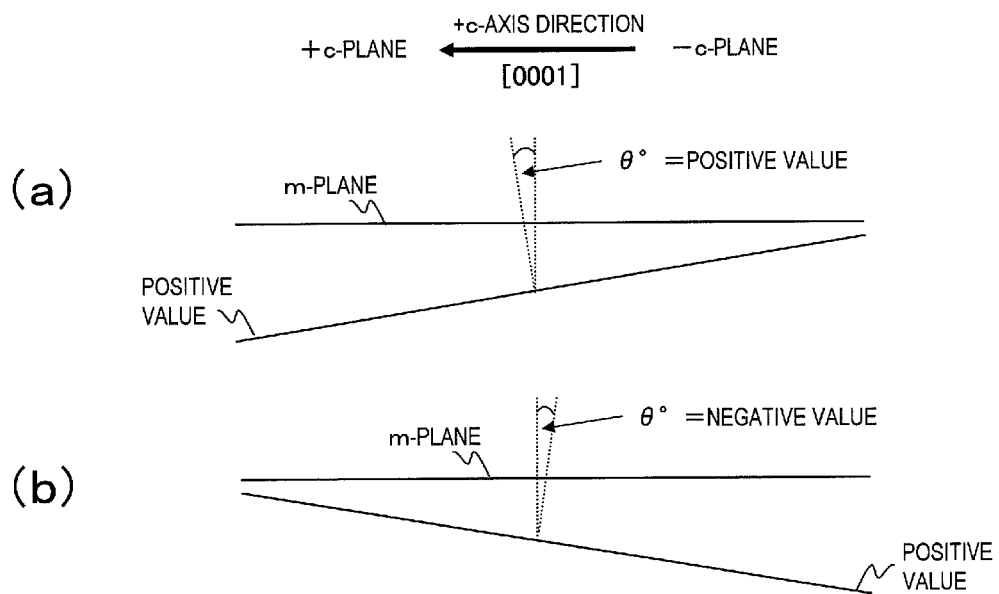
FIGS. 22($a$) and 22($b$) are cross-sectional views which illustrate the positional relationship between the principal surface of the GaN-based compound semiconductor layer and the m-plane.

Next, refer to FIG. 22. FIGS. 22(*a*) and 22(*b*) are cross-sectional views which illustrate the relationship between the principal surface of the GaN-based compound semiconductor layer and the m-plane. These diagrams are cross-sectional views which are perpendicular to both the m-plane and the c-plane. In FIG. 22, an arrow which represents the +c-axis direction is shown. As shown in FIG. 22, the m-plane is parallel to the +c-axis direction. Therefore, a normal vector of the m-plane is perpendicular to the +c-axis direction.

In the examples shown in FIGS. 22(*a*) and 22(*b*), the normal vector of the principal surface of the GaN-based compound semiconductor layer is inclined in the c-axis direction from the normal vector of the m-plane. More specifically, in the example of FIG. 22(*a*), the normal vector of the principal surface is inclined toward the +c-plane side. In the example of FIG. 22(*b*), the normal vector of the principal surface is inclined toward the −c-plane side. In this specification, the inclination angle of the normal vector of the principal surface relative to the normal vector of the m-plane (inclination angle θ) in the former case is represented by a positive value, and the inclination angle θ in the latter case is represented by a negative value. In any of these cases, the statement that "the principal surface is inclined in the c-axis direction" holds true.

Figure 23:
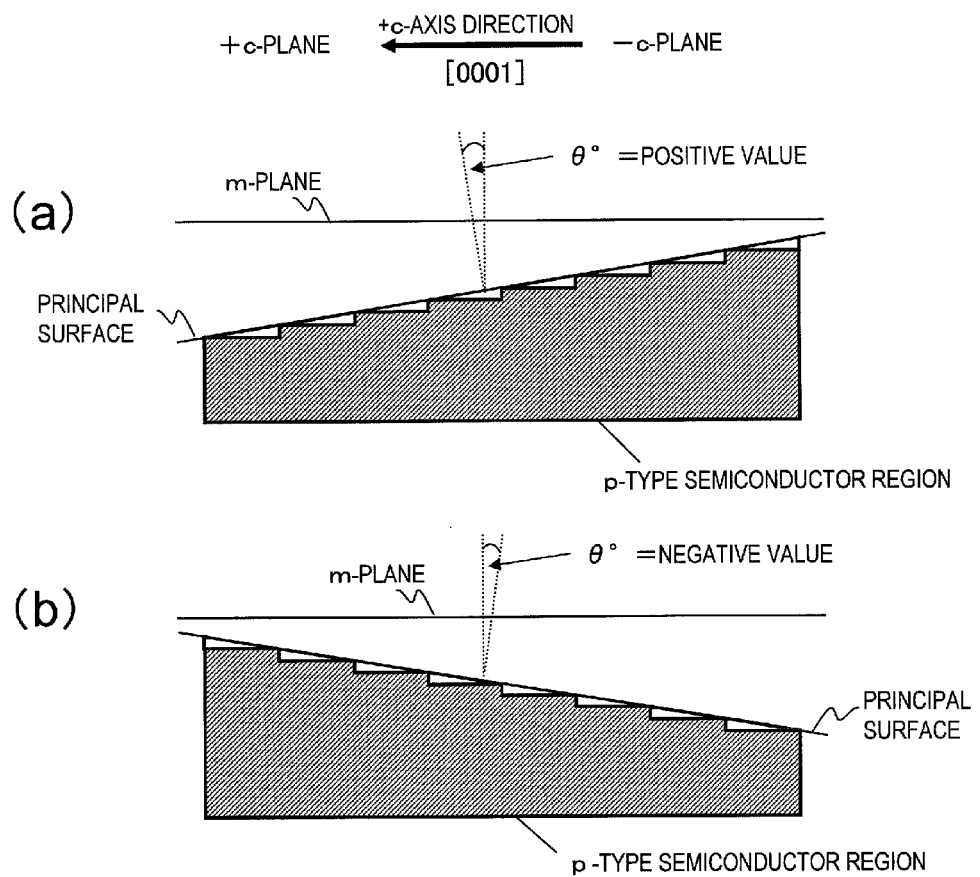
FIGS. 23($a$) and 23($b$) are cross-sectional views each schematically showing the principal surface of the p-type GaN-based compound semiconductor layer and its neighboring region.

In this embodiment, the inclination angle of the p-type semiconductor region is in the range of 1° to 5° or in the range of −5° to −1°. In this case, the effects of the present invention can also be provided as well as in the case where the inclination angle of the p-type semiconductor region is greater than 0° and smaller than ±1°. Hereinafter, the reasons for this are described with reference to FIG. 23. FIGS. 23(a) and 23(b) are cross-sectional views corresponding to FIGS. 22(a) and 22(b), respectively, showing a neighboring region of the principal surface in the p-type semiconductor region which is inclined in the c-axis direction from the m-plane. When the inclination angle θ is 5° or smaller, the principal surface in the p-type semiconductor region has a plurality of steps as shown in FIGS. 23(a) and 23(b). Each step has a height equivalent to a monoatomic layer (2.7 Å). The steps are parallel to each other with generally equal intervals (30 Å or more). With such an arrangement of the steps, it can be said that the principal surface as a whole is inclined from the m-plane. However, upon closer observation, a large number of m-plane regions are exposed over the principal surface.

Figure 24:
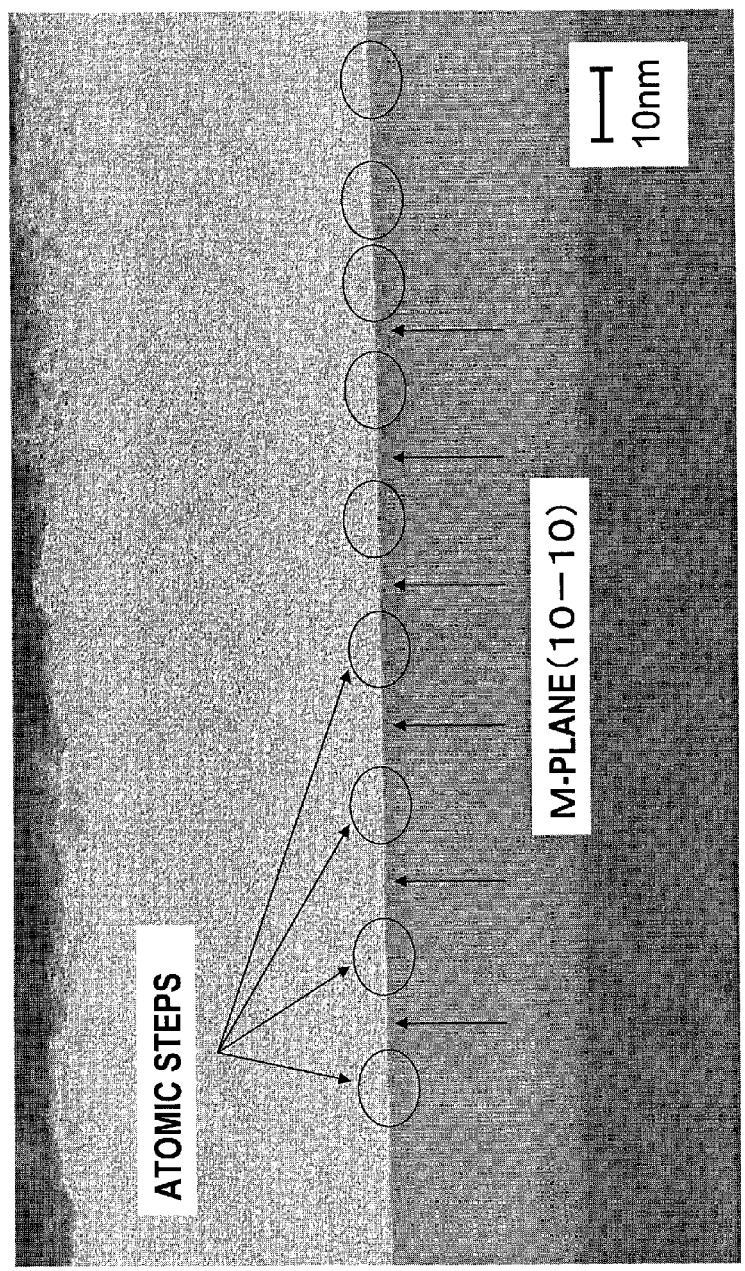
FIG. 24 is a cross-sectional TEM image of a p-type semiconductor region which is inclined from the m-plane in the −c-axis direction by 1°.

FIG. 24 is a cross-sectional TEM image of a p-type semiconductor region which is inclined from the m-plane in the −c-axis direction by 1°. It is seen that the m-plane clearly appears over the surface of the p-type semiconductor region, and the inclination is formed by atomic steps. The reason why the surface of the GaN-based compound semiconductor layer whose principal surface is inclined from the m-plane has such a configuration is that the m-plane as a crystalline plane is intrinsically very stable. It is inferred that basically the same phenomenon would occur even when the inclination direction of the normal vector of the principal surface is directed to a plane orientation different from the +c-plane and the −c-plane. When the normal vector of the principal surface is inclined in for example the a-axis direction, basically the same phenomenon occurs so long as the inclination angle is in the range of 1° to 5°.

It is thus inferred from the above that, even when the surface (principal surface) of the p-type gallium nitride compound semiconductor layer is inclined from the m-plane by an angle of 1° or greater, the contact resistance would not depend on the inclination angle because the surface which is in contact with the p-electrode has a number of exposed m-plane regions.

Figure 25:
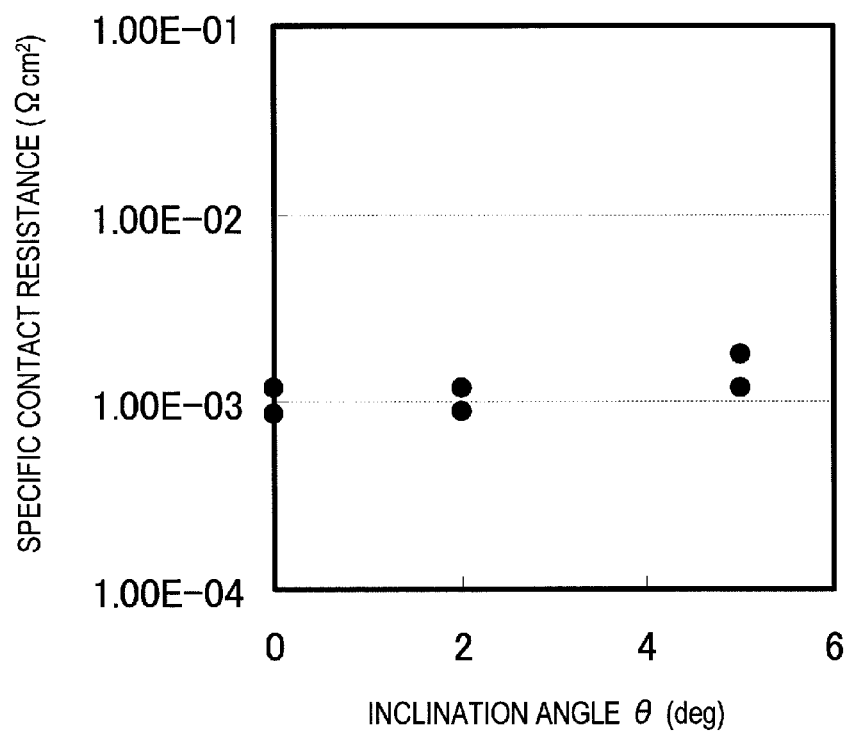
FIG. 25 is a graph which illustrates the results of measurement of the contact resistance ($\Omega \cdot cm^2$) of an electrode of Mg/Pt layers formed on a p-type semiconductor region which is inclined from the m-plane in the −c-axis direction by 0°, 2°, or 5°.

FIG. 25 is a graph which illustrates the results of measurement of the contact resistance (Ω·cm$^2$) of an electrode of Mg/Pt layers formed on a p-type semiconductor region which is inclined from the m-plane in the −c-axis direction by 0°, 2°, or 5°. The ordinate axis of the graph represents the specific contact resistance, and the abscissa axis represents the inclination angle θ (the angle between the normal to the m-plane and the normal to the surface in the p-type semiconductor region). Note that the values of the specific contact resistance were obtained after the formation of the electrode and the heat treatment. As seen from the results of FIG. 25, if the inclination angle θ is 5° or smaller, the contact resistance has a generally constant value.

From the above, it was confirmed that, if the inclination angle of the surface of the p-type semiconductor region is 5° or smaller, the contact resistance decreases due to the configuration of the present invention.

Note that, when the absolute value of the inclination angle θ is greater than 5°, the internal quantum efficiency deteriorates due to a piezoelectric field. As such, if the piezoelectric field frequently occurs, realizing a semiconductor light-emitting device by means of m-plane growth has a small significance. Thus, according to the present invention, the absolute value of the inclination angle θ is limited to 5° or smaller. However, even when the inclination angle θ is set to for example 5°, the actual inclination angle θ may deviate from 5° by about ±1° due to variations in fabrication. Completely removing the variations in fabrication is difficult, while such a small angle deviation would not interrupt the effects of the present invention.

Other Embodiments

Figure 26:
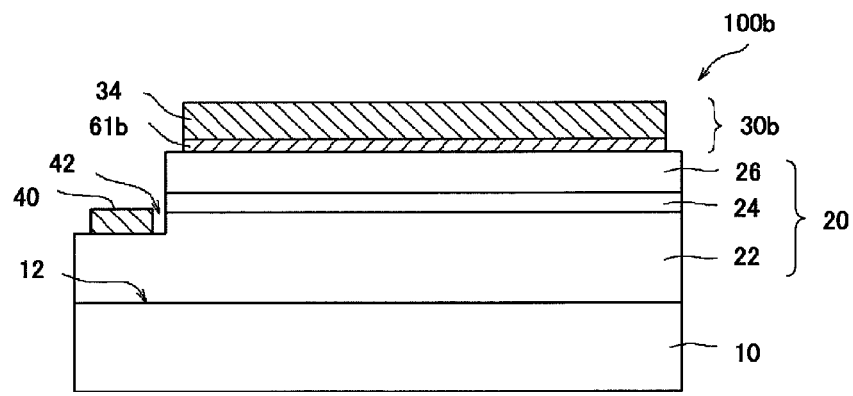
FIG. 26 is a cross-sectional view showing a gallium nitride-based semiconductor light-emitting device 100b according to another embodiment of the present invention.

FIG. 26 is a cross-sectional view showing a gallium nitride-based compound semiconductor light-emitting device 100b of the present embodiment. The gallium nitride-based compound semiconductor light-emitting device 100b is the same as the gallium nitride-based compound semiconductor light-emitting device 100 shown in FIG. 3 in terms of the basic configuration, although it is characterized in that a p-electrode provided on the p-type semiconductor region includes an Mg alloy layer 61b.

In the Mg alloy layer 61b, a metal, such as Pt, is contained in Mg at a concentration of a few percent (e.g., 1%) or higher. Provided on the Mg alloy layer 61b is a metal layer 34. At least part of the metal layer 34 may be formed of an alloy.

Figure 27:
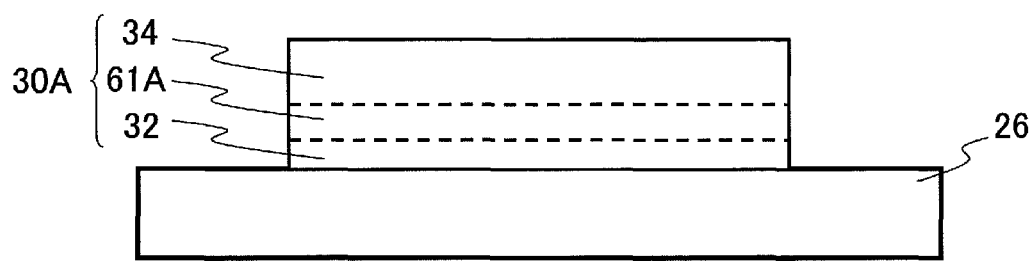
FIGS. 27(a) to 27(c) are diagrams schematically showing the distribution of Mg and Pt in the electrode.
Figure 27:
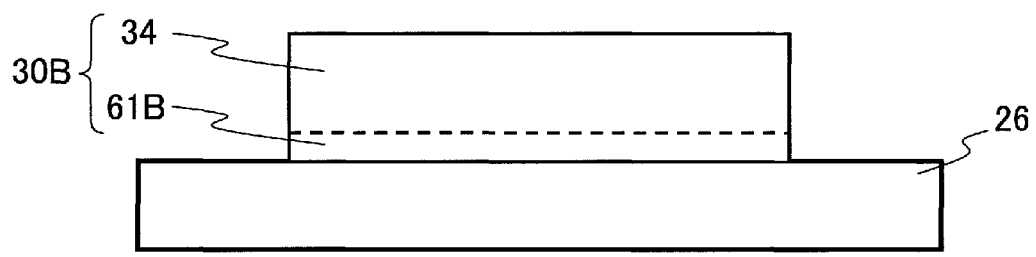
Figure 27:
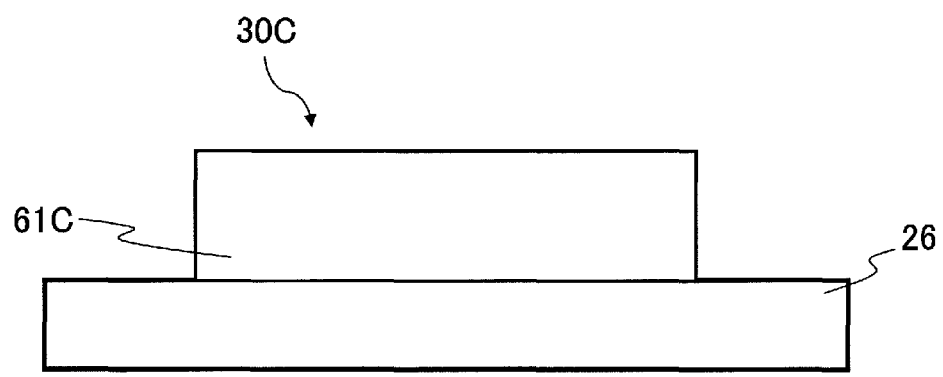

FIGS. 27(a) to 27(c) are diagrams for illustrating the process of alloying the Mg layer 32 and the metal layer 34. FIG. 27(a) shows a state of the structure in which the Mg layer 32 and the metal layer 34 have been partially alloyed. In this case, as shown in FIG. 27(a), the electrode 30A includes the Mg layer 32 that is in contact with the Al$_d$Ga$_e$N layer 26, an Mg alloy layer 61A lying over the Mg layer 32, and the metal layer 34 lying over the Mg alloy layer 61A. The Mg alloy layer 61A is formed of an alloy of Mg and a metal that forms the metal layer 34.

FIG. 27(b) shows a state of the structure in which alloying of Mg and the metal that forms the metal layer has advanced such that the alloyed portion is in contact with the Al$_d$Ga$_e$N layer 26. In the state shown in FIG. 27(b), the lower part of the electrode 30B (a portion of the electrode 30B which is in contact with the Al$_d$Ga$_e$N layer 26) is formed by an Mg alloy layer 61B. In the example of the electrode 30B shown in FIG. 27(b), the metal layer 34 is lying over the Mg alloy layer 61B.

FIG. 27(c) shows a state of the electrode 30C in which the Mg layer and the metal layer have been entirely alloyed. In this state, the electrode 30C is composed only of an Mg alloy layer 61C.

The Mg alloy layers 61A, 61B, and 61C shown in FIGS. 27(a) to 27(c) are made of Mg and the metal that forms the metal layer 34 (i.e., the major constituents are Mg and the metal that forms the metal layer 34). The structures shown in FIGS. 27(a) to 27(c) may preferably be formed by depositing at least one metal selected from the group consisting of Pt, Mo, Pd, and Ag on an Mg layer and thereafter performing a heat treatment on these layers. With a relatively high heat treatment temperature and a relatively long heat treatment duration, the Mg layer is more likely to be alloyed.

Note that the structure shown in FIG. 27(c) may be formed by performing a vapor deposition using a mixture or compound of the metal that forms the metal layer 34 and Mg as a source material and thereafter performing a heat treatment on the deposited material.

Note that, herein, the "Mg alloy layers 61A, 61B, and 61C" may include a group of a number of Mg alloy islands that are present over the surface of the p-type semiconductor region 26. Alternatively, the "Mg alloy layers 61A, 61B, and 61C" may be formed by a film which has a plurality of openings (e.g., a porous film).

The present inventors disclosed in a prior application (Japanese Patent Application No. 2009-058272) that an electrode structure in which an Mg alloy layer is in contact with a p-type semiconductor region that has an m-plane surface exhibits a low contact resistance.

Embodiment 1 of Light-Emitting Apparatus

The above-described semiconductor light-emitting device of the present invention may be solely used as a light source. However, a nitride-based semiconductor light-emitting device of the present invention may be combined with a resin which contains a phosphoric material for wavelength conversion, or the like, and in such a case, it is preferably used as a light-emitting apparatus with an expanded wavelength range (e.g., a white light source).

Figure 28:
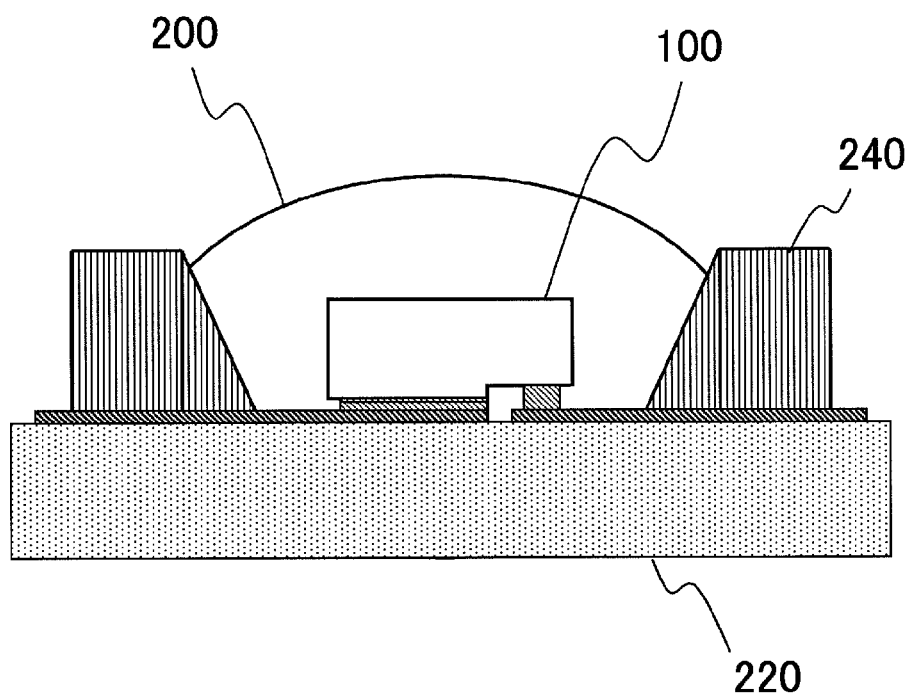
FIG. 28 is a cross-sectional view showing an embodiment of a white light source.

FIG. 28 is a schematic representation illustrating an example of such a white light source. The light-emitting apparatus shown in FIG. 28 includes a light-emitting device 100 with the structure shown in FIG. 3(a) and a resin layer 200 in which particles of a phosphor such as YAG (yttrium aluminum garnet) are dispersed to change the wavelength of the light emitted from the light-emitting device 100 into a longer one. The light-emitting device 100 is mounted on a supporting member 220 on which a wiring pattern has been formed. And on the supporting member 220, a reflective member 240 is arranged so as to surround the light-emitting device 100. The resin layer 200 has been formed so as to cover the light-emitting device 100.

As shown in FIG. 28, a nitride-based semiconductor light-emitting device of the present invention is suitably mounted on the supporting member 220 such that the electrode-side surface faces to the supporting member 220. Securing the device onto the supporting member 220 in such a position is commonly referred to as "flip-chip mounting". In an example of the flip-chip mounting, light is emitted through the rear surface of the substrate of the light-emitting device 100.

The present inventors conducted researches and found that securing a nitride-based semiconductor light-emitting device fabricated by means of m-plane growth onto a supporting member by flip-chip mounting may cause cracks in the nitride-based semiconductor light-emitting device, thus decreasing the fabrication yield.

To verify this phenomenon, the present inventors conducted a nano-indentation test for the purpose of comparing the rigidity of the surface of an m-plane GaN layer with the rigidity of the surface of a conventional +c-plane GaN layer. Specifically, the test of loading a diamond needle which has a nano-size tip end into the GaN layer surface (pop-in test) was carried out. The diamond needle was loaded into the GaN layer surface at different positions across the substrate plane, and a map of the measurement results across the plane was made.

Figure 29A:
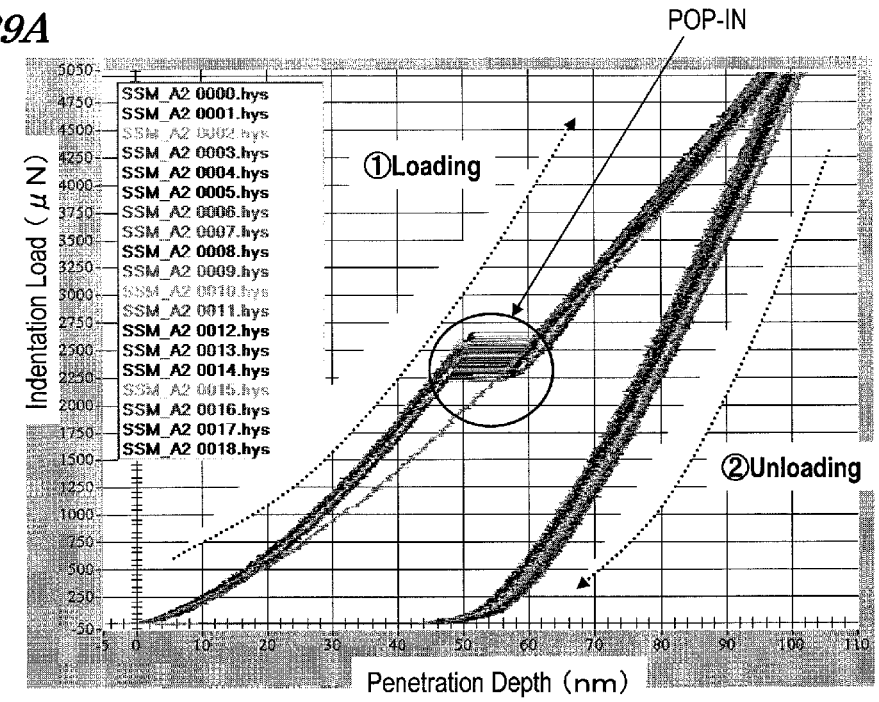
FIG. 29A is a graph which shows the results of the pop-in test over the surface of the +c-plane GaN layer.
Figure 29B:
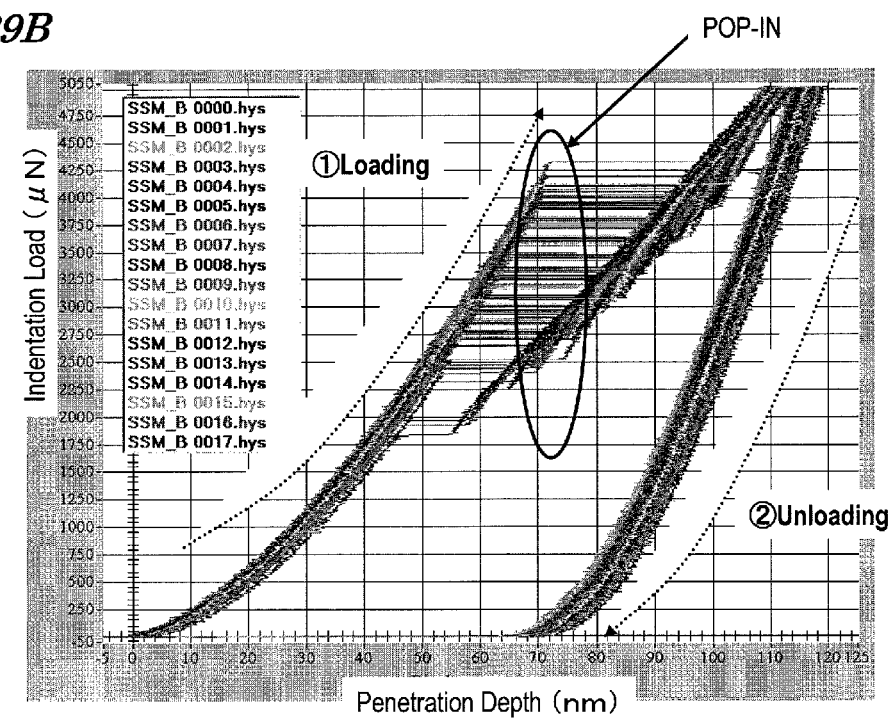
FIG. 29B is a graph which shows the results of the pop-in test over the surface of the m-plane GaN layer.

FIG. 29A is a graph which shows the results of the pop-in test over the surface of the +c-plane GaN layer. FIG. 29B is a graph which shows the results of the pop-in test over the surface of the m-plane GaN layer. The abscissa axis of the graphs represents the penetration depth [nm] of the diamond needle below the GaN layer surface. The ordinate axis represents the indentation load [pN (micronewton)] applied by the diamond needle. In the graphs of FIGS. 29A and 29B, a plurality of curves represent the measurement results at different positions.

It is seen from the graphs of FIGS. 29A and 29B that, after the load was started, the penetration depth of the needle gradually increased as the load increased. A phenomenon was observed that the penetration depth suddenly changed when the load of the needle reached a certain load. This phenomenon is herein referred to as "pop-in phenomenon". The pop-in phenomenon was observed when plastic deformation of GaN occurred. At the site where the pop-in phenomenon occurred, a "depression mark" which has the same size as the tip end of the needle was formed in the surface of the GaN layer to the depth of about 70 nm to 100 nm.

In the case of the surface of the +c-plane GaN layer of FIG. 29A, the load at which the pop-in occurred was relatively constant. In the case of the surface of the m-plane GaN layer of FIG. 29B, the load at which the pop-in occurred was varying. The crystal structure of the +c-plane GaN layer has six-fold rotational symmetry around an axis that is perpendicular to the layer. Thus, this structure readily disperse an external mechanical load exerted onto the +c-plane GaN layer and is estimated to have a uniform mechanical strength across the plane. On the other hand, the crystal structure of the m-plane GaN layer also has symmetry which is however poorer than that of the +c-plane GaN layer. Thus, it is inferred that the structure could not uniformly disperse an external mechanical load exerted onto the m-plane GaN layer, and accordingly, the pop-in results were varying. Considering these results in conjunction with the results of the rigidity mapping of FIG. 19, the surface of the m-plane GaN layer has a lower rigidity than the +c-plane GaN layer and is therefore readily deformed by a local mechanical load.

In a known flip-chip mounting process, commonly, a light-emitting device is pressed against a supporting member, such as a mounting base, while applying an ultrasonic wave to the light-emitting device. In this step, a nonuniform load is likely to be exerted on the m-plane GaN layer. Therefore, in the flip-chip mounting process, there is a risk of generation of a crack in the light-emitting device, running from a portion of the m-plane GaN layer which has a lower mechanical strength.

The presence of such a low mechanical strength portion in the surface of the m-plane GaN layer was unknown before our researches, through which the present inventors first discovered it. Also, the present inventors conducted researches and found that, when at least part of the contact electrode is formed by an Mg layer, damages to the light-emitting device can be reduced as compared with a case where the conventional contact electrode is used. As described above, when using the Mg layer, absorption of the mechanical stress caused in the mounting process and higher yield of the flip-chip mounting are achieved as well as reduction of the contact resistance against the m-plane GaN layer.

In the white light source shown in FIG. 28, even when the light-emitting device 100a, 100b is flip-chip mounted instead of the light-emitting device 100, the same effects can be achieved as those obtained when the gallium nitride-based semiconductor light-emitting device 100 is flip-chip mounted. Thus, absorption of the mechanical stress caused in the mounting process and higher yield of the flip-chip mounting can be achieved.

Hereinafter, a preferred embodiment of the light-emitting apparatus is described which can sufficiently provide the above-described effects attributed to the Mg layer or the Mg alloy layer.

Embodiment 2 of Light-Emitting Apparatus

Another embodiment of the light-emitting apparatus of the present invention is described with reference to FIG. 30.

This light-emitting apparatus includes a mounting base 260 which has metal wires 265 and a nitride-based semiconductor light-emitting device 100 flip-chip mounted on the mounting base 260. This nitride-based semiconductor light-emitting device 100 includes a nitride-based semiconductor multilayer structure which has a p-type semiconductor region that has an m-plane surface and a p-electrode 30 provided on the p-type semiconductor region. The p-type semiconductor region is made of an $Al_xIn_yGa_zN$ semiconductor (x+y+z=1, x≧0, y≧0, z≧0). The p-electrode 30 includes an Mg layer 32 that is in contact with the surface of the p-type semiconductor region and is coupled to the metal wires 265.

Hereinafter, the light-emitting apparatus of the present embodiment is further described.

Figure 3:
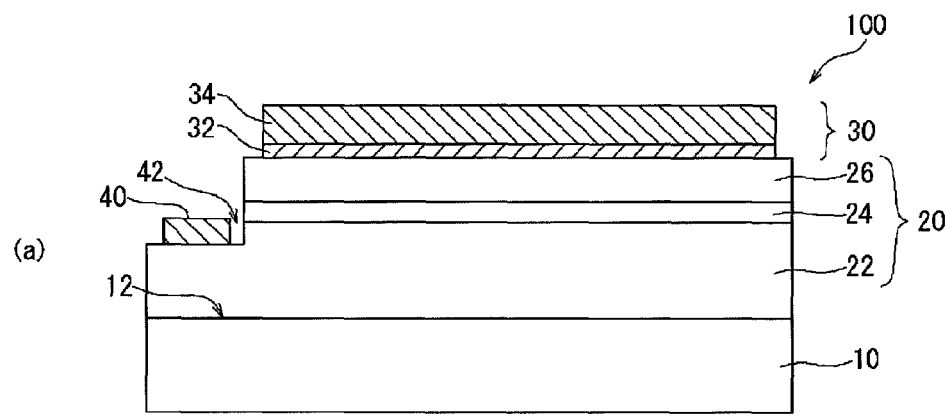
FIG. 3($a$) is a schematic cross-sectional view illustrating a nitride-based semiconductor light-emitting device 100 as a preferred embodiment of the present invention, and FIGS. 3($b$) and 3($c$) illustrate the crystal structures of an m-plane and a c-plane, respectively.
Figure 3:
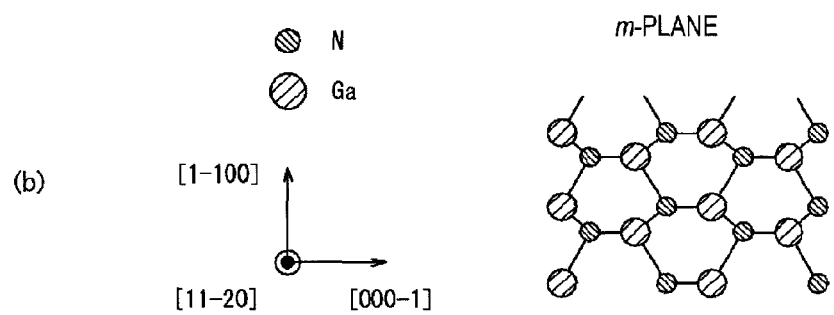
Figure 3:
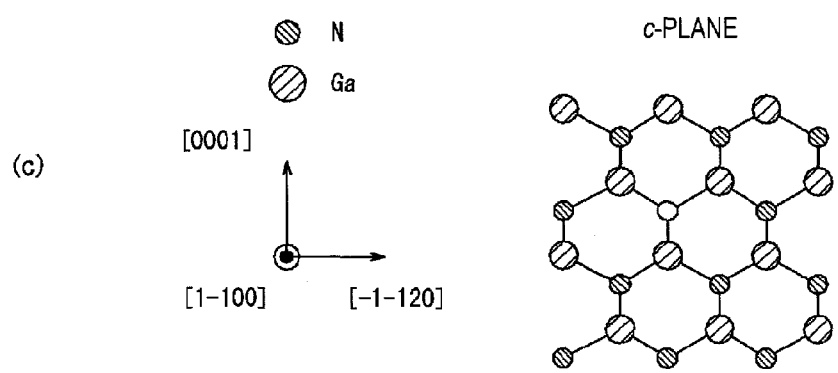
Figure 4:
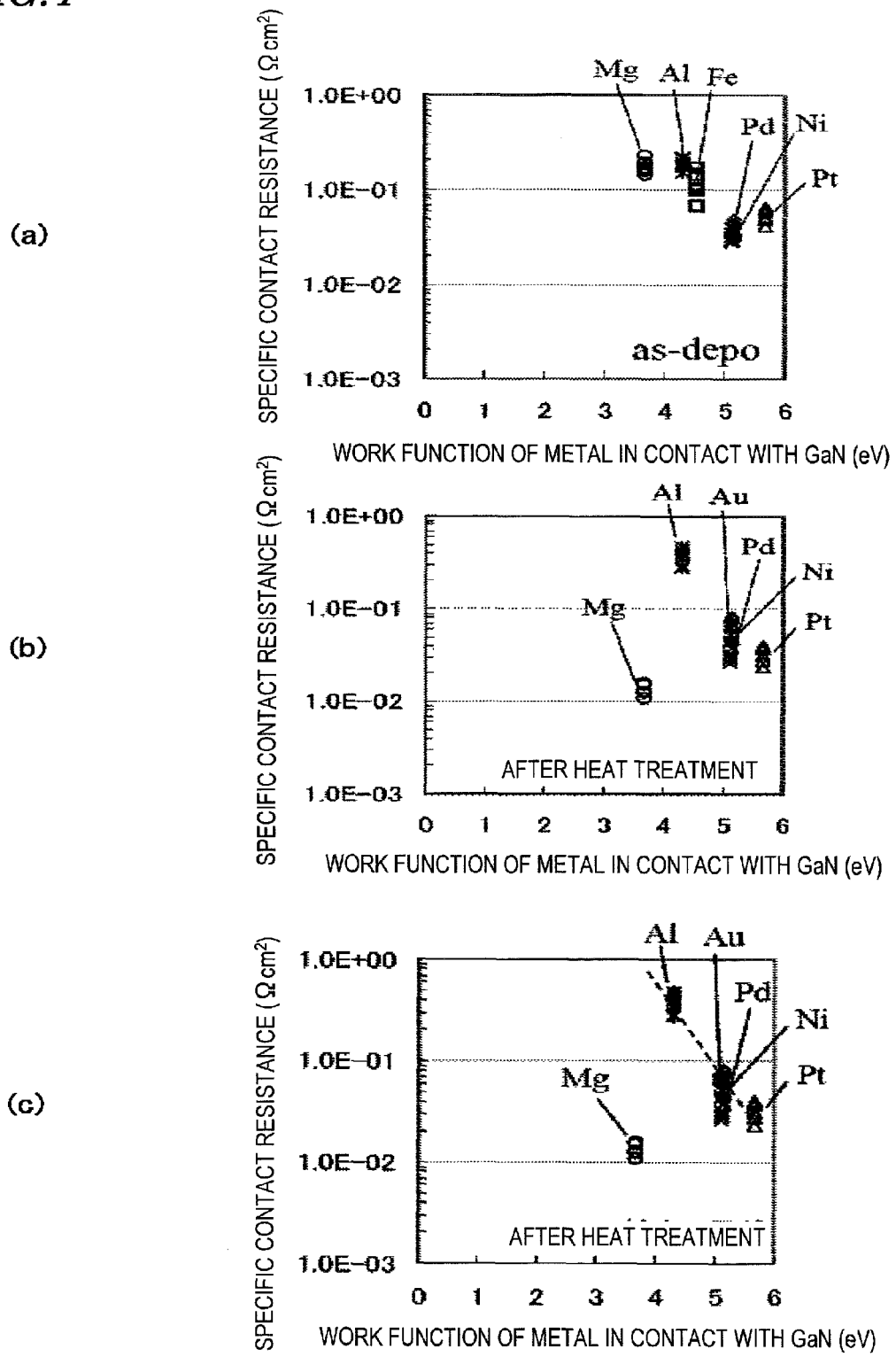
FIGS. 4($a$) through 4($c$) are graphs showing how the specific contact resistance ($\Omega \cdot cm^2$) changed with the work function (eV) of a metal that was in contact with GaN.
Figure 5:
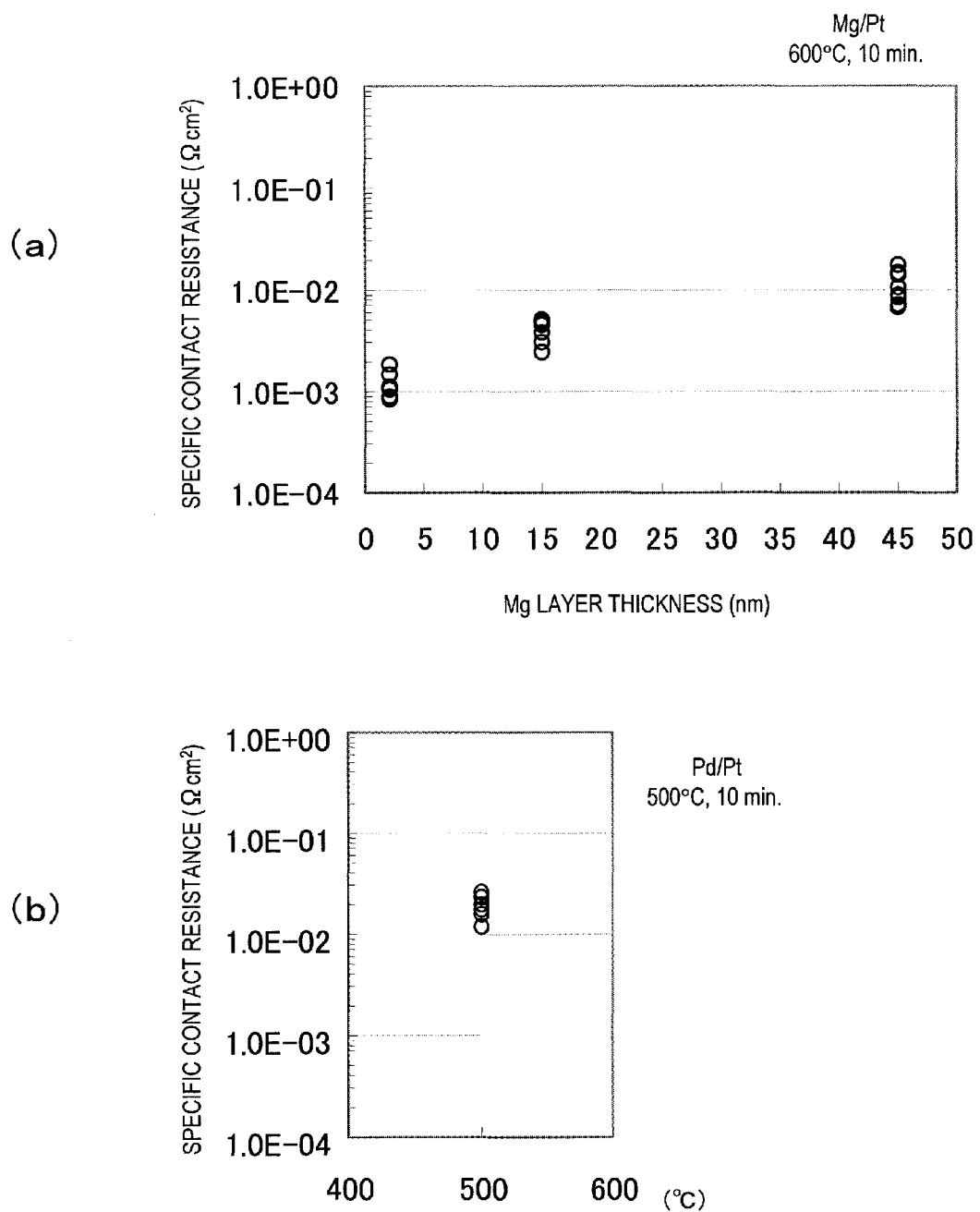
FIG. 5($a$) is a graph showing how the specific contact resistance changed with the thickness of a thermally treated Mg layer in an Mg/Pt electrode and FIG. 5($b$) is a graph showing the specific contact resistance of a Pd/Pt electrode.
Figure 6:
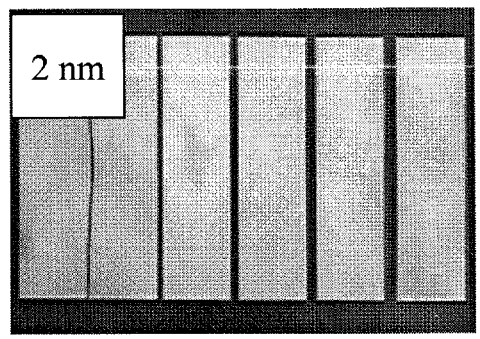
FIGS. 6($a$) through 6($c$) are photographs showing the surface states of a thermally treated electrode in situations where the Mg layer had thicknesses of 2 nm, 15 nm and 45 nm, respectively.
Figure 6:
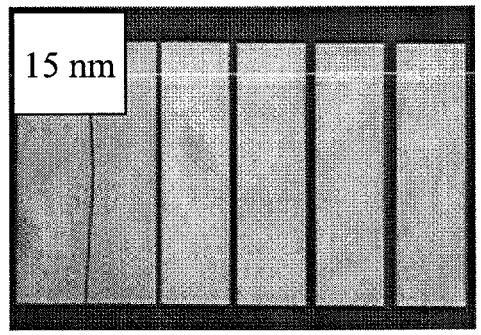
Figure 6:
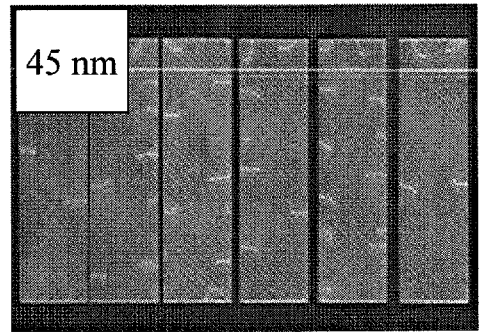

The shown light-emitting device 100 is an example of the nitride-based semiconductor light-emitting device of the present invention which has been described with reference to FIG. 3. The light-emitting device 100 includes an m-plane GaN-based substrate 10, an n-type nitride semiconductor layer 22 provided on the surface of the m-plane GaN-based substrate 10, an active layer 24 provided on the n-type nitride semiconductor layer 22, a p-type nitride semiconductor layer 26 provided on the active layer 24, an Mg layer 32 that is in contact with the p-type nitride semiconductor layer 26, a metal layer 34 that is in contact with the Mg layer 32, and an n-electrode 40 that is in contact with part of the n-type nitride semiconductor layer 22. The p-electrode 30 of the present embodiment is constituted of the Mg layer 32 and the metal layer 34. The n-electrode 40 may have a known structure. Note that, in the present embodiment, the light-emitting device 100 may be replaced by the light-emitting device 100a, 100b.

The light-emitting apparatus of the present embodiment further includes pad electrodes 110 which are respectively coupled with the p-electrode 30 and the n-electrode 40, and bumps 115 provided between these pad electrodes 110 and the metal wires 265.

Mg is particularly soft among metals and exhibits the highest vibration absorption property (the damping capacity for absorbing and dissipating the energy of vibration in the form of heat) among metals. Therefore, Mg is capable of absorbing a greater vibration and shock. Thus, the Mg layer 32 of the p-electrode 30 absorbs a mechanical stress which is imposed on the m-plane surface of the p-type nitride semiconductor layer 26 in the process of flip-chip mounting, thereby preventing generation of cracks in the substrate.

Since Mg has the property of absorbing a greater vibration and shock as previously described, only inclusion of the Mg layer 32 in the p-electrode 30 enables prevention of damages to the light-emitting device. Meanwhile, the metal layer 34 in the p-electrode 30 may be made of any metal.

Next, a method of fabricating the light-emitting apparatus of the present embodiment is described with reference to FIGS. 31(a) to 31(e).

Figure 31:
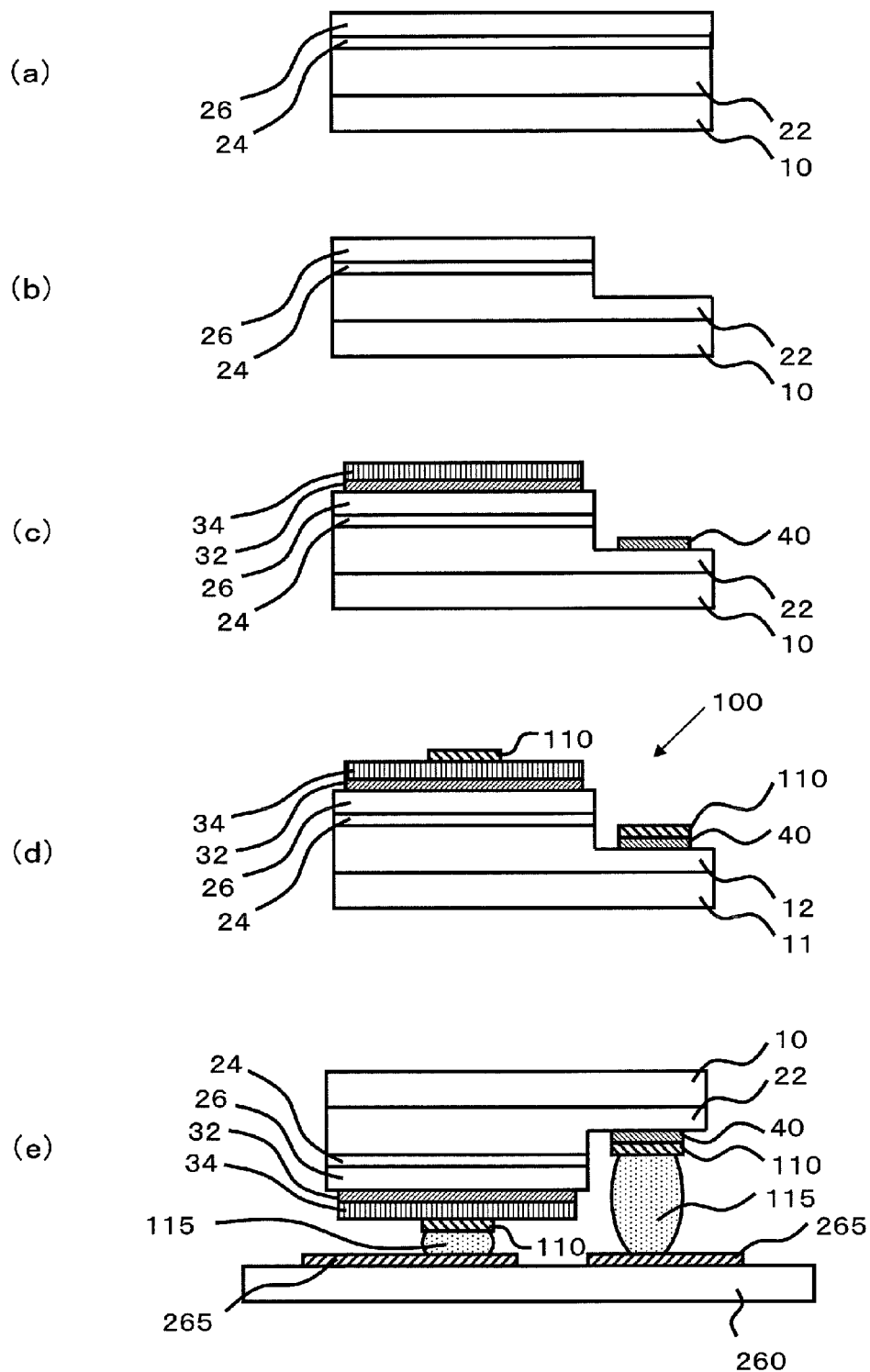
FIGS. 31(a) to 31(e) are diagrams illustrating an embodiment of a light-emitting apparatus of the present invention.

Refer to FIG. 31(a). First, the m-plane GaN-based substrate 10 is prepared. On this substrate 10, the n-type nitride semiconductor layer 22 that is made of n-type GaN of about 4 μm thick, the active layer 24, and an m-plane p-type nitride semiconductor layer 26 that is formed by a p-type GaN layer of about 500 nm thick are deposited by metalorganic chemical vapor deposition (MOCVD). The active layer 24 has a multi-quantum well structure in which InGaN quantum well layers, each having a thickness of about 3 nm to 10 nm, and GaN barrier layers, each having a thickness of about 5 nm to 20 nm, are alternately stacked. In the step of growing the semiconductor layers by means of MOCVD, the source material of Ga may be trimethylgallium, the source material of In may be trimethylindium, and the source material of Al may be trimethylaluminum. The n-type impurity used may be Si, and the p-type impurity used may be Mg.

Examples of the n-type nitride semiconductor layer 22 other than the n-type GaN layer include an n-type AlGaN layer and a multilayer film which is constituted of an n-type GaN layer and an n-type AlGaN layer. The active layer 24 may have a multi-quantum well structure which is formed by InGaN quantum well layers and InGaN barrier layers among which the content of In is different. Examples of the p-type nitride semiconductor layer 26 other than the p-type GaN layer include a p-type AlGaN layer and a multilayer film which is constituted of a p-type GaN layer and a p-type AlGaN layer.

Then, as shown in FIG. 31(b), the p-type nitride semiconductor layer 26 and the active layer 24 are partially removed to expose a region in which an n-electrode is to be formed. Specifically, the p-type nitride semiconductor layer is partially covered with an unshown resist mask, and then, the p-type nitride semiconductor layer 26 and the active layer 24 are partially removed by dry etching. The dry etching may be carried out using a chlorine gas. The depth of the etching may be, for example, about 1 μm to 1.5 μm.

Then, as shown in FIG. 31(b), the p-electrode 30 and the n-electrode 40 are formed. Specifically, first, the n-electrode 40 which has a multilayer structure is formed. The multilayer structure is constituted of a Ti layer that has a thickness of 5 nm to 20 nm, an Al layer that has a thickness of 50 nm to 100 nm, and a Pt layer that has a thickness of 5 nm to 10 nm. The n-electrode 40 may be formed by electron beam deposition. Formation of the electrode pattern may be carried out using a lift-off method. After the formation of the n-electrode layer 130, the resultant structure is subjected to a heat treatment in the range of 500° C. to 750° C. in a nitrogen atmosphere for about 10 minutes.

Then, to form the p-electrode 30, the Mg layer 32 is first deposited. As previously described, the Mg layer 32 may be formed by pulse evaporation. Since Mg is an element which is susceptible to oxidation, deposition of a Pt layer that has a thickness of about 10 nm to 200 nm immediately follows such that Mg is not exposed to the ambient air, thereby forming the metal layer 34. Formation of the electrode pattern may be carried out using a lift-off method. After the formation of the Mg layer 32 and the metal layer 34, the resultant structure is subjected to a heat treatment in the range of 400° C. to 700° C. in a nitrogen atmosphere for about 10 minutes.

In this example, the metal layer 34 is made of Pt. However, the metal layer 34 may preferably be made of at least one metal selected from the group consisting of, for example, Pt, Mo, Pd, and Ag. The p-electrode 30 preferably has a structure of high light reflectance because, in the case of flip-chip mounting, light is emitted through the rear surface of the substrate 10 of the light-emitting device 100. When the reflectance is a more important factor, the metal layer 34 is preferably formed by an Ag layer because Ag exhibits considerably high reflectance for visible light.

The Mg layer 32 lying between the p-type nitride semiconductor layer 26 and the metal layer 34 absorbs a mechanical stress which is imposed on the m-plane GaN surface in the process of flip-chip mounting, thereby preventing generation of cracks in the substrate in the mounting process. The thickness of the Mg layer 32 may be about 2 nm to 50 nm. In terms of absorption of the mechanical stress, the thickness of the Mg layer 32 is preferably 15 nm or more.

Then, as shown in FIG. 31(d), pad electrodes 110 are formed on parts of the n-electrode 40 and the p-electrode 30. The pad electrodes 110 are obtained by stacking a Ti layer that has a thickness of about 10 nm to 50 nm, a Pt layer that has a thickness of about 30 nm to 100 nm, and an Au layer that has a thickness of about 150 nm to 500 nm. Thus, the fabrication of the nitride-based semiconductor light-emitting device 100 is completed. The formation of the pad electrodes 110 may be carried out using an electron beam deposition apparatus. The pad electrodes 110 may be formed using any other material, such as W, as well as Ti, Pt, and Au.

Then, as shown in FIG. 31(e), the light-emitting device 100 is flip-chip mounted on the mounting base 260 that is made of ceramic. The mounting base 260 is not limited to a ceramic base but may be a metal base, a resin base, or the like. When a resin base is used, metal vias may be formed so as to penetrate through the resin base for the purpose of improving the heat release property. On the surface of the mounting base 260, the metal wires 265 are formed by a Cu layer and an Au layer.

The mounting step may be carried out using an ultrasonic flip-chip mounting method. First, the bumps 115 that are made of Au are attached onto the metal wires 265 provided on the mounting base 260. In this case, the positions of the bumps 115 may be determined depending on the positions of the pad electrodes 110.

Then, the light-emitting device 100 of FIG. 31(d) is mounted onto the mounting base 260 at the stage temperature of about 120° C. to 160° C. with the load applied for mounting being about 8N to 12N. In this step, according to the present embodiment, the Mg layer 32 absorbs the mounting stress caused in the mounting process, thereby reducing the probability of occurrence of cracks in the substrate. Since occurrence of cracks in the substrate can be prevented, a greater load can be applied in the mounting process. As a result, the adhesiveness between the mounting base 260 and the light-emitting device 100 can be improved.

Figure 32:
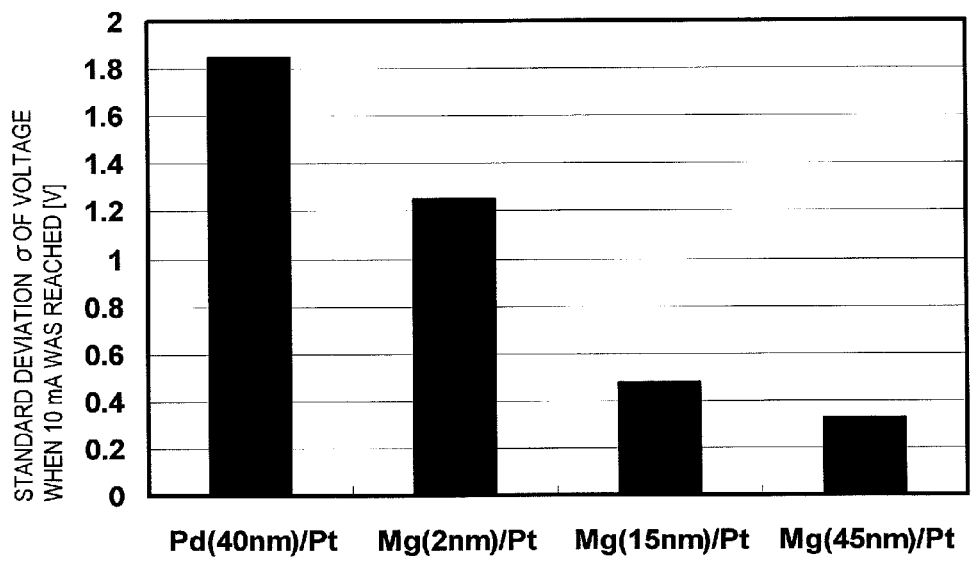
FIG. 32 is a graph showing the standard deviation of the threshold voltage of light-emitting devices among which the thickness of the Mg layer 32 is different.

We prepared the light-emitting devices in which the Mg layer 32 has different thicknesses, 2 nm, 15 nm, and 45 nm (measured after the heat treatment), 9 samples for each device, and measured the threshold voltage of the device samples. The graph of FIG. 32 shows the standard deviation of the measured threshold voltage of the respective light-emitting devices for the sake of comparison. The threshold voltage herein refers to a voltage value which was measured when the value of the electric current reached 10 mA under the condition that a forward voltage was applied to the light-emitting devices.

The metal layer 34 may be formed by a 75 nm thick Pt layer. The pad electrodes 110 may have a multilayer structure that is constituted of a 40 nm thick Ti layer, a 80 nm thick Pt layer, and a 160 nm thick Au layer. The thickness of the m-plane GaN-based substrate 10 may be 150 μm. The mounting base 260 may be formed by a ceramic base. The bumps 102 may be made of Au.

FIG. 32 also shows the standard deviation of the threshold voltage of a comparative light-emitting device example wherein a multilayer structure of Pd/Pt layers, which is usually employed in a light-emitting device formed on a +c-plane GaN layer, is applied to a light-emitting device formed on an m-plane GaN layer. In this comparative example, a 40 nm thick Pd layer is used in place of the Mg layer 32.

As seen from FIG. 32, in the structure which includes the Mg layer, the variation in the threshold voltage is smaller than in the comparative example. It is also seen that the variation in the threshold voltage decreases as the thickness of the Mg layer 32 increases. Especially when the thickness of the Mg layer 32 is about 15 nm or greater, the variation in the threshold voltage is sufficiently small. The variation in the threshold voltage is attributed to, for example, a defect which would be formed in the light-emitting device due to a mechanical stress caused in the mounting process. It is inferred from the above that the mechanical stress caused in the mounting process could be greatly decreased by forming the Mg layer 32 so as to have a thickness of 15 nm or greater.

Figure 33:
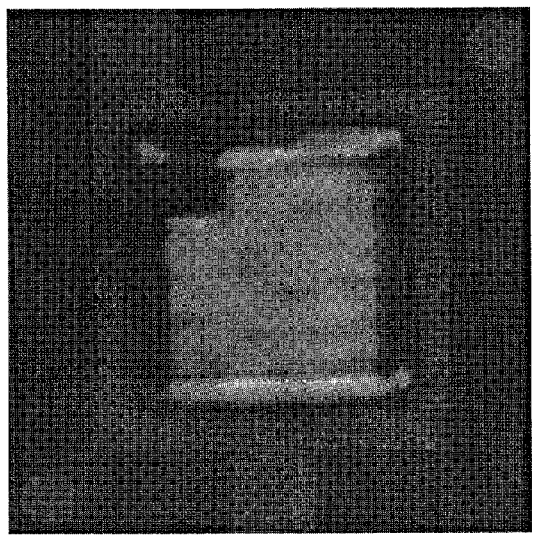
FIG. 33 is an optical microscopic image of emission of light from the surface of the light-emitting device of this embodiment.

FIG. 33 is an optical microscopic image of the surface of the light-emitting device of the present embodiment, which was obtained during emission of light from the light-emitting device. No crack was formed in the m-plane GaN-based substrate. The current value measured during emission of light was 20 mA. No particular emission unevenness was observed, and uniform emission was provided.

Embodiment 3 of Light-Emitting Apparatus

Figure 34:
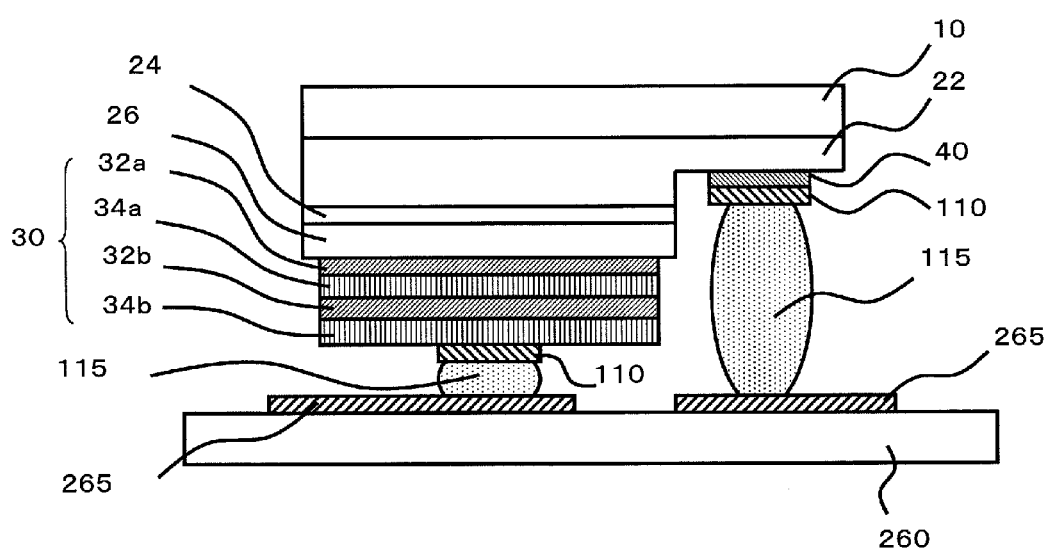
FIG. 34 is a cross-sectional view of another embodiment of the light-emitting apparatus of the present invention.

Still another embodiment of the light-emitting apparatus of the present invention is described with reference to FIG. 34.

Figure 30:
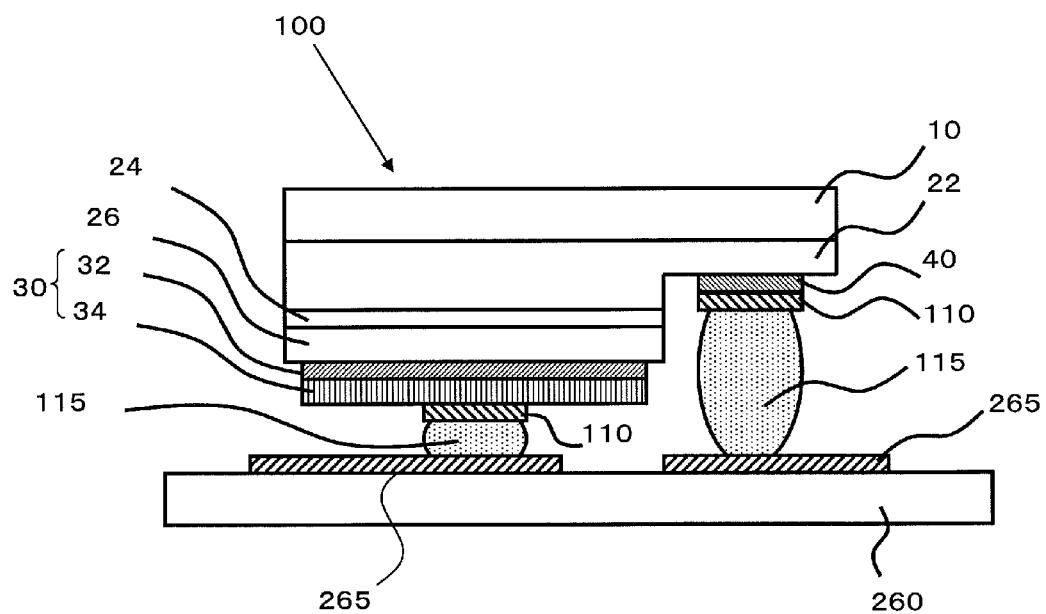
FIG. 30 is a diagram showing an embodiment of a light-emitting apparatus of the present invention.

The light-emitting apparatus of the present embodiment is different from the light-emitting apparatus shown in FIG. 30 only in the structure of the p-electrode 30. The descriptions of the other features than this difference are not repeated herein. Hereinafter, the structure of the p-electrode 30 is described.

The p-electrode 30 of the present embodiment has a multilayer structure in which a first Mg layer 32a, a first metal layer 34a, a second Mg layer 32b, and a second metal layer 34b are stacked in this order on the p-type nitride semiconductor layer 26. The first Mg layer 32a of the present embodiment serves to reduce the specific contact resistance. The second Mg layer 32b serves to reduce the mounting stress caused in the flip-chip mounting process.

As previously described, the specific contact resistance exhibits the smallest value when the thickness of the Mg layer 32 is 2 nm. The specific contact resistance increases as the thickness of the Mg layer 32 increases (FIG. 5(a)). When the thickness of the Mg layer 32 is greater than nm, the contact resistance of the Mg/Pt electrode is approximately equal to the contact resistance of the Pd/Pt electrode against the m-plane GaN layer (FIG. 5(b)). When the thickness of the Mg layer 32 is 45 nm or smaller, the specific contact resistance decreases as the thickness of the layer decreases.

In terms of reduction of the specific contact resistance, the thickness of the Mg layer 32 in the light-emitting device which is in the final form obtained after it undergoes the entire manufacturing process, including a heat treatment, is preferably 45 nm or smaller. More preferably, it is in the range of 2 nm to 15 nm. However, when the Mg layer has a small thickness (e.g., when the thickness of the Mg layer in the final form is smaller than 2 nm), the mounting stress caused during the flip-chip mounting process is not reduced as compared with a case where the Mg layer has a large thickness (e.g., when the thickness of the Mg layer in the final form is 15 nm). In the present embodiment, the thickness of the first Mg layer 32a that is in contact with the p-type nitride semiconductor layer is in the range of 2 nm to 15 nm for the purpose of reducing the specific contact resistance. Further, to sufficiently reduce the mounting stress caused in the flip-chip mounting process, the thickness of the second Mg layer 32b is in the range of 15 nm to 45 nm.

The second metal layer 34b is preferably made of a metal that is less likely to be alloyed with Mg than Au, as is the first metal layer 34a. For example, the second metal layer 34b contains at least one metal selected from the group consisting of Pt, Mo, Pd, and Ag. The second metal layer 34b is preferably made of an alloy of Mg and at least one metal selected from the group consisting of Pt, Mo, Pd, and Ag. Although Pt, Mo, Pd, and Ag are metals that are less likely to be alloyed with Mg than Au, the metals can react with part of Mg through a heat treatment so that a thin alloy layer can be formed in the vicinity of the interface between the second Mg layer 32b and the second metal layer 34b. Formation of the thin alloy layer leads to improvement in adhesion between the second Mg layer 32b and the second metal layer 34b.

According to the present embodiment, the mounting stress caused in the flip-chip mounting process can be sufficiently reduced while the specific contact resistance is sufficiently reduced. Note that the number of Mg layers included in the p-electrode 30 is not limited to two. The first metal layer 34a and the second metal layer 34b may be made of different materials.

Comparative Example

We prepared, as a comparative example, a light-emitting device formed on an m-plane GaN substrate with the use of a multilayer structure of Pd/Pt layers which is usually employed in a light-emitting device formed on a +c-plane GaN layer. The thickness of the Pd layer was 40 nm. The thickness of the Pt layer was 75 nm. The heat treatment conditions were 500° C. and 10 minutes.

Figure 35:
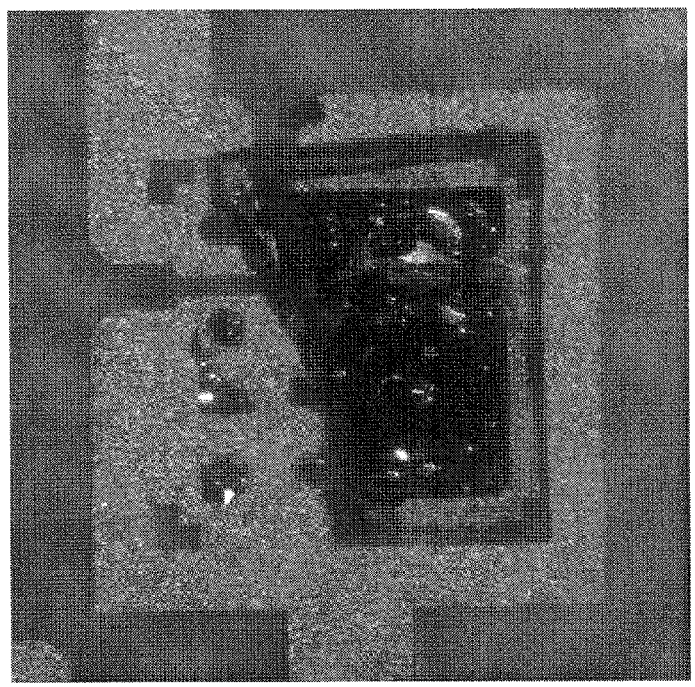
FIG. 35 is an optical microscopic image of a light-emitting device in which the p-type electrode has a Pd/Pt structure (comparative example), which shows the surface after the flip-chip mounting process.

FIG. 35 is an optical microscopic image of this comparative light-emitting device example, which was obtained during emission of light after the flip-chip mounting process. In many samples of the light-emitting device, cracks were formed in part of the device as seen from FIG. 35. The cause of formation of the cracks in the substrate is attributed to a load which was exerted on the m-plane nitride-based semiconductor in the flip-chip mounting process.

Figure 36:
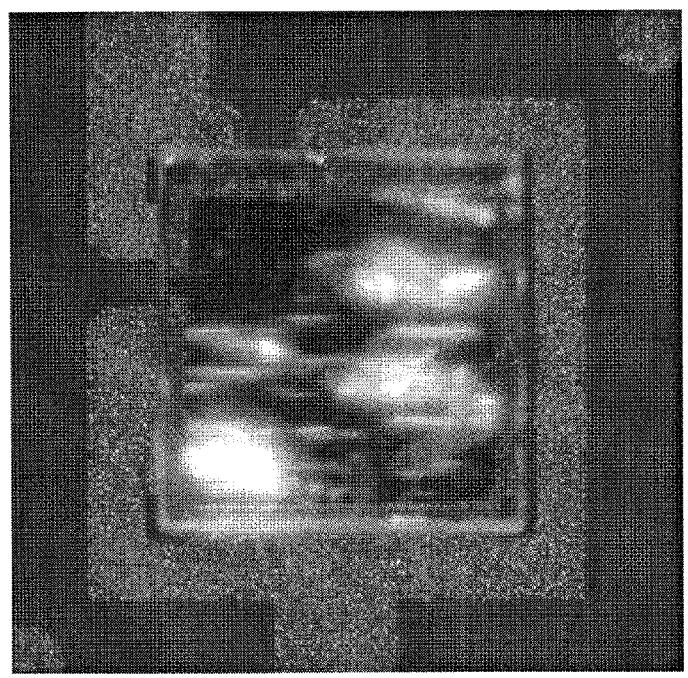
FIG. 36 is an optical microscopic image of another light-emitting device in which the p-type electrode has a Pd/Pt structure (comparative example), which shows emission of light after the flip-chip mounting process.

FIG. 36 is an optical microscopic image of one of the samples of the above comparative example which was not damaged in the flip-chip mounting process, the image being obtained during emission of light resulting from a current flow of 10 mA. Many of the samples that have no crack formed during the mounting process resulted in uneven emission of light.

Note that the contact structure of the present invention achieves the above-described advantageous effects when the p-type semiconductor region that is in contact with the Mg layer is made of a GaN-based semiconductor, specifically an $Al_xIn_yGa_zN$ semiconductor (x+y+z=1, x≧0, y≧0, z≧0). Such a contact resistance reducing effect can also be, as a matter of course, achieved in light-emitting devices other than LED (e.g., semiconductor lasers) and devices other than the light-emitting devices (e.g., transistors and photodetectors).

INDUSTRIAL APPLICABILITY

According to the present invention, in a nitride-based semiconductor light-emitting device formed by means of crystal growth on an m-plane substrate or in a nitride-based semiconductor multilayer structure which has an m-plane surface, the contact resistance can be reduced. Therefore, a nitride-based semiconductor light-emitting device that is formed by means of crystal growth on an m-plane substrate (or a GaN-based semiconductor multilayer structure which has an m-plane surface), which has traditionally been difficult to positively use because of its poor contact resistance characteristic, can be realized.

Further, according to the present invention, a mounting stress problem which would occur when the above-described nitride-based semiconductor light-emitting device is flip-chip mounted can be solved. Therefore, a light-emitting device formed on an m-plane GaN substrate with reduced uneven emission of light and reduced variations can be realized.

REFERENCE SIGNS LIST

| | |
|---|---|
| 10, 10a | substrate (GaN-based substrate) |
| 12, 12a | surface of substrate (m-plane) |
| 20, 20a | semiconductor multilayer structure |
| 22, 22a | $Al_uGa_vIn_wN$ layer |
| 24, 24a | active layer |
| 26, 26a | $Al_dGa_eN$ layer |
| 30, 30A, 30B, 30C, 30a, 30b | p-electrode |
| 32 | Mg layer |
| 32a | first Mg layer |
| 32b | second Mg layer |
| 34 | metal layer (Pt layer) |
| 34a | first metal layer |
| 34b | second metal layer |
| 40, 40a | n-electrode |
| 42, 42a | recess |
| 61A, 61B, 61C, 61b | Mg alloy layer |
| 100, 100a, 100b | nitride-based semiconductor light-emitting device |
| 110 | pad electrode |
| 115 | bump |
| 200 | resin layer |
| 220 | supporting member |
| 240 | reflective member |
| 260 | mounting base |
| 265 | metal wire |

The invention claimed is:

1. A light-emitting apparatus, comprising:
   a mounting base which has a wire; and
   a nitride-based semiconductor light-emitting device flip-chip mounted on the mounting base,
   wherein the nitride-based semiconductor light-emitting device includes
      a nitride-based semiconductor multilayer structure which has a p-type semiconductor region having an m-plane surface, and
      an electrode provided on the p-type semiconductor region,
   the p-type semiconductor region is made of an $Al_xIn_yGa_zN$ semiconductor (x+y+z=1, x≧0, y≧0, z≧0),
   the electrode includes an Mg layer which is in contact with the surface of the p-type semiconductor region, and
   the electrode is coupled to the wire.

2. The light-emitting apparatus of claim 1, wherein the electrode includes a metal layer provided on the Mg layer.

3. The light-emitting apparatus of claim 2, wherein the metal layer is made of at least one metal selected from the group consisting of Pt, Mo, Pd, and Ag.

4. The light-emitting apparatus of claim 3, wherein an Mg alloy layer is provided between the Mg layer and the metal layer.

5. The light-emitting apparatus of claim 1, wherein the Mg layer has a thickness of 15 nm to 45 nm.

6. The light-emitting apparatus of claim 1, wherein the electrode includes
   a first metal layer provided on the Mg layer,
   a second Mg layer provided on the first metal layer, and
   a second metal layer provided on the second Mg layer.

7. The light-emitting apparatus of claim 6, wherein
   the first metal layer is made of at least one metal selected from the group consisting of Pt, Mo, Pd, and Ag, and
   the second metal layer is made of at least one metal selected from the group consisting of Pt, Mo, Pd, and Ag.

8. The light-emitting apparatus of claim 6, wherein the second Mg layer has a thickness of 15 nm or greater.

9. The light-emitting apparatus of claim 8, wherein the Mg layer has a thickness of 2 nm to 15 nm.

10. A nitride-based semiconductor light-emitting device for use in the light-emitting apparatus as set forth in claim 1, comprising:

a nitride-based semiconductor multilayer structure which has a p-type semiconductor region having an m-plane surface, and an electrode provided on the p-type semiconductor region, wherein the p-type semiconductor region is made of an $Al_xIn_yGa_zN$ semiconductor (x+y+z=1, x≧0, y≧0, z≧0), and the electrode includes an Mg layer which is in contact with the surface of the p-type semiconductor region, the Mg layer having a thickness of 15 nm or greater.

11. The nitride-based semiconductor light-emitting device of claim 10, wherein the electrode includes a metal layer provided on the Mg layer.

12. The nitride-based semiconductor light-emitting device of claim 11, wherein the electrode includes
a first metal layer provided on the Mg layer,
a second Mg layer provided on the first metal layer, and
a second metal layer provided on the second Mg layer.

13. A method of fabricating a light-emitting apparatus, comprising the steps of:
(A) preparing a mounting base which has a wire; and
(B) mounting a nitride-based semiconductor light-emitting device on the mounting base,
wherein the nitride-based semiconductor light-emitting device includes
a nitride-based semiconductor multilayer structure which has a p-type semiconductor region having an m-plane surface, and
an electrode provided on the p-type semiconductor region,
the p-type semiconductor region is made of an $Al_xIn_yGa_zN$ semiconductor (x+y+z=1, x≧0, y≧0, z≧0),
the electrode includes an Mg layer which is in contact with the surface of the p-type semiconductor region, and
step (B) includes pressing the electrode of the nitride-based semiconductor light-emitting device against the wire of the mounting base while applying an ultrasonic wave to the nitride-based semiconductor light-emitting device such that the nitride-based semiconductor light-emitting device is secured onto the mounting base.

14. A light-emitting apparatus, comprising:
a mounting base which has a wire; and
a nitride-based semiconductor light-emitting device flip-chip mounted on the mounting base,
wherein the nitride-based semiconductor light-emitting device includes
a nitride-based semiconductor multilayer structure which has a p-type semiconductor region having an m-plane surface, and
an electrode provided on the p-type semiconductor region,
the p-type semiconductor region is made of an $Al_xIn_yGa_zN$ semiconductor (x+y+z=1, x≧0, y≧0, z≧0),
the electrode includes an Mg alloy layer which is in contact with the surface of the p-type semiconductor region, and
the electrode is coupled to the wire.

15. The light-emitting apparatus of claim 14, wherein the electrode includes a metal layer provided on the Mg alloy layer.

16. The light-emitting apparatus of claim 15, wherein the metal layer is made of at least one metal selected from the group consisting of Pt, Mo, Pd, and Ag.

17. The light-emitting apparatus of claim 14, wherein the electrode is formed only by an Mg alloy layer.

18. The light-emitting apparatus of claim 17, wherein the Mg alloy layer is made of an alloy of Mg and at least one metal selected from the group consisting of Pt, Mo, Pd, and Ag.

19. A light-emitting apparatus, comprising:
a mounting base which has a wire; and
a nitride-based semiconductor light-emitting device flip-chip mounted on the mounting base,
wherein the nitride-based semiconductor light-emitting device includes
a nitride-based semiconductor multilayer structure which has a p-type semiconductor region, and
an electrode provided on the p-type semiconductor region,
the p-type semiconductor region is made of an $Al_xIn_yGa_zN$ semiconductor (x+y+z=1, x≧0, y≧0, z≧0),
an angle between a normal to a principal surface of the p-type semiconductor region and a normal to an m-plane is from 1° to 5°,
the electrode includes an Mg layer which is in contact with the surface of the p-type semiconductor region, and
the electrode is coupled to the wire.

20. The light-emitting apparatus of claim 19, wherein the electrode includes a metal layer provided on the Mg layer.

21. The light-emitting apparatus of claim 20, wherein the metal layer is made of at least one metal selected from the group consisting of Pt, Mo, Pd, and Ag.

22. A light-emitting apparatus, comprising:
a mounting base which has a wire; and
a nitride-based semiconductor light-emitting device flip-chip mounted on the mounting base,
wherein the nitride-based semiconductor light-emitting device includes
a nitride-based semiconductor multilayer structure which has a p-type semiconductor region, and
an electrode provided on the p-type semiconductor region,
the p-type semiconductor region is made of an $Al_xIn_yGa_zN$ semiconductor (x+y+z=1, x≧0, y≧0, z≧0),
an angle between a normal to a principal surface of the p-type semiconductor region and a normal to an m-plane is from 1° to 5°,
the electrode includes an Mg alloy layer which is in contact with the surface of the p-type semiconductor region, and
the electrode is coupled to the wire.

23. The light-emitting apparatus of claim 22, wherein the electrode includes a metal layer provided on the Mg alloy layer.

24. The light-emitting apparatus of claim 23, wherein the metal layer is made of at least one metal selected from the group consisting of Pt, Mo, Pd, and Ag.

25. The light-emitting apparatus of claim 22, wherein the electrode is formed only by an Mg alloy layer.

26. The light-emitting apparatus of claim 25, wherein the Mg alloy layer is made of an alloy of Mg and at least one metal selected from the group consisting of Pt, Mo, Pd, and Ag.

* * * * *